US012389743B2

(12) United States Patent
Ko et al.

(10) Patent No.: US 12,389,743 B2
(45) Date of Patent: Aug. 12, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Hyomin Ko, Yongin-si (KR); Bora Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 452 days.

(21) Appl. No.: 17/992,063

(22) Filed: Nov. 22, 2022

(65) Prior Publication Data

US 2023/0165031 A1 May 25, 2023

(30) Foreign Application Priority Data

Nov. 23, 2021 (KR) ........................ 10-2021-0162593
Nov. 10, 2022 (KR) ........................ 10-2022-0149642

(51) Int. Cl.

*H10K 50/16* (2023.01)
*H10K 50/125* (2023.01)
*H10K 50/858* (2023.01)
*H10K 85/40* (2023.01)

(52) U.S. Cl.

CPC ........... *H10K 50/16* (2023.02); *H10K 50/125* (2023.02); *H10K 50/858* (2023.02); *H10K 85/40* (2023.02)

(58) Field of Classification Search

None
See application file for complete search history.

(56) References Cited

U.S. PATENT DOCUMENTS

| | | | |
|---|---|---|---|
| 8,963,143 | B2 | 2/2015 | Loebl et al. |
| 11,183,649 | B2 | 11/2021 | Furno et al. |
| 11,283,036 | B2 | 3/2022 | Tanaka et al. |
| 2012/0299035 | A1 | 11/2012 | Ikeda et al. |
| 2021/0183958 | A1 | 6/2021 | Ko et al. |

FOREIGN PATENT DOCUMENTS

| | | |
|---|---|---|
| JP | 2018-107031 | 7/2018 |
| KR | 10-2013-0132843 | 12/2013 |
| KR | 10-2018-0127936 | 11/2018 |
| KR | 10-2021-0074448 | 6/2021 |

*Primary Examiner* — Anthony Ho
(74) *Attorney, Agent, or Firm* — KILE PARK REED & HOUTTEMAN PLLC

(57) ABSTRACT

A light-emitting device includes an electron transport layer, and the electron transport layer include a mixture of a first material, a second material, and a third material, wherein the first material includes an electron transport compound, the second material includes a metal-containing material, and the third material includes a low-refractive-index compound. An electronic apparatus including the light-emitting device is also provided.

20 Claims, 4 Drawing Sheets

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application Nos. 10-2021-0162593 and 10-2022-0149642, under 35 U.S.C. § 119, filed on Nov. 23, 2021 and Nov. 10, 2022, respectively, in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Light-emitting devices are self-emissive devices that have wide viewing angles, high contrast ratios, short response times, and excellent characteristics in terms of luminance, driving voltage, and response speed.

In a light-emitting device, a first electrode is located on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments relate to a light-emitting device with low driving voltage, high efficiency, and a long lifespan.

Additional aspects will be set forth in part in the description which follows and, in part, will be apparent from the description, or may be learned by practice of the embodiments of the disclosure.

According to embodiments, a light-emitting device may include a first pixel electrode in a first emission area, a second pixel electrode in a second emission area, a third pixel electrode in a third emission area, a counter electrode facing the first pixel electrode, the second pixel electrode, and the third pixel electrode, and an interlayer between the first to third pixel electrodes and the counter electrode, wherein the interlayer may include an emission layer, and an electron transport region between the emission layer and the counter electrode, the emission layer may include a first emission layer corresponding to the first emission area and emitting first-color light; a second emission layer corresponding to the second emission area and emitting second-color light; and a third emission layer corresponding to the third emission area and emitting third-color light, the electron transport region may include an electron transport layer, the electron transport layer may include a mixture of a first material, a second material, and a third material, the first material may include an electron transport compound, the second material may include a metal-containing material, the third material may include a low-refractive-index compound, and the first material, the second material, and the third material may be different from each other.

In an embodiment, the first-color light, the second-color light, and the third-color light may each be emitted by secondary resonance.

In an embodiment, the first pixel electrode, the second pixel electrode, and the third pixel electrode may each be an anode, the counter electrode may be a cathode, the first pixel electrode, the second pixel electrode, and the third pixel electrode may each be a reflective electrode, and the cathode is a transmissive electrode or a semi-transmissive electrode.

In an embodiment, the first pixel electrode, the second pixel electrode, and the third pixel electrode may each be an anode, the counter electrode may be a cathode, the interlayer may further include a hole transport region between the emission layer and the first to third pixel electrodes, and the hole transport region may include a hole injection layer, a hole transport layer, an emission auxiliary layer, an electron blocking layer, or any combination thereof.

In an embodiment, the electron transport layer may have a single-layered structure consisting of a mixture of the first material, the second material, and the third material.

In an embodiment, the electron transport layer may directly contact the emission layer.

In an embodiment, the electron transport layer may directly contact the counter electrode.

In an embodiment, a refractive index of the electron transport layer may be equal to or less than about 1.65.

In an embodiment, the electron transport compound may include at least one π electron-deficient nitrogen-containing $C_1$-$C_{60}$ cyclic group.

In an embodiment, the electron transport compound may be a fluoro-free compound.

In an embodiment, the metal-containing material may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

In an embodiment, a refractive index of the low-refractive-index compound may be equal to or less than about 1.45.

In an embodiment, the low-refractive-index compound may include at least one fluoro group (—F).

In an embodiment, the low-refractive-index compound may be a polymer compound.

In an embodiment, the polymer compound may be an oligomer-polymer having a molecular weight equal to or less than about 5,000.

In an embodiment, the low-refractive-index compound may be a compound represented by Formula 1, which is explained below.

In an embodiment, a mixture of the first material, the second material, and the third material may be evenly dispersed in the electron transport layer.

In an embodiment, a weight of the third material may be in a range of about 30 parts by weight to about 50 parts by weight, based on 100 parts by weight of the mixture of the first material, the second material, and the third material.

In an embodiment, a weight of the second material may be in a range of about 40 parts by weight to about 60 parts by weight, based on 100 parts by weight of the first material and the second material.

According to embodiments, an electronic apparatus may include the light-emitting device.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
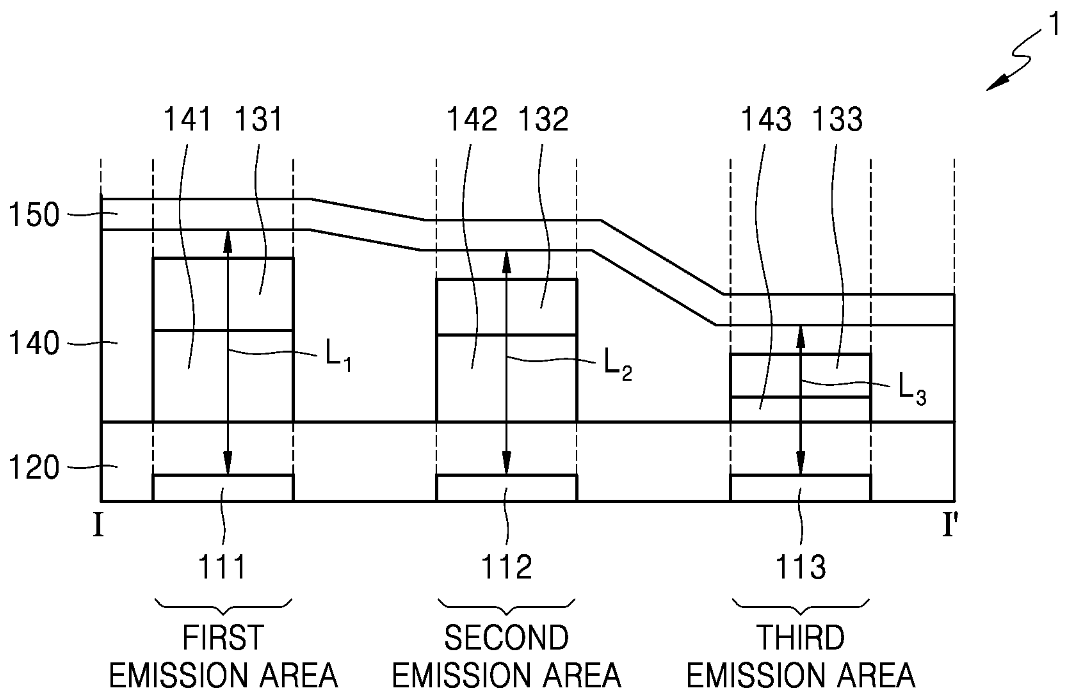
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The refractive indices of a material and a layer are the same as described here below, but embodiments are not limited thereto.

A refractive index of a material is measured at a temperature of 25° C. by using an ellipsometry device. After light from a light source passes through a polarizer and hits a sample, reflected light is detected to measure the phase, polarization direction, and intensity of light. Accordingly, birefringence of the material may be extracted. The refractive index of a mixed film is measured in a same manner as above after actually depositing the mixed film.

In an embodiment, a light-emitting device may include a first pixel electrode in a first emission area, a second pixel electrode in a second emission area, a third pixel electrode in a third emission area, a counter electrode facing the first pixel electrode, the second pixel electrode, and the third pixel electrode, and an interlayer between the first to third pixel electrodes and the counter electrode.

[Description of FIG. 1]

FIG. 1 is a schematic cross-sectional view of a light-emitting device 1 according to an embodiment.

Referring to FIG. 1, a structure of the light-emitting device 1 according to an embodiment will be described in detail.

[Pixel Electrodes 111, 112, and 113]

The light-emitting device 1 includes a first pixel electrode 111, a second pixel electrode 112, and a third pixel electrode 113, each respectively located in the first emission area, the second emission area, and the third emission area. For example, the first pixel electrode 111 may be in a first emission area, the second pixel electrode 112 may be in a second emission area, and the third pixel electrode 113 may be in a third emission area.

The first pixel electrode 111, the second pixel electrode 112, and the third pixel electrode 113 may each be formed as a transmissive electrode, a semi-transmissive electrode, or a reflective electrode.

In an embodiment, the first pixel electrode 111, the second pixel electrode 112, and the third pixel electrode 113 may each be formed as a reflective electrode.

When the first pixel electrode 111, the second pixel electrode 112, and the third pixel electrode 113 are each a transmissive electrode, indium tin oxide (ITO), tin oxide ($SnO_2$), zinc oxide (ZnO), or any combination thereof may be used as materials for the first to third pixel electrodes 111, 112, and 113.

When the first pixel electrode 111, the second pixel electrode 112, and the third pixel electrode 113 are each a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as materials for the first to third pixel electrodes 111, 112, and 113.

The first pixel electrode 111, the second pixel electrode 112, and the third pixel electrode 113 may be formed of various materials other than the above materials, and may have a structure consisting of a single layer or a structure consisting of multiple layers.

The first pixel electrode 111, the second pixel electrode 112, and the third pixel electrode 113 may each be located on a substrate (not shown).

The substrate (not shown) may be a glass substrate or a plastic substrate, each having excellent mechanical strength, thermal stability, transparency, surface smoothness, ease of handling, and water resistance. In an embodiment, the substrate (not shown) may be a glass substrate or a plastic substrate. In other embodiments, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

For example, when the light-emitting device 1 is a bottom emission type in which light of the emission layers 131, 132, and 133 emit in a substrate direction, the substrate may be transparent.

As another example, when the light-emitting device 1 is a top emission type in which light of the emission layers 131, 132, and 133 emit in a direction opposite to the substrate, the substrate may not necessarily be transparent, and may be opaque or translucent.

In an embodiment, the light-emitting device 1 may be a top emission type in which light of the emission layers 131, 132, and 133 emit in a direction opposite to the substrate.

Although not shown in FIG. 1, a buffer layer, a thin-film transistor, an organic insulating layer, etc. may be further included between the substrate and the first to third pixel electrodes 111, 112, and 113.

[Counter Electrode 150]

The light-emitting device 1 may include a counter electrode 150 facing the first pixel electrode 111, the second pixel electrode 112, and the third pixel electrode 113.

The counter electrode 150 may include a first counter electrode area corresponding to the first emission area, a second counter electrode area corresponding to the second emission area, and a third counter electrode area corresponding to the third emission area.

The counter electrode 150 may be a cathode, which is an electron injection electrode, and a material for forming the counter electrode 150 may include a metal, an alloy, an electrically conductive compound, or any combination thereof, each having a low-work function.

The counter electrode 150 may be formed as a transmissive electrode, a semi-transmissive electrode, or a reflective electrode.

A material for forming the counter electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof, but embodiments are not limited thereto.

The counter electrode 150 may be formed of various materials other than the above materials, and may have a structure consisting of a single layer or a structure consisting of multiple layers.

In an embodiment, the first pixel electrode 111, the second pixel electrode 112, and the third pixel electrode 113 may each be an anode, the counter electrode 150 may be a cathode, the first pixel electrode, the second pixel electrode, and the third pixel electrode may each be a reflective electrode, and the cathode may be a transmissive electrode or a semi-transmissive electrode.

[Interlayer]

The light-emitting device 1 may include an interlayer located between the first to third pixel electrodes 111, 112, and 113 and the counter electrode 150.

The interlayer may include the emission layers 131, 132, and 133, and an electron transport region 140 located between the emission layers 131, 132, and 133 and the counter electrode 150.

The interlayer may include emission layers 131, 132, and 133, and a hole transport region 120 located between the first to third pixel electrodes 111, 112, and 113 and the emission layers 131, 132, and 133.

[Emission Layers 131, 132, and 133 in Interlayer]

The emission layers 131, 132, and 133 may include a first emission layer 131 corresponding to the first emission area and emitting first-color light; a second emission layer 132 corresponding to the second emission area and emitting second-color light; and a third emission layer 133 corresponding to the third emission area and emitting third-color light.

A maximum emission wavelength of the first-color light, a maximum emission wavelength of the second-color light, and a maximum emission wavelength of the third-color light may be different from each other.

The maximum emission wavelength of the first-color light and the maximum emission wavelength of the second-color light may each be longer than the maximum emission wavelength of the third-color light.

In an embodiment, the first-color light may be red light, the second-color light may be green light, and the third-color light may be blue light, but embodiments are not limited thereto.

For example, a maximum emission wavelength of the first-color light may be in a range of about 620 nm to about 750 nm, a maximum emission wavelength of the second-color light may be in a range of about 495 nm to about 570 nm, and a maximum emission wavelength of the third-color light may be in a range of about 450 nm to about 495 nm, but embodiments are not limited thereto.

In an embodiment, the first-color light, the second-color light, and the third-color light may each be emitted by secondary resonance.

For light generated from the emission layers 131, 132, and 133 to be efficiently emitted to the outside, a micro resonance structure may be included in the light-emitting device 1. For example, when light is repeatedly reflected between the counter electrode 150, which is a semi-transmissive layer, and the pixel electrodes 111, 112, and 113, which are reflective layers, apart from each other by an optical length, light of a certain wavelength may be amplified by constructive interference, and light of other wavelengths may be offset, and amplified light may pass through the counter electrode 150, which is a semi-transmissive layer, to the outside.

The first emission area, the second emission area, and the third emission area may each include the pixel electrodes 111, 112, and 113, the hole transport region 120, the emission layers 131, 132, and 133, the electron transport region 140, and the counter electrode 150. For example, the first emission area may include the first pixel electrode 111, the hole transport region 120, the first emission layer 131, the electron transport region 140, and the counter electrode 150; the second emission area may include the second pixel electrode 112, the hole transport region 120, the second emission layer 132, the electron transport region 140, and the counter electrode 150; and the third emission area may include the third pixel electrode 113, the hole transport region 120, the third emission layer 133, the electron transport region 140, and the counter electrode 150. A distance between the top (upper surface in a direction facing the counter electrode) of the pixel electrodes 111, 112, and 113 and the bottom (lower surface in a direction facing the pixel electrodes) of the counter electrode 150 in each of the first emission area, the second emission area, and the third emission area may be defined as a resonance distance Lc, and the resonance distance Lc may satisfy Equation 1.

$$Lc = \frac{\lambda}{Nc} \times k \qquad \text{[Equation 1]}$$

In Equation 1, Nc indicates an effective refractive index of a resonance structure, $\lambda$ indicates a wavelength of light to be resonated, and k indicates a resonance degree. The resonance structure includes all interlayers between the pixel electrodes 111, 112, and 113 and the counter electrode 150.

The second resonance structure, which is a structure in which the resonance distance corresponds to the second resonance distance of the wavelength of light being emitted, is a case in which k is 2 in Equation 1.

A first distance $L_1$ between the surface of the first counter electrode area in the direction toward the first pixel electrode 111 and the surface of the first pixel electrode 111 in the direction toward the first counter electrode area may correspond to the second resonance distance of the first-color light, a second distance $L_2$ between the surface of the second counter electrode area in the direction toward the second pixel electrode 112 and the surface of the second pixel electrode 112 in the direction toward the second counter electrode area may correspond to the second resonance distance of the second-color light, and a third distance $L_3$ between the surface of the third counter electrode area in the direction toward the third pixel electrode and the surface of the third pixel electrode 113 in the direction toward the third counter electrode area may correspond to the second resonance distance of the third-color light.

In embodiments, $L_1$, $L_2$, and $L_3$ may each satisfy Equations 1-1 to 1-3, but embodiments are not limited thereto:

$$L_1=\lambda_1/2N_1\times 2 \qquad \text{[Equation 1-1]}$$

$$L_2=\lambda_2/2N_2\times 2 \qquad \text{[Equation 1-2]}$$

$$L_3=\lambda_3/2N_3\times 2 \qquad \text{[Equation 1-3]}$$

In Equations 1-1 to 1-3, $L_1$ indicates a distance between the first pixel electrode (111) and the counter electrode (150), $L_2$ indicates a distance between the second pixel electrode (112) and the counter electrode (150), $L_3$ indicates a distance between the third pixel electrode (113) and the counter electrode (150), $\lambda_1$ indicates the maximum emission wavelength of the first-color light, $\lambda_2$ indicates the maximum emission wavelength of the second-color light, $\lambda_3$ indicates the maximum emission wavelength of the third-color light, $N_1$ indicates a refractive index of an interlayer between the first pixel electrode (111) and the counter electrode (150), $N_2$ indicates a refractive index of an interlayer between the second pixel electrode (112) and the counter electrode (150), and $N_3$ indicates a refractive index of an interlayer between the third pixel electrode (113) and the counter electrode (150), In an embodiment, $L_1$ may be in a range of about 2,600 Å to about 2,800 Å, $L_2$ may be in a range of about 2,200 Å to about 2,400 Å, and $L_3$ may be in a range of about 1,700 Å to about 1,900 Å.

Each layer included in the interlayer of the light-emitting device 1 will be described in detail below.

[Hole Transport Region 120]

The hole transport region 120 may have a structure consisting of a layer consisting of a single material, a structure consisting of a layer consisting of different materials, or a structure including multiple layers including different materials.

The hole transport region may include a hole injection layer, a hole transport layer, an emission auxiliary layer, an electron blocking layer, or any combination thereof.

For example, the hole transport region may have a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure are stacked from the first pixel electrode 111, the second pixel electrode 112, and the third pixel electrode 113 in its respective stated order, but the structure of the hole transport region 120 is not limited thereto.

The hole transport region may include a compound represented by Formula 201, a compound represented by Formula 202, or any combination thereof:

[Formula 201]

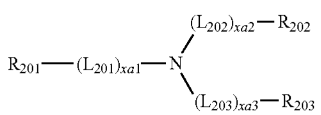

[Formula 202]

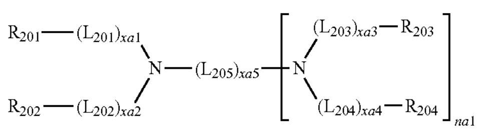

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217.

CY201

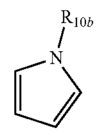

CY202

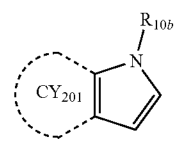

CY203

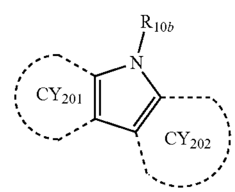

CY204

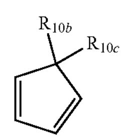

CY205

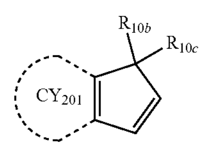

CY206

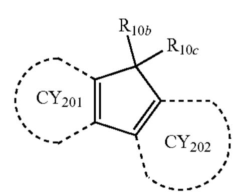

CY207

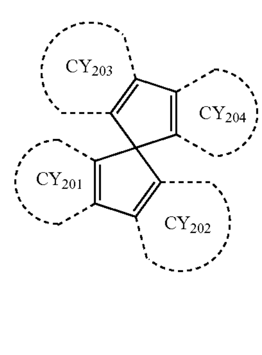

-continued

CY208

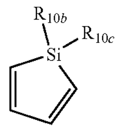

CY209

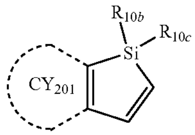

CY210

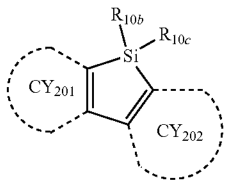

CY211

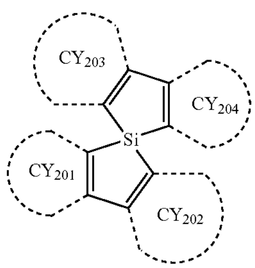

CY212

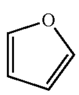

CY213

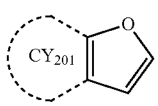

CY214

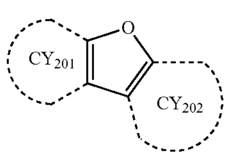

CY215

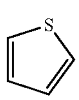

-continued

CY216

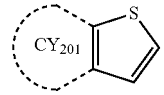

CY217

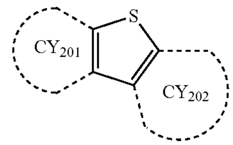

In Formulae CY201 to CY217, $R_{10b}$ and $R_{10c}$ may each independently be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, ring $CY_{201}$ to ring $CY_{204}$ in Formulae CY201 to CY217 may each independently be a benzene group, a naphthalene group, a phenanthrene group, or an anthracene group.

In embodiments, each of Formulae 201 and 202 may include at least one of groups represented by Formulae CY201 to CY203.

In embodiments, Formula 201 may include at least one of the groups represented by Formulae CY201 to CY203 and at least one of the groups represented by Formulae CY204 to CY217.

In embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203, and may include at least one of the groups represented by Formulae CY204 to CY217.

In embodiments, each of Formulae 201 and 202 may not include a group represented by one of Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
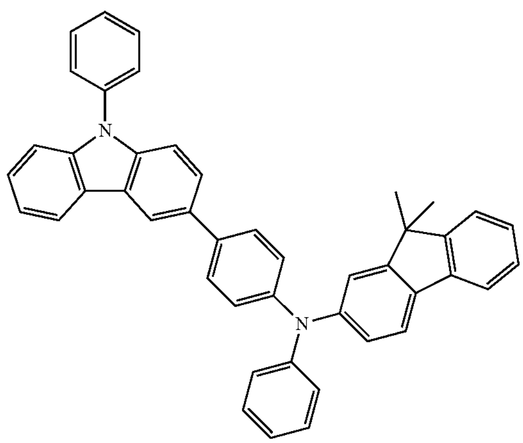
HT2
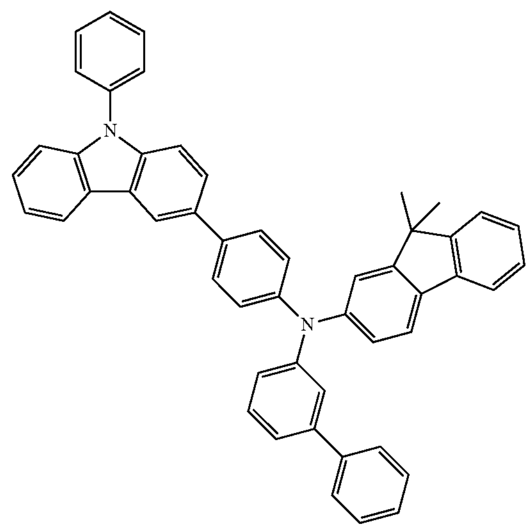
HT3
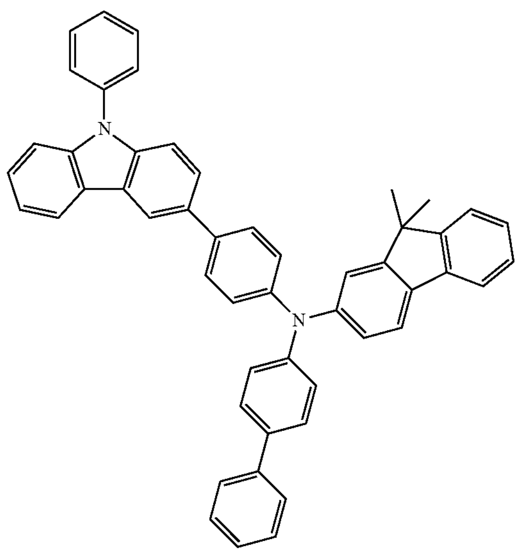
HT4
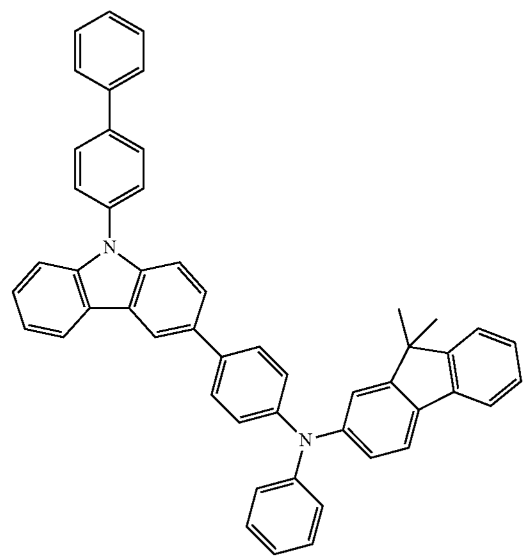
HT5
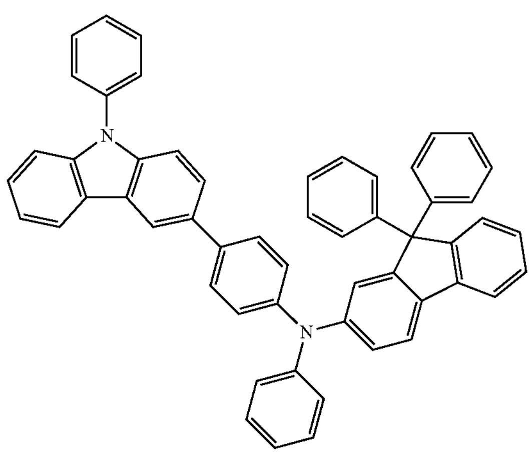
HT6
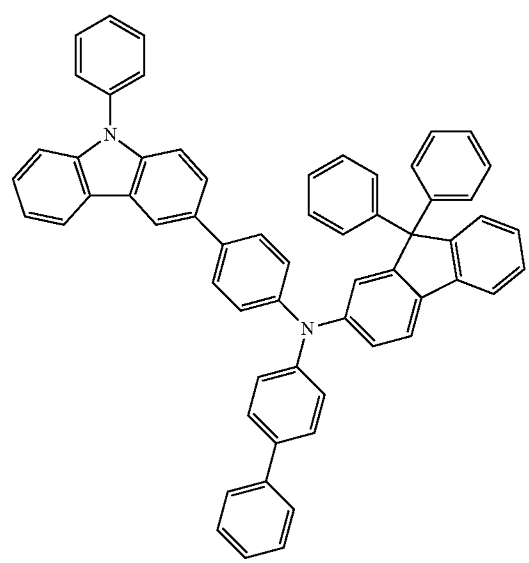

-continued
HT7
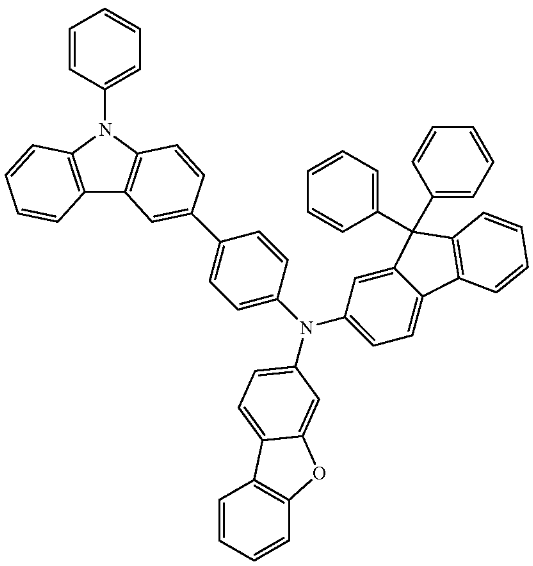
HT8
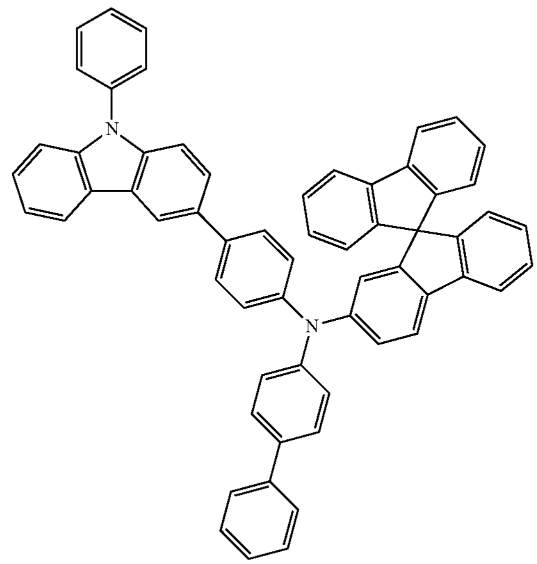
HT9
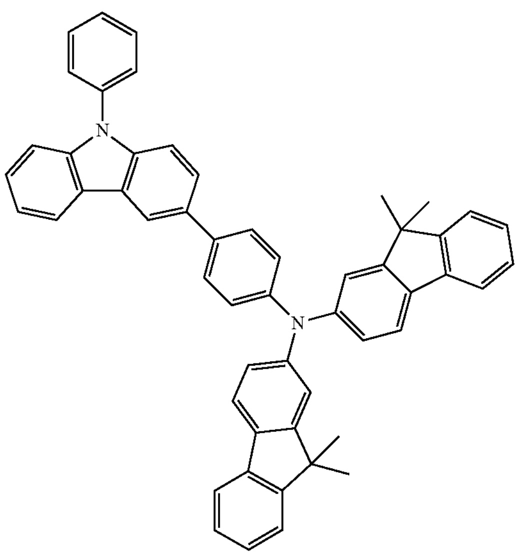
HT10
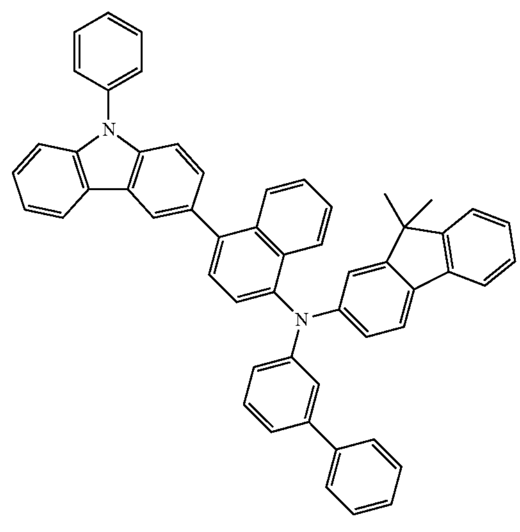
HT11
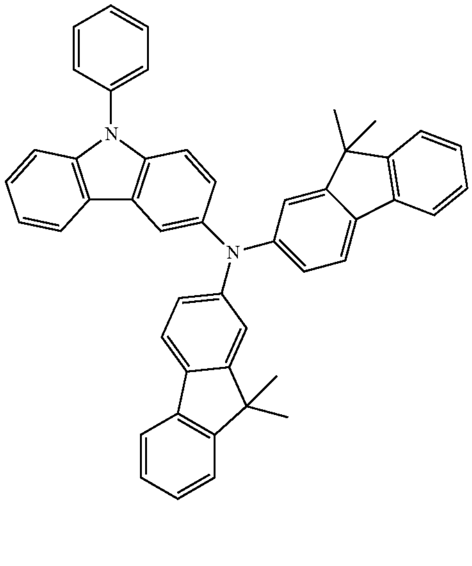
HT12
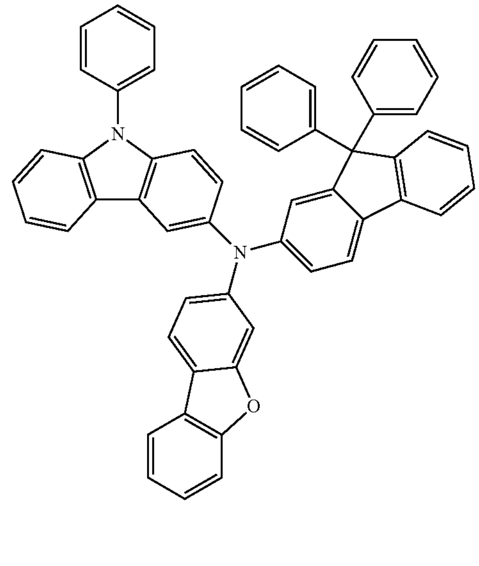

-continued
HT13
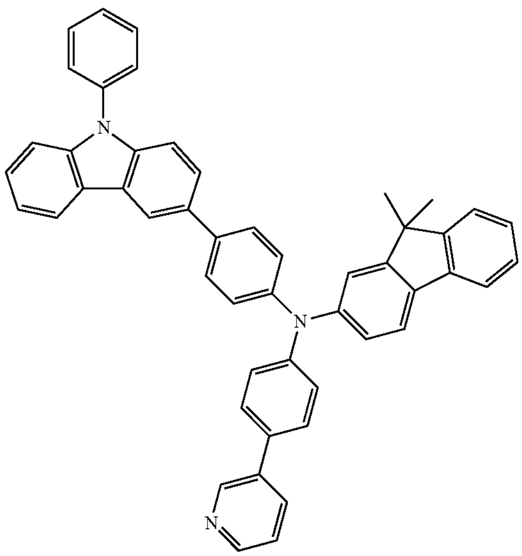
HT14
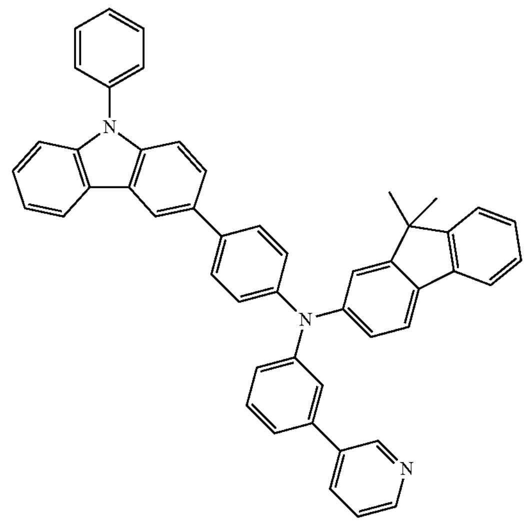
HT15
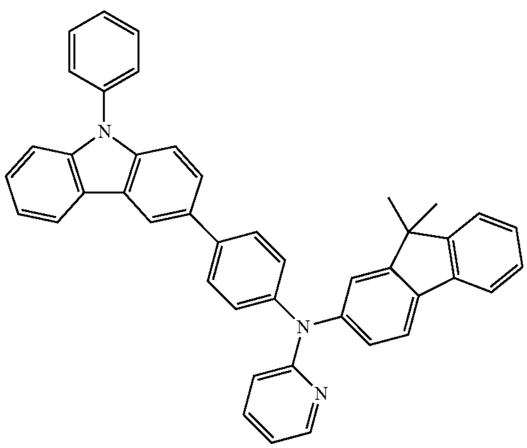
HT16
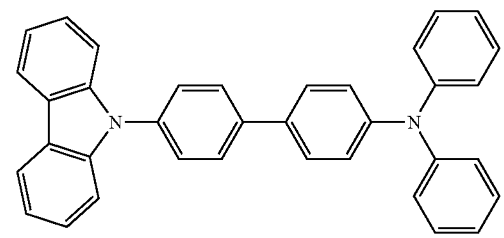
HT17
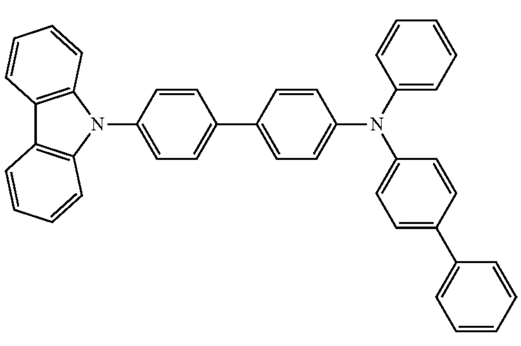
HT18
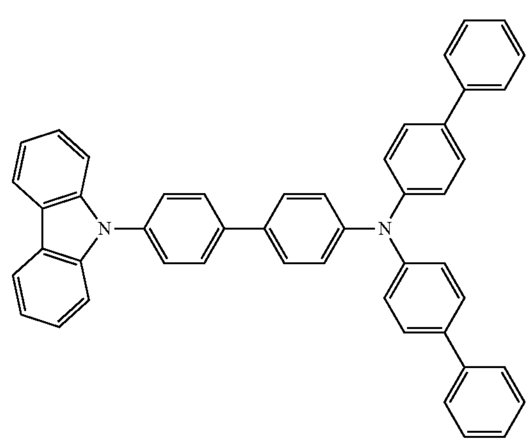

-continued
HT19
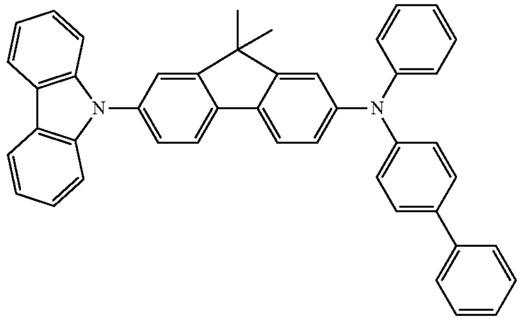
HT20
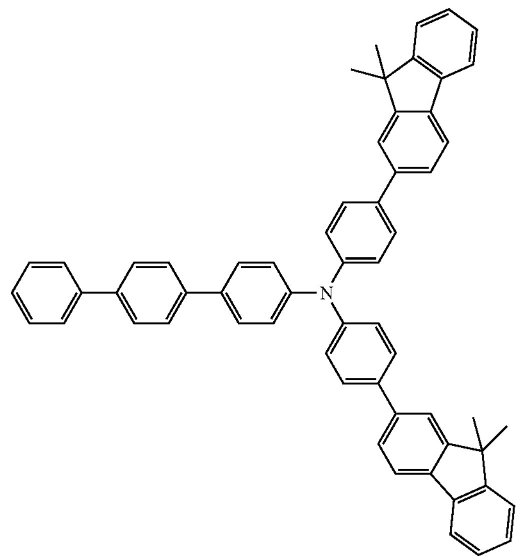
HT21
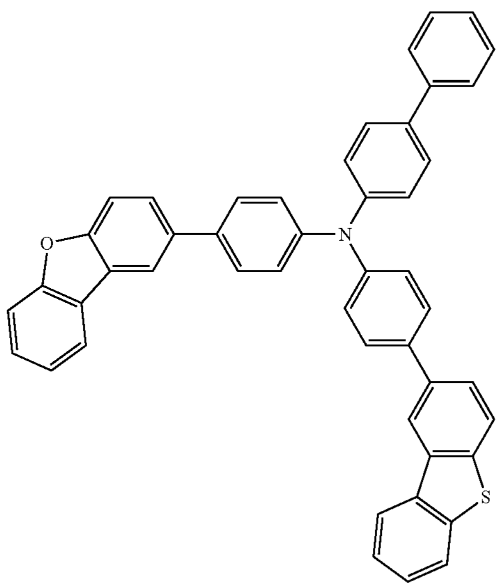
HT22
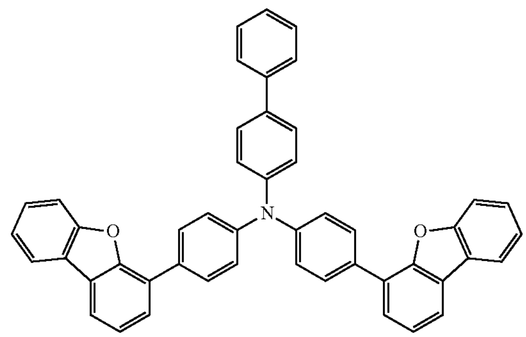
HT23
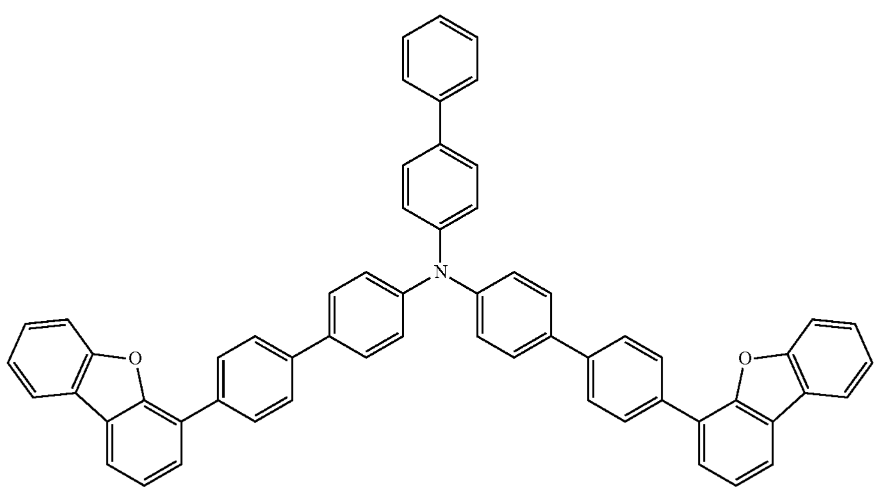

-continued
HT24
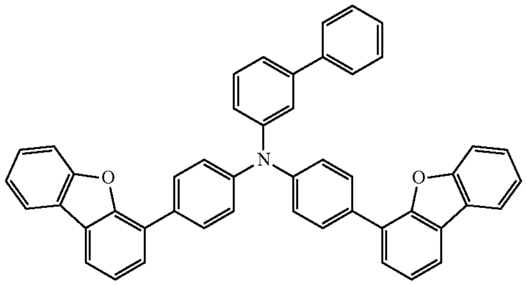
HT25
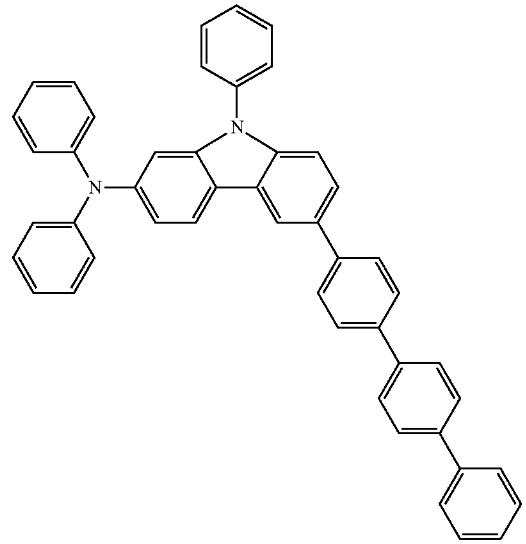
HT26
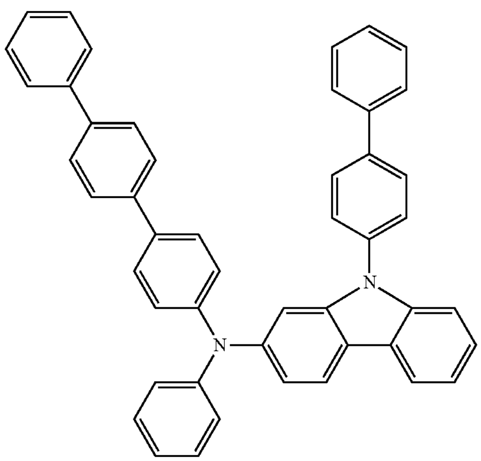
HT27
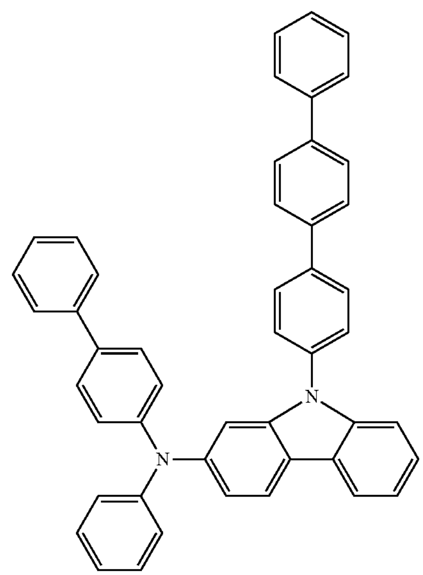
HT28
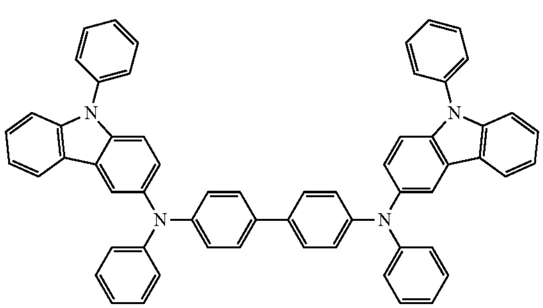
HT29
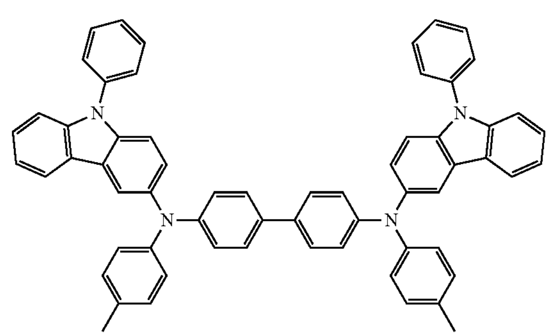

-continued
HT30
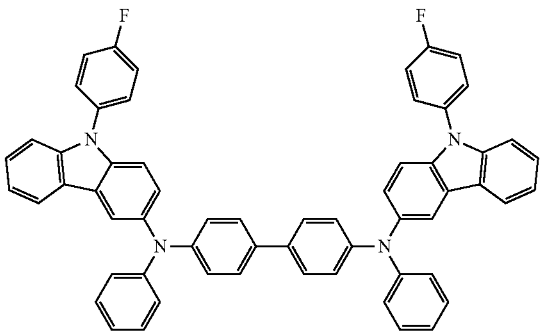
HT31
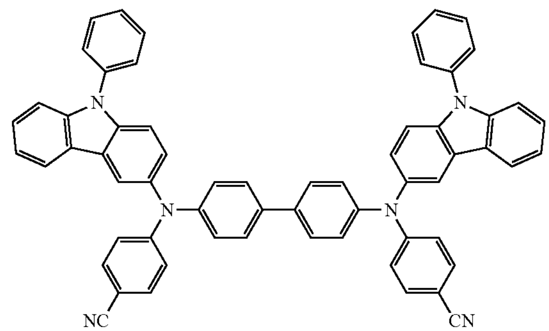
HT32
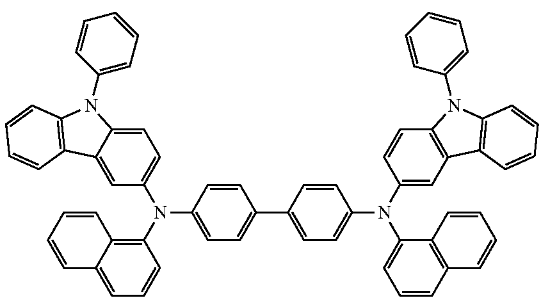
HT33
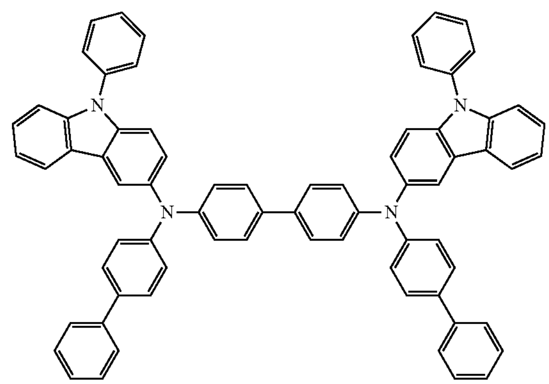
HT34
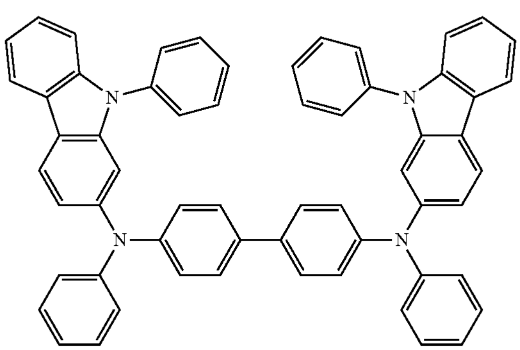
HT35
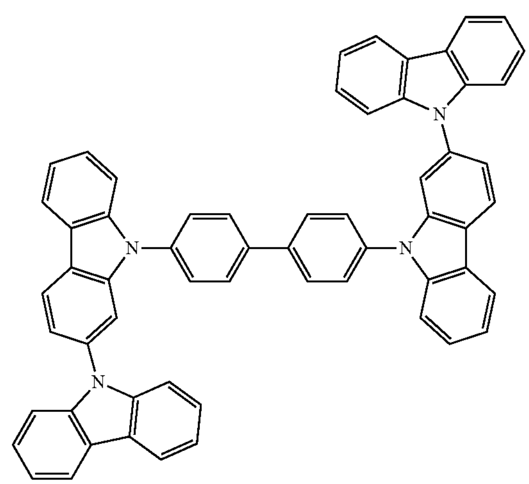

-continued
HT36
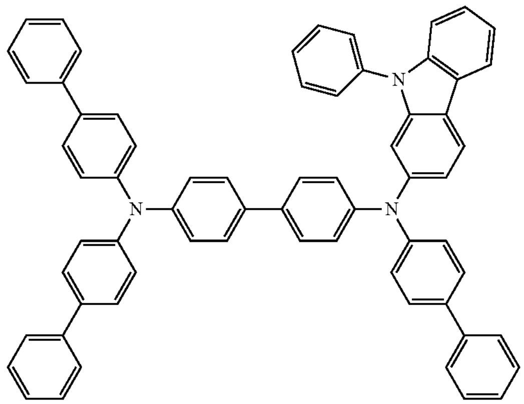
HT37
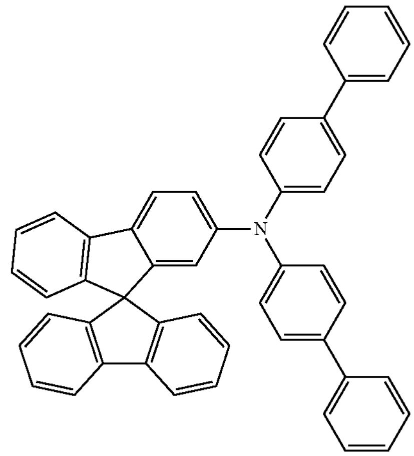
HT38
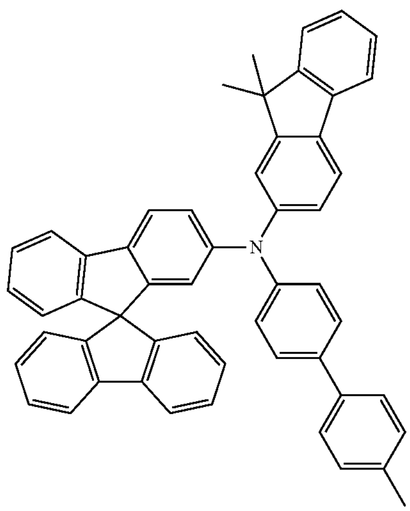
HT39
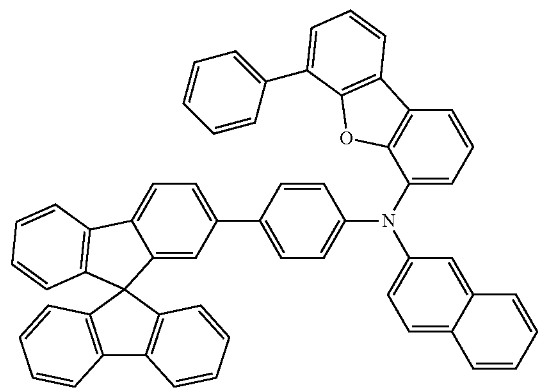
HT40
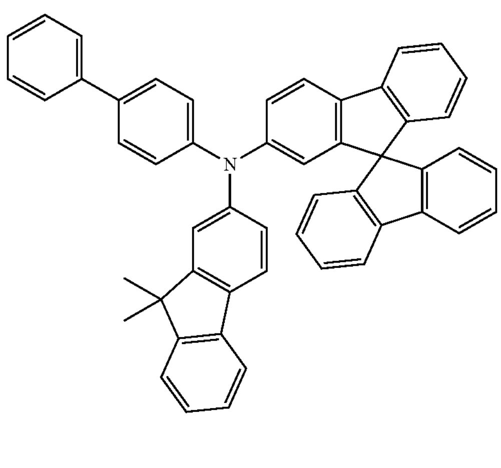
HT41
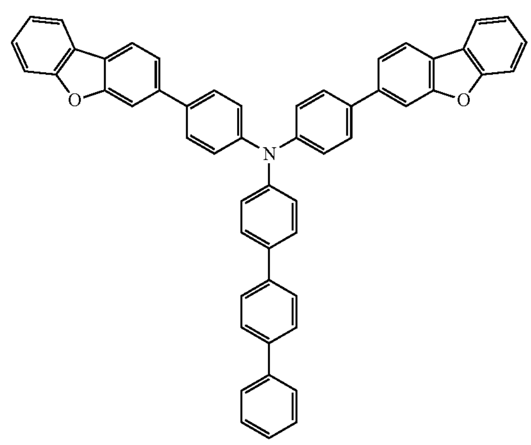

-continued
HT42
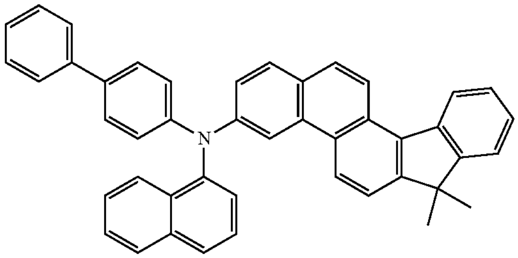
HT43
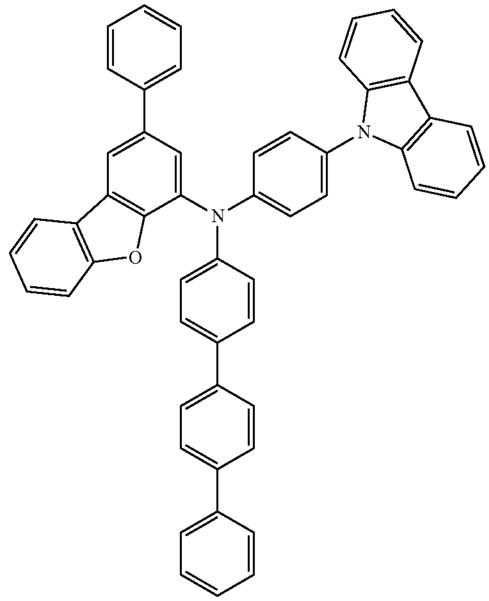
HT44
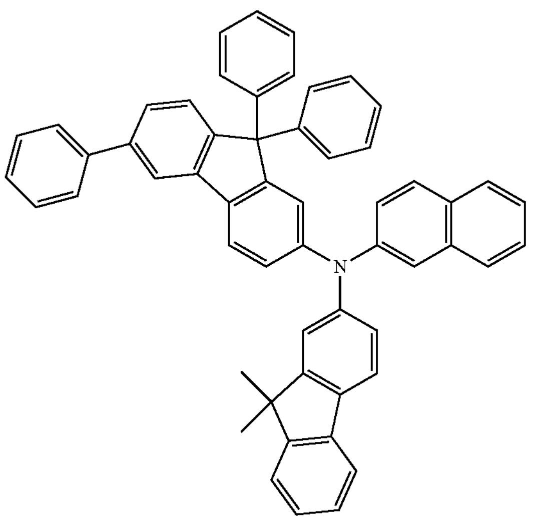
HT45
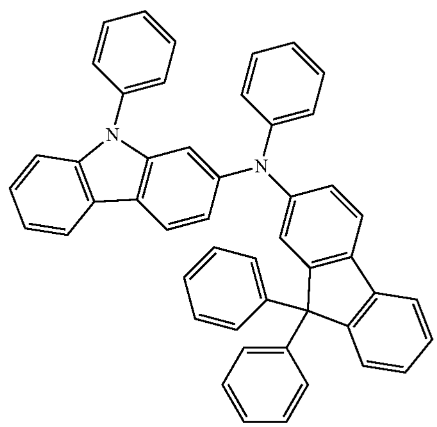
HT46
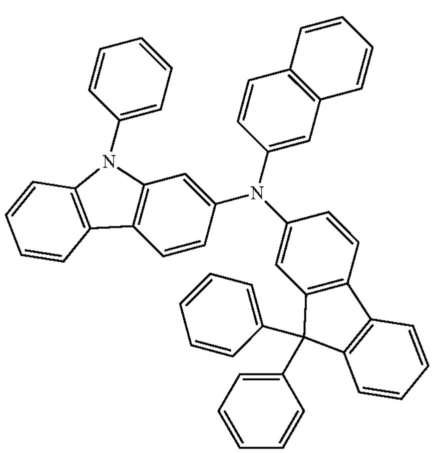

-continued
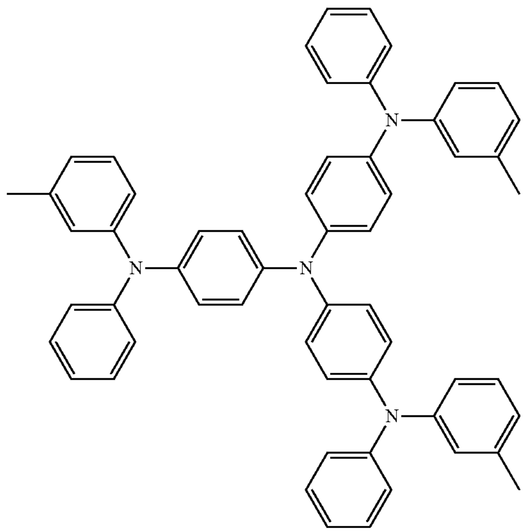
m-MTDATA
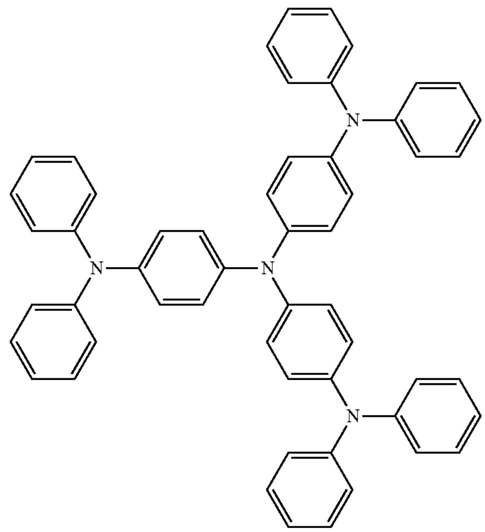
TDATA
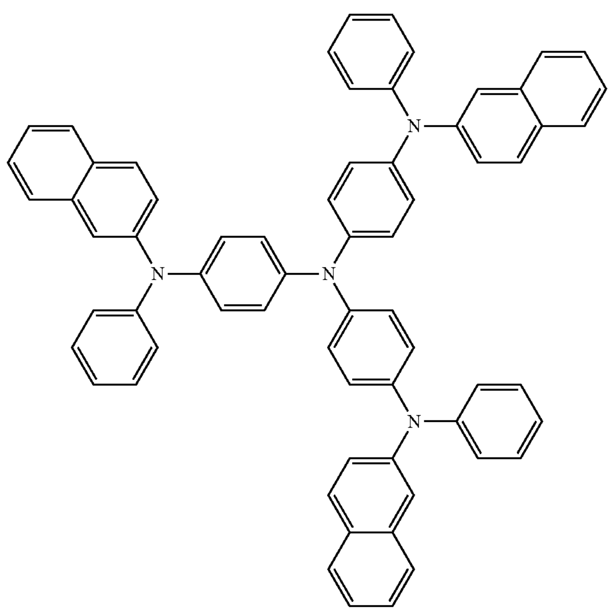
2-TNATA
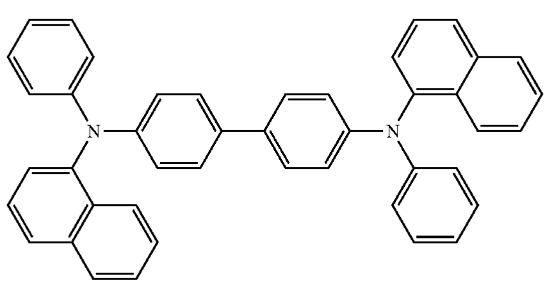
NPB -continued
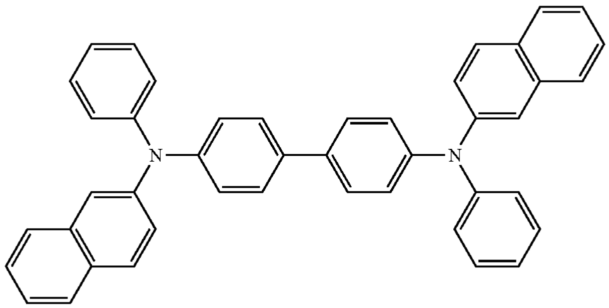
β-NPB
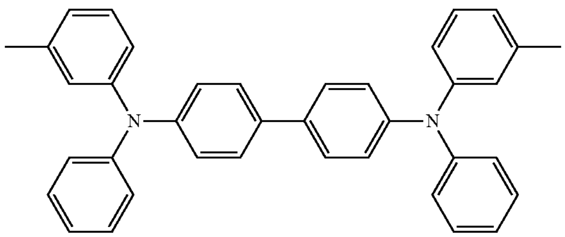
TPD
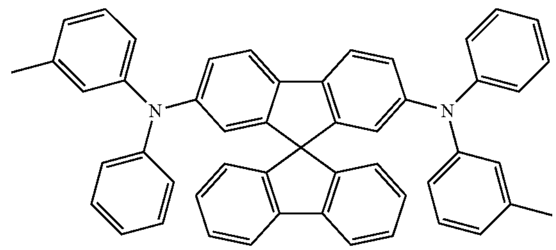
Spiro-TPD
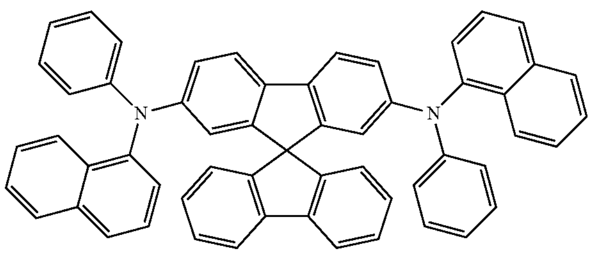
Spiro-NPB
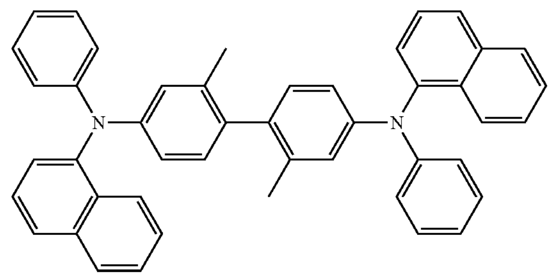
methylated-NPB
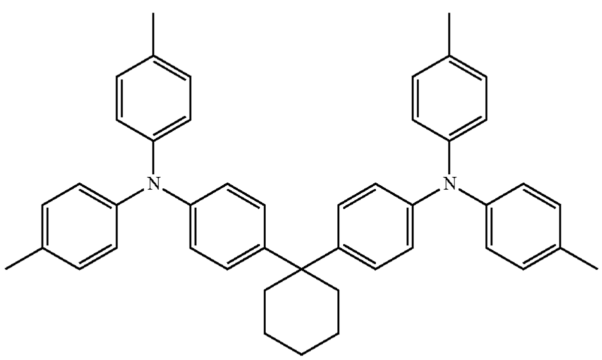
TAPC
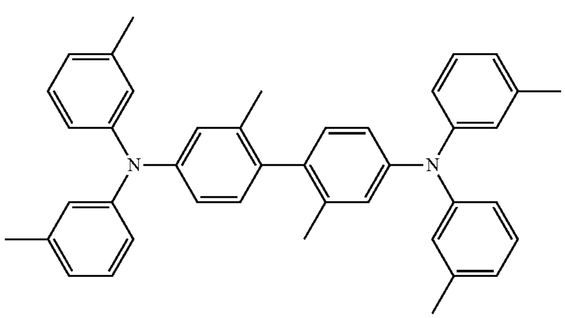
HMTPD The emission auxiliary layer may increase light-emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron blocking layer.

The hole transport region may further include, in addition to these materials, a charge-generation material for the improvement of conductive properties. The charge-generation material may be evenly or unevenly dispersed in the hole transport region (for example, in the form of a single layer consisting of a charge-generation material).

The charge-generation material may be, for example, a p-dopant.

For example, a lowest unoccupied molecular orbital (LUMO) energy level of the p-dopant may be equal to or less than about −3.5 eV.

In embodiments, the p-dopant may include a quinone derivative, a cyano group-containing compound, a compound including element EL1 and element EL2, or any combination thereof.

Examples of the quinone derivative may include TCNQ, F4-TCNQ, etc.

Examples of the cyano group-containing compound may include HAT-CN, and a compound represented by Formula 221.

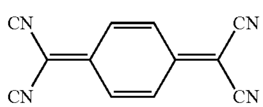

TCNQ

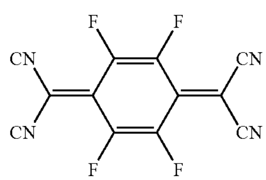

F4-TCNQ

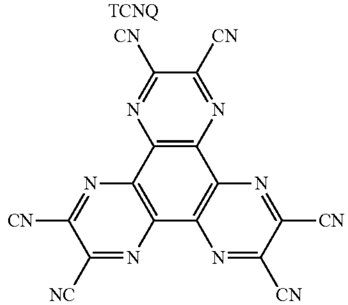

HAT-CN

[Formula 221]

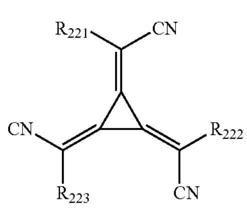

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

Examples of the compound including element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, Sm $F_3$, YbCl, $YbCl_2$, $YbCl_3$ $SmCl_3$, YbBr, $YbBr_2$, $YbBr_3$ $SmBr_3$, YbI, $YbI_2$, $YbI_3$, and $SmI_3$.

Examples of the metalloid halide may include an antimony halide (for example, $SbCl_5$, etc.).

Examples of the metal telluride may include an alkali metal telluride (for example, $Li_2Te$, a $na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Resonance Control Layers 141, 142, and 143]

In an embodiment, the interlayer may further include a first resonance control layer 141 between the first pixel electrode 111 and the first emission layer 131, a second resonance control layer 142 between the second pixel electrode 112 and the second emission layer 132, and/or a third resonance control layer 143 between the third pixel electrode 113 and the third emission layer 133.

The first resonance control layer 141, the second resonance control layer 142, and the third resonance control layer 143 may each have a structure including a layer including a single material, a structure including a layer including different materials, or a structure including multiple layers including different materials.

The first resonance control layer 141, the second resonance control layer 142, and the third resonance control layer 143 may each independently include a hole transport material as described herein.

The first resonance control layer 141, the second resonance control layer 142, and the third resonance control layer 143 may be provided to appropriately control $L_1$, $L_2$, and $L_3$, respectively.

[Emission Layers 131, 132, and 133]

The emission layers 131, 132, and 133 may each independently include hosts and dopants. The dopants may include at least one selected from phosphorescent dopants and fluorescence dopants.

An amount of the dopants in the emission layers 131, 132, and 133 may each be in a range of about 0.01 part by weight to about 15 parts by weight, based on 100 parts by weight of the host, but embodiments are not limited thereto.

A thickness of the emission layers 131, 132, and 133 may each independently be in a range of about 100 Å to about 1,000 Å. For example, a thickness of the emission layers 131, 132, and 133 may each independently be in a range of about 200 Å to about 600 Å. When the thicknesses of the emission layers 131, 132, and 133 are within these ranges, excellent luminescence characteristics may be obtained without a substantial increase in driving voltage.

The hosts of the emission layers 131, 132, and 133 may each independently include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

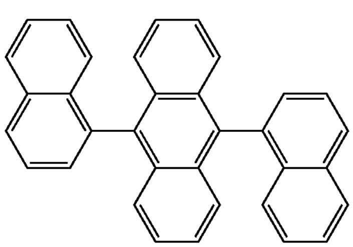
H1

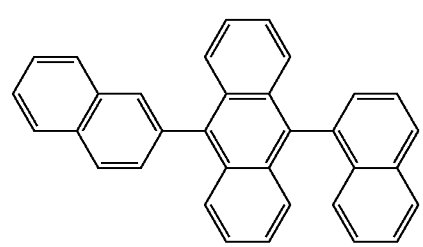
H2

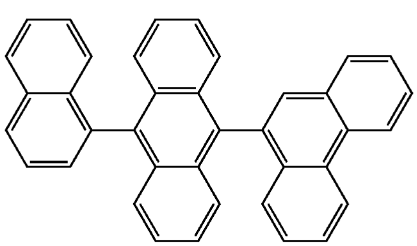
H3

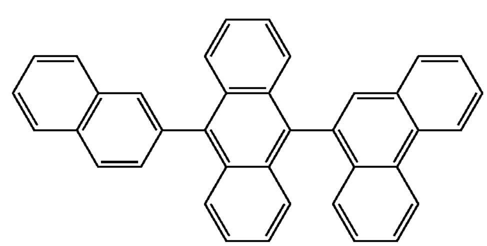
H4

-continued
H5
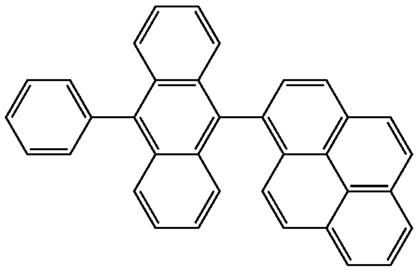
H6
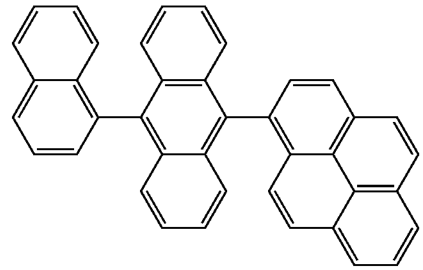
H7
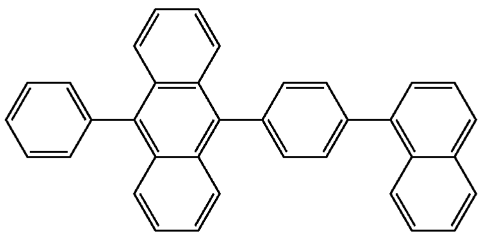
H8
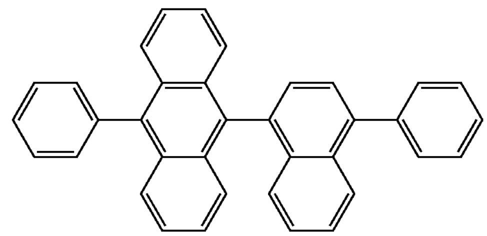
H9
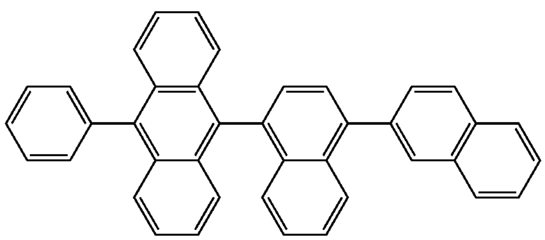
H10
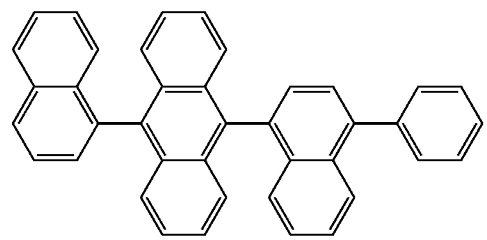
H11
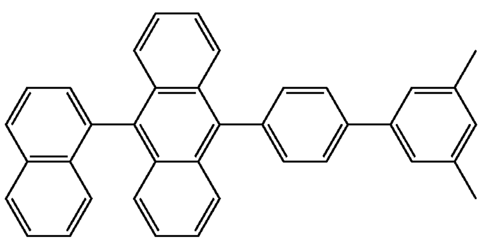
H12
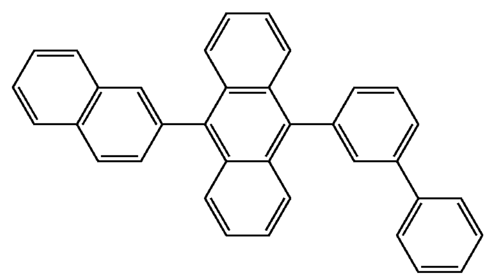
H13
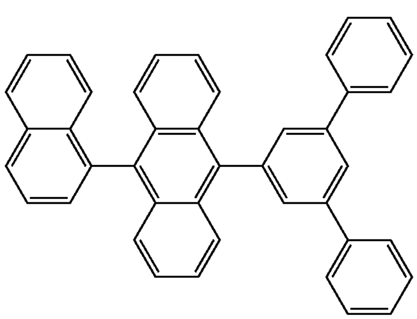
H14
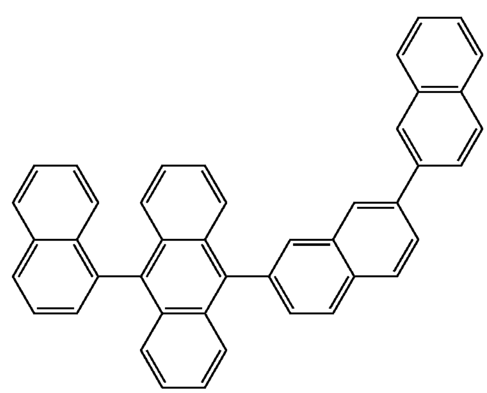

-continued
H15
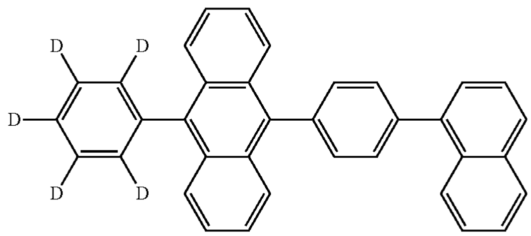
H16
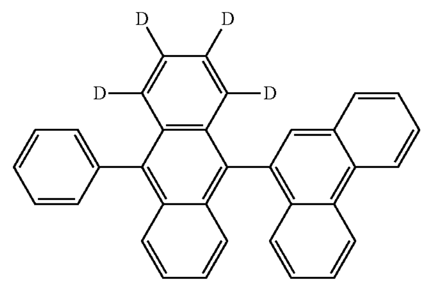
H17
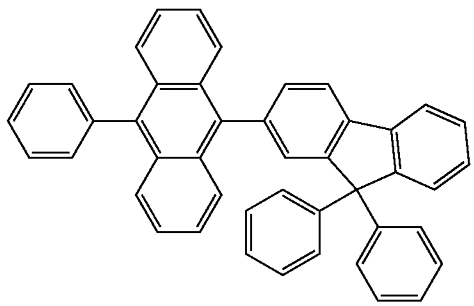
H18
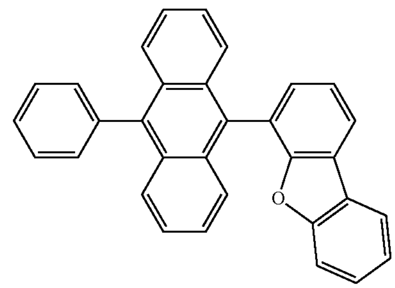
H19
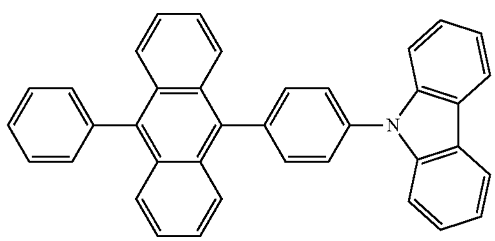
H20
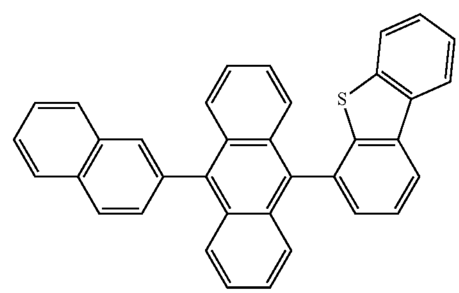
H21
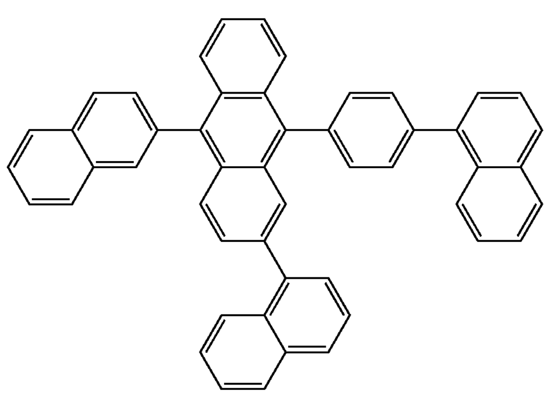
H22
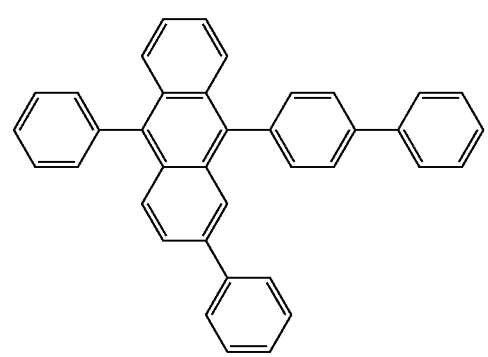

-continued
H23
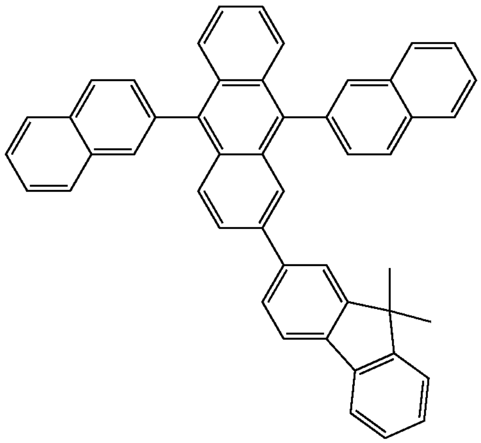
H24
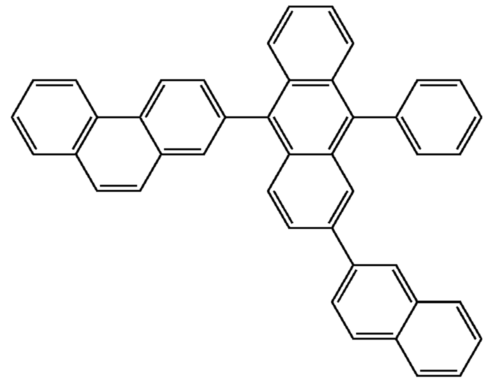
H25
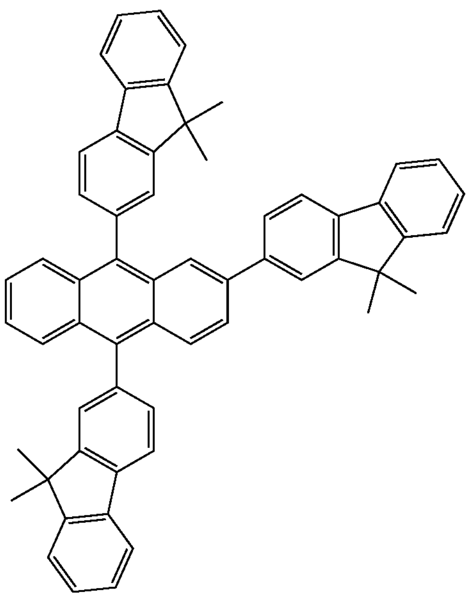
H26
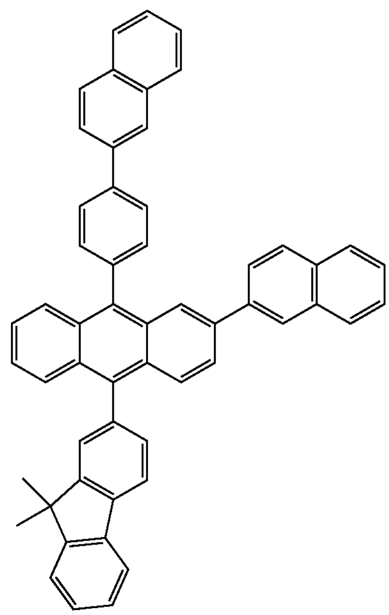
H27
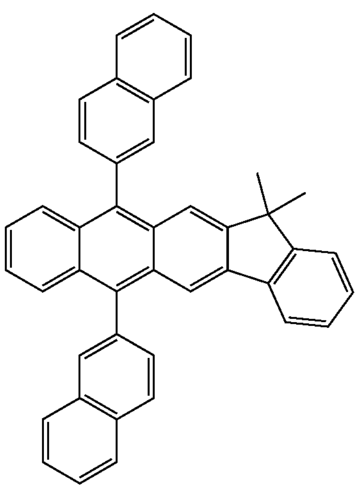
H28
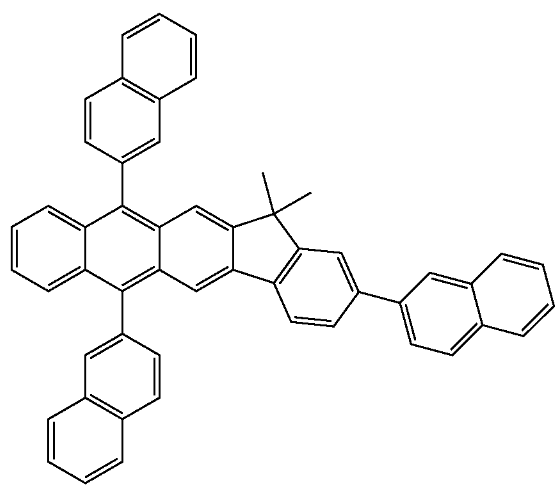

-continued
H29
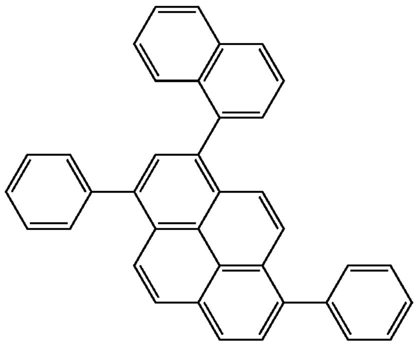
H30
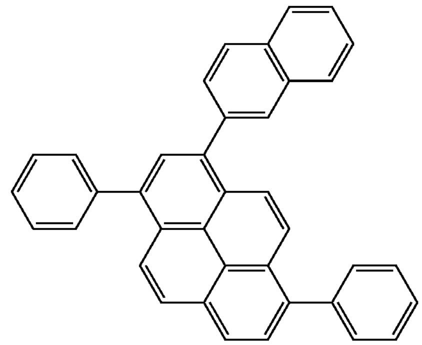
H31
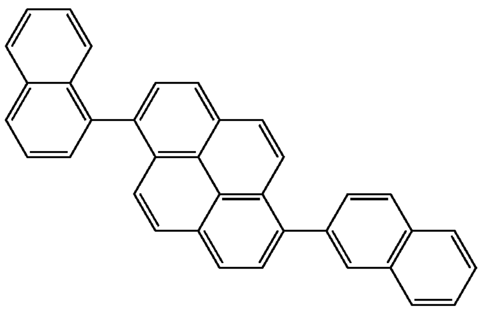
H32
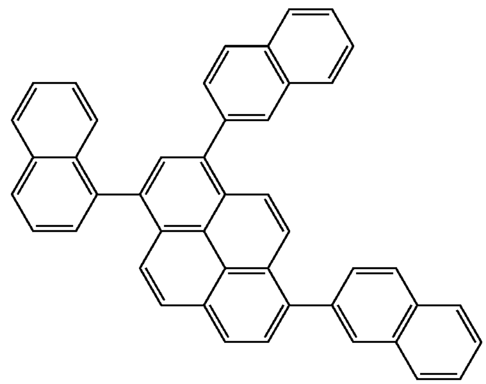
H33
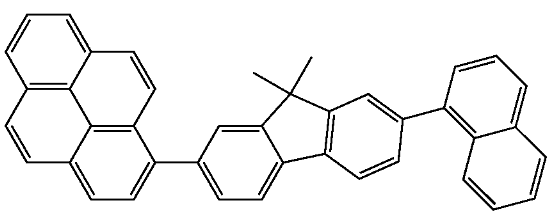
H34
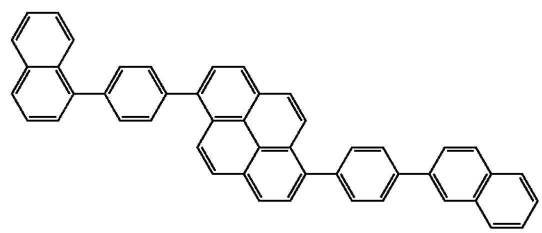
H35
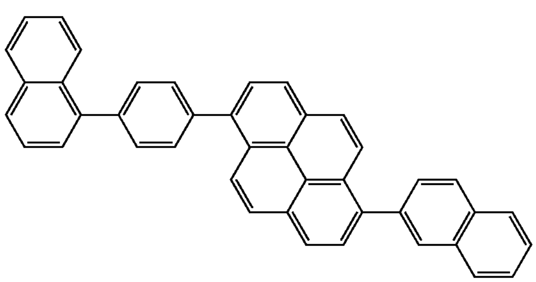
H36
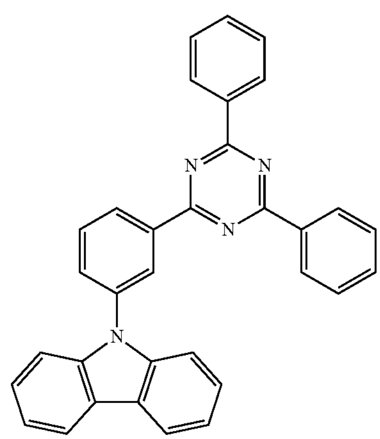

-continued
H37
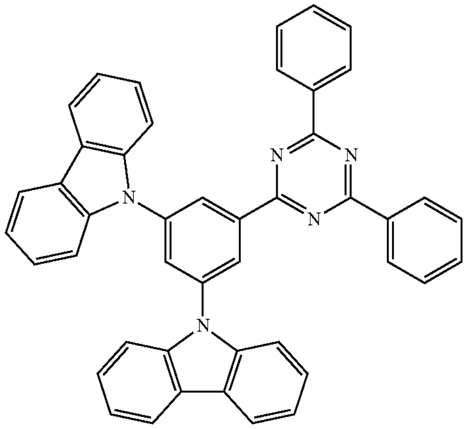
H38
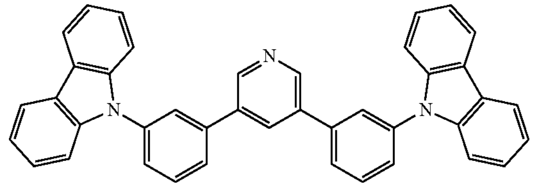
H39
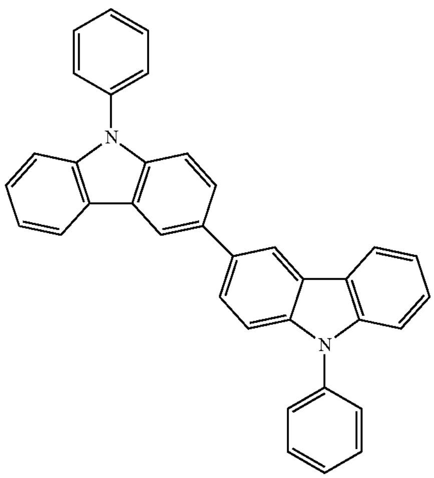
H40
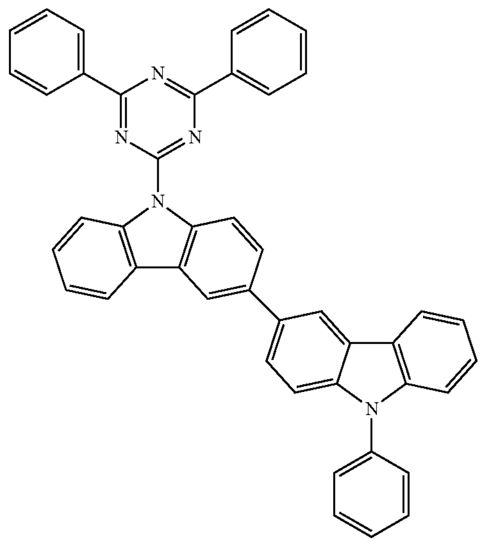
H41
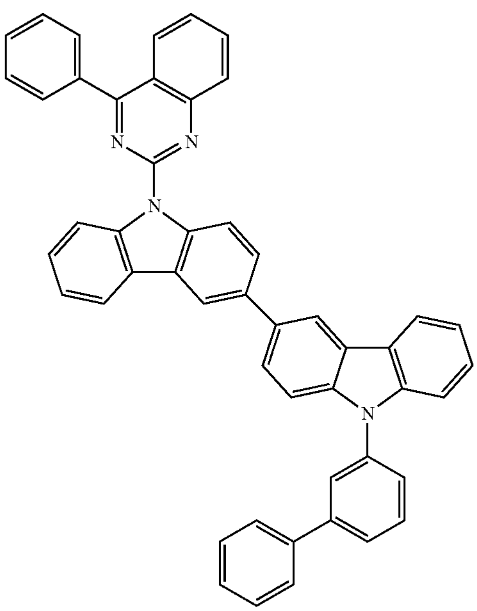
H42
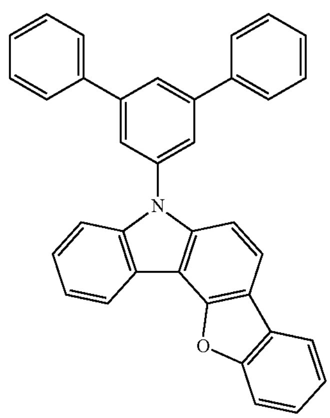

-continued
H43
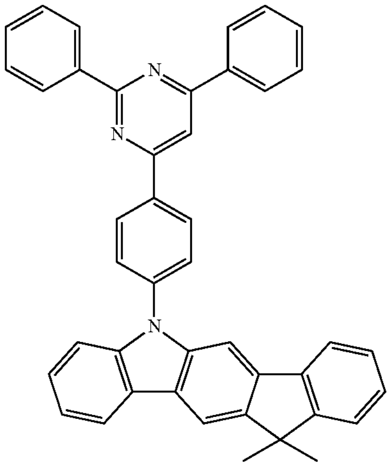
H44
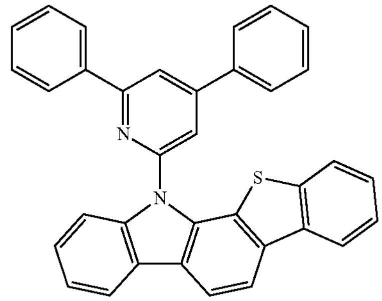
H45
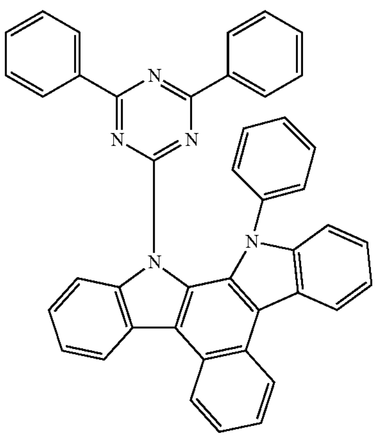
H46
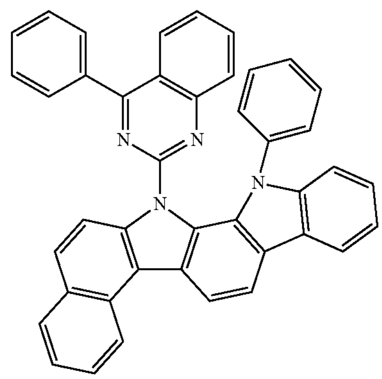
H47
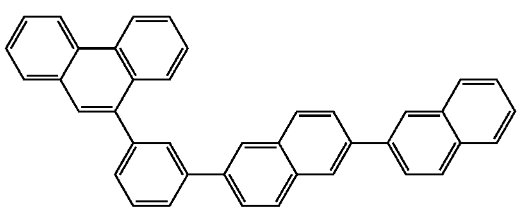
H48
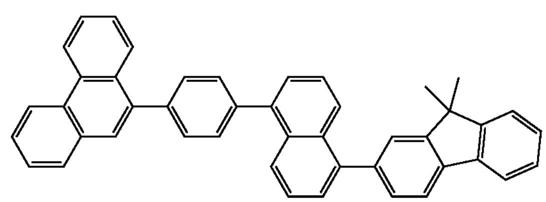
H49
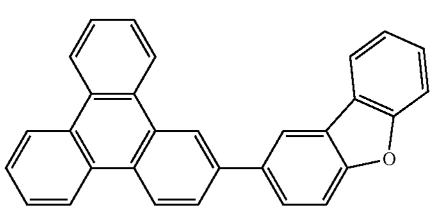
H50
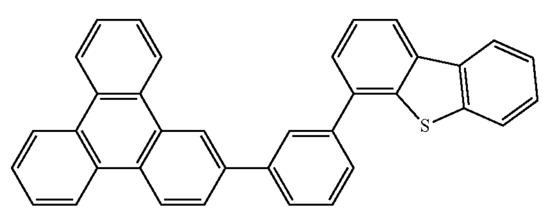

-continued
H51
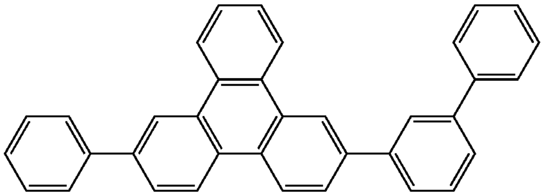
H52
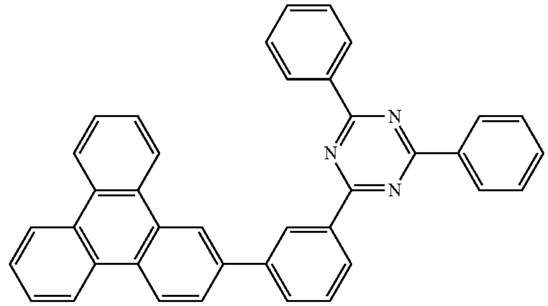
H53
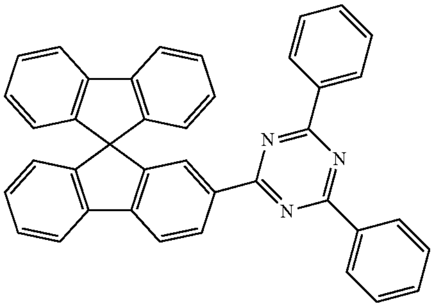
H54
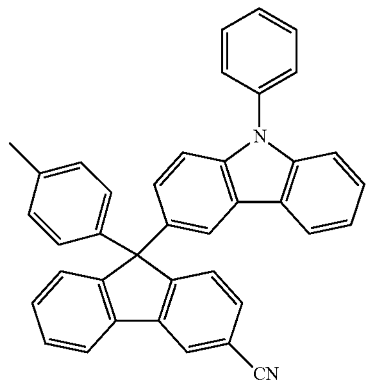
H55
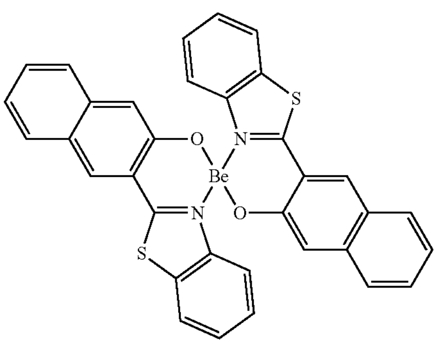
H56
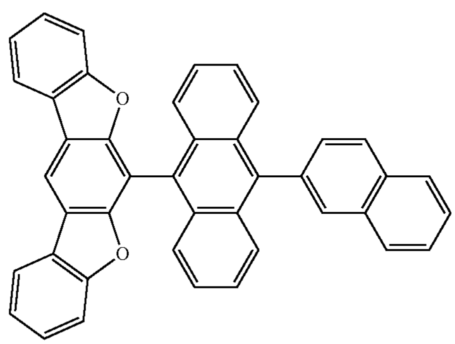
H57
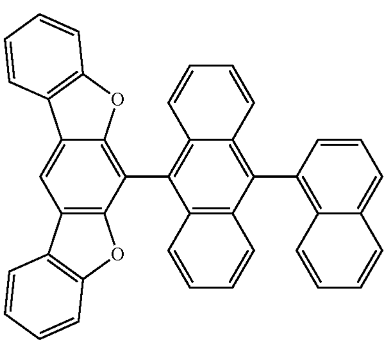
H58
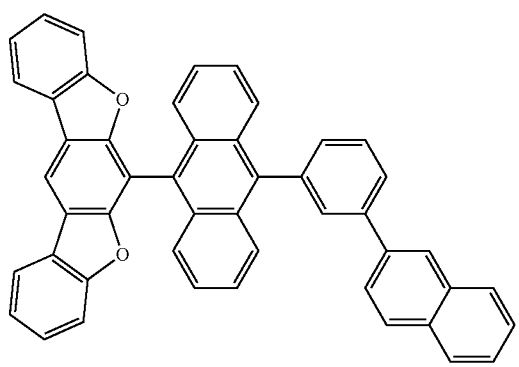

-continued
H59
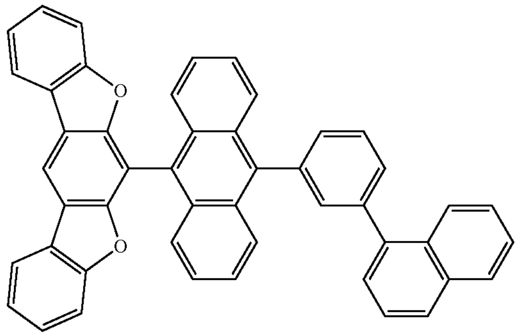
H60
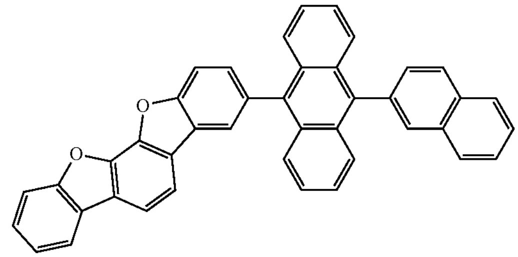
H61
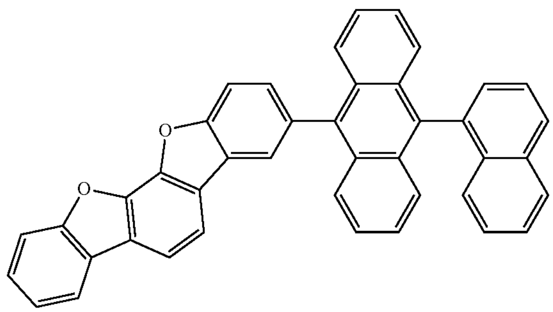
H62
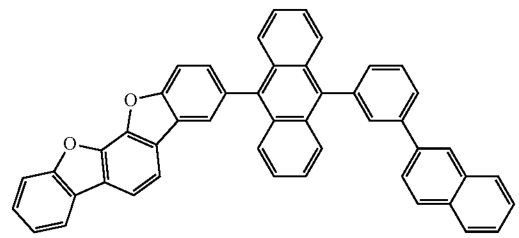
H63
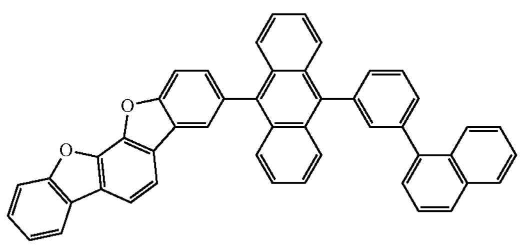
H64
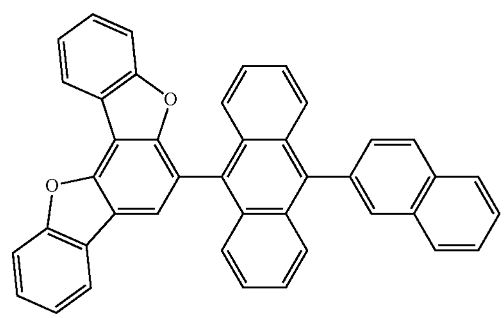
H65
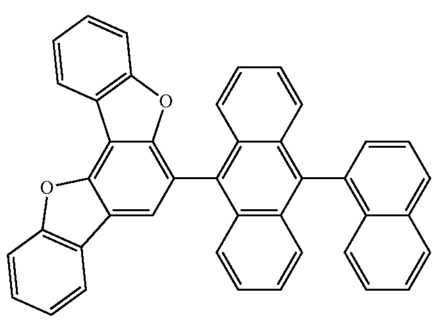
H66
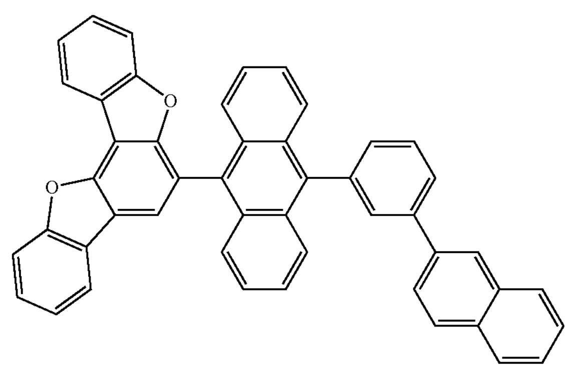

-continued
H67
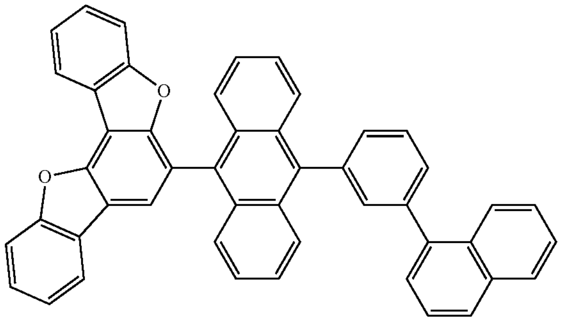
H68
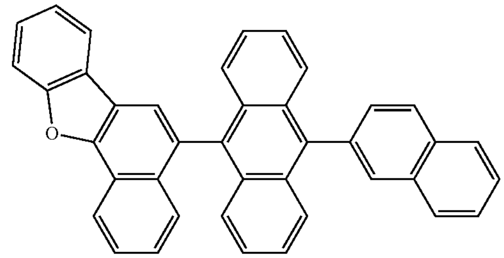
H69
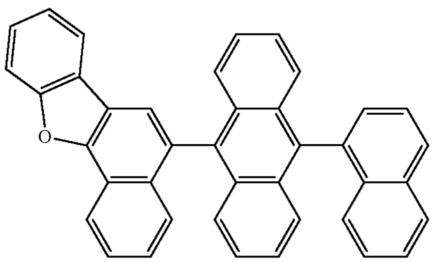
H70
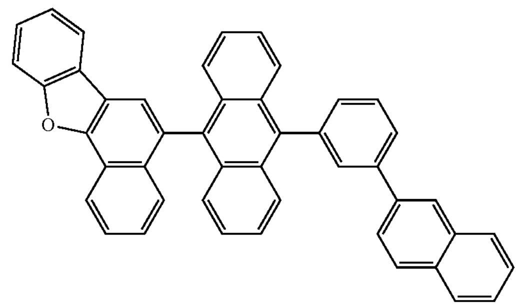
H71
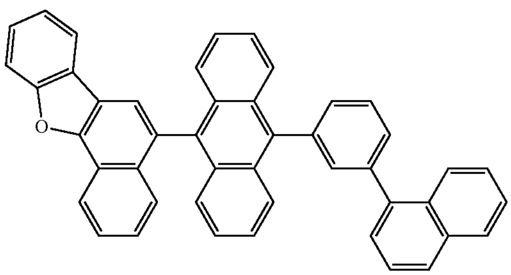
H72
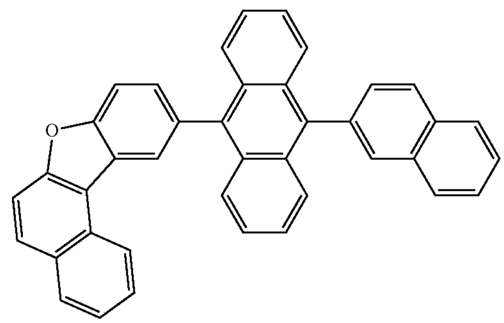
H73
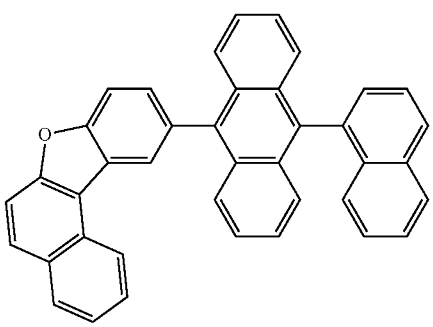
H74
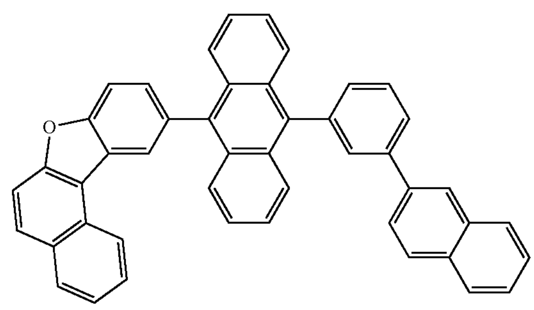
H75
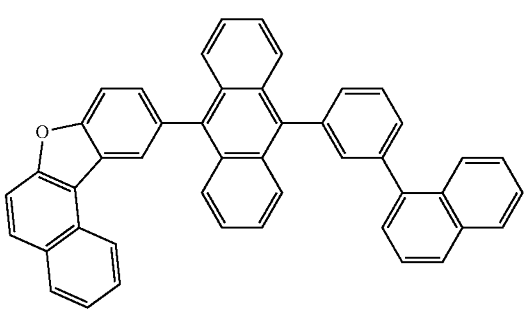
H76
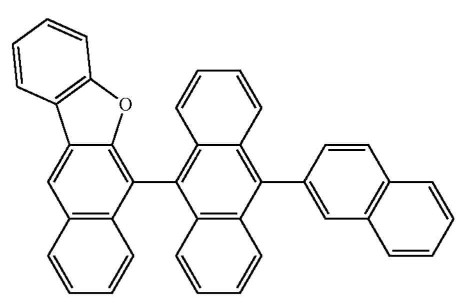

-continued
H77
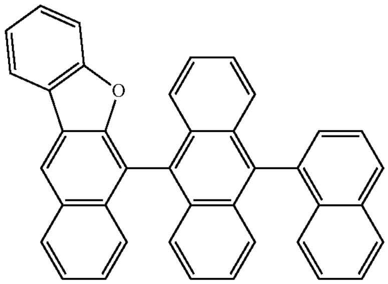
H78
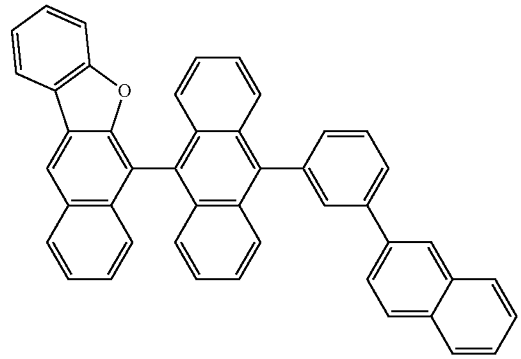
H79
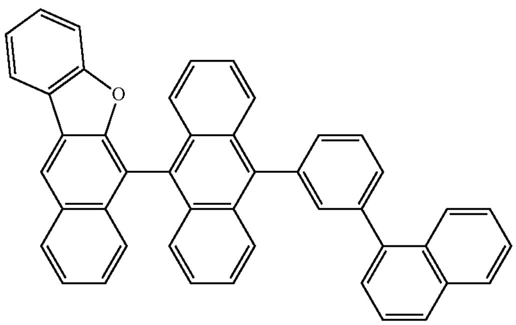
H80
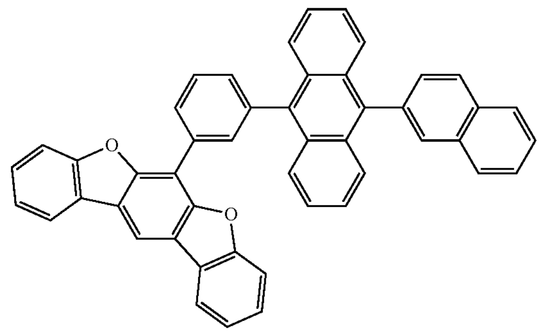
H81
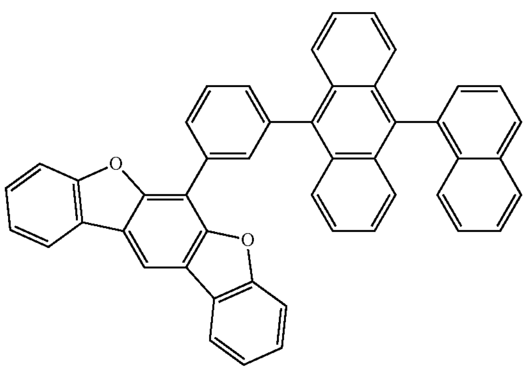
H82
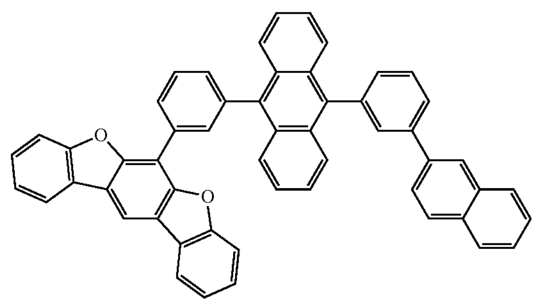
H83
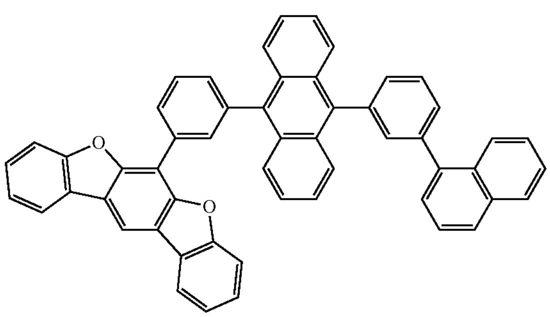
H84
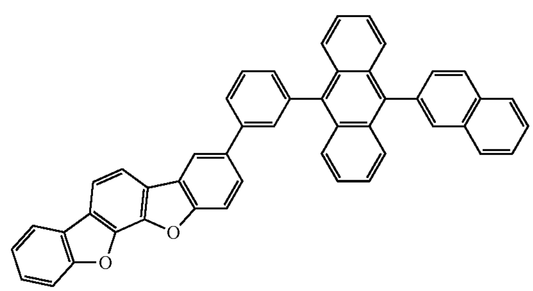

-continued
H85
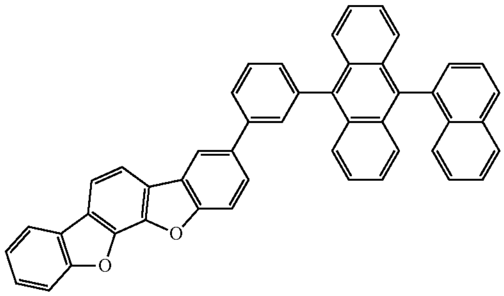
H86
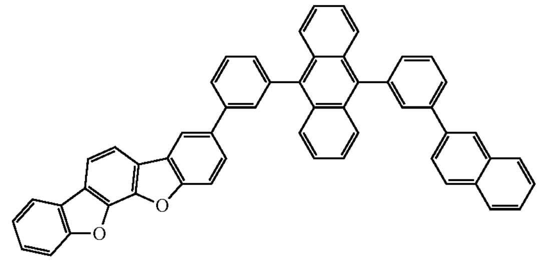
H87
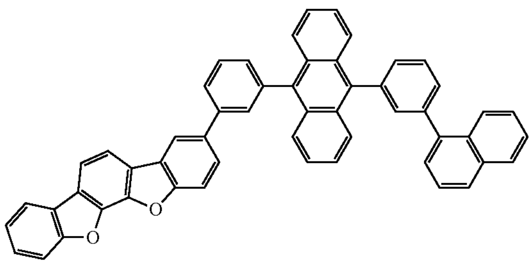
H88
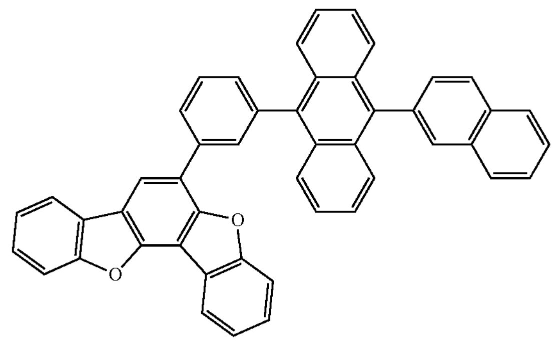
H89
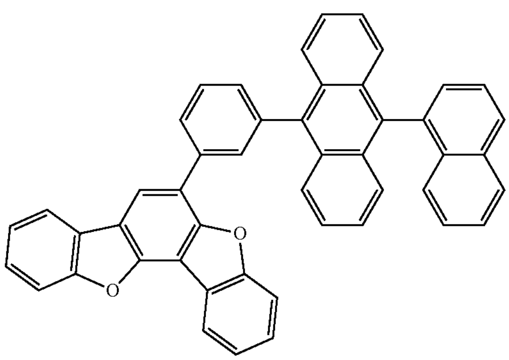
H90
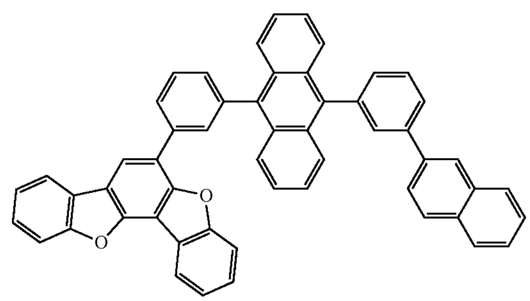
H91
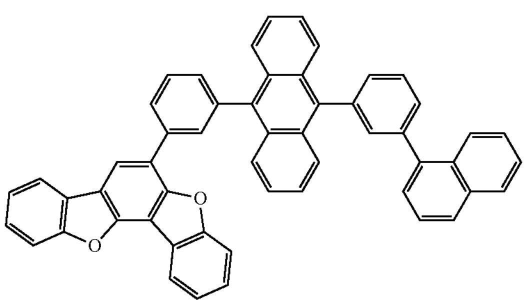
H92
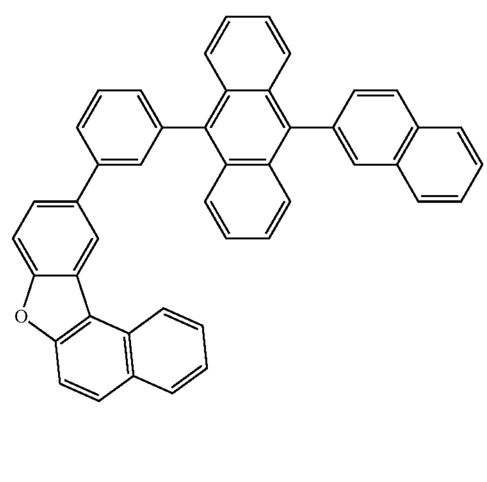

-continued
H93
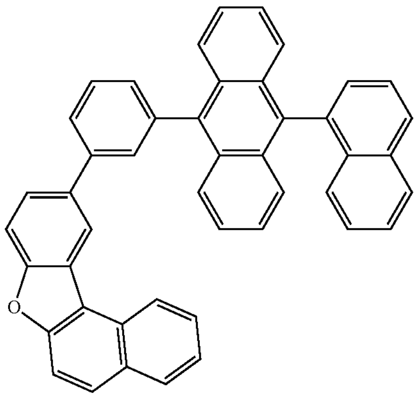
H94
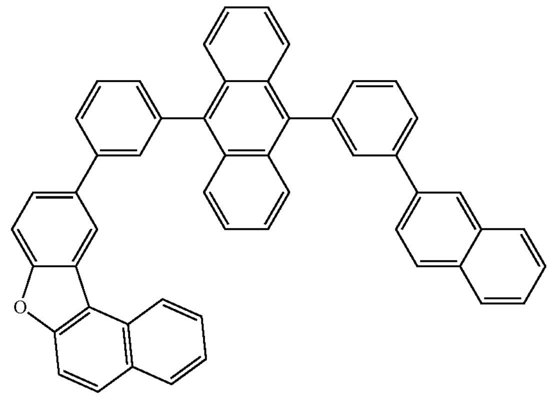
H95
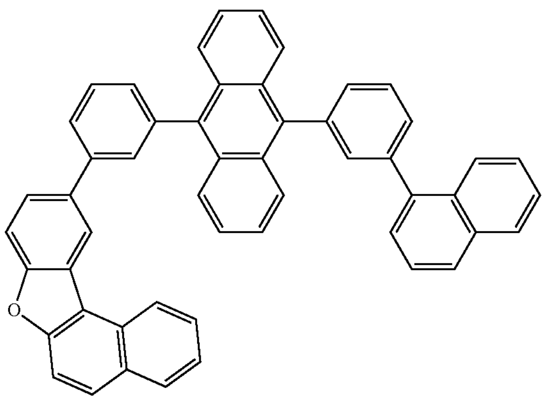
H96
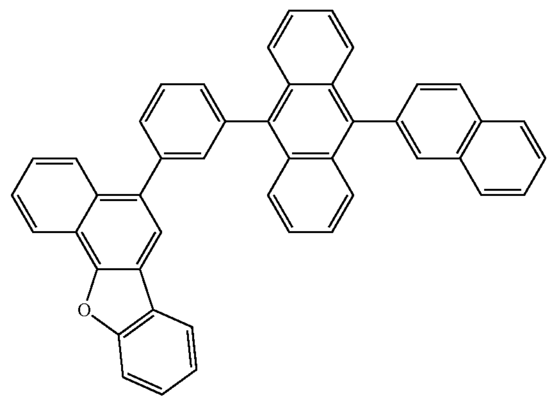
H97
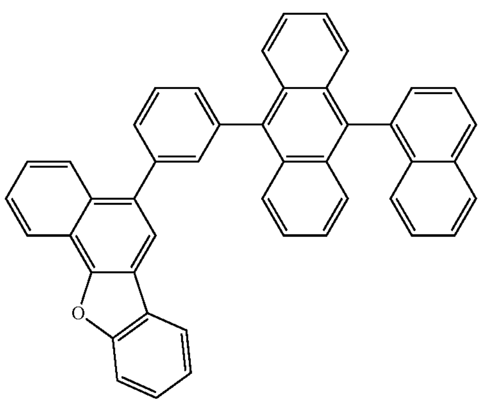
H98
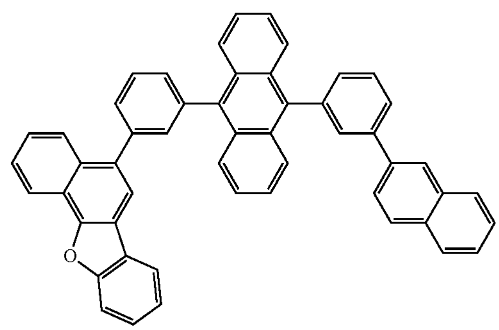
H99
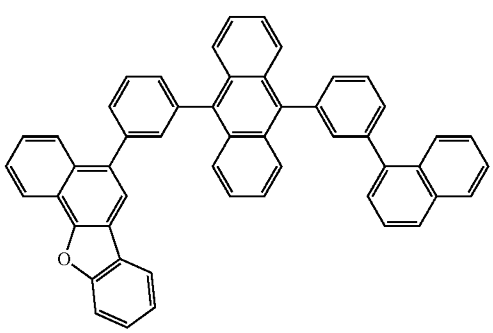
H100
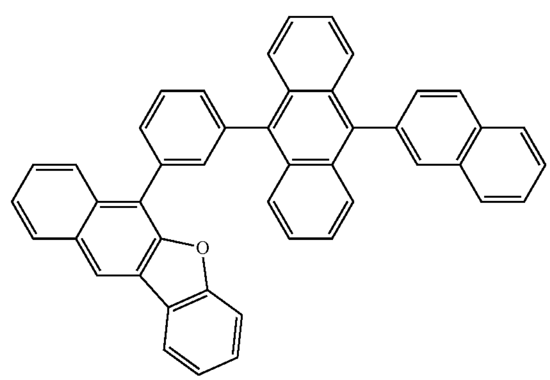

-continued
H101
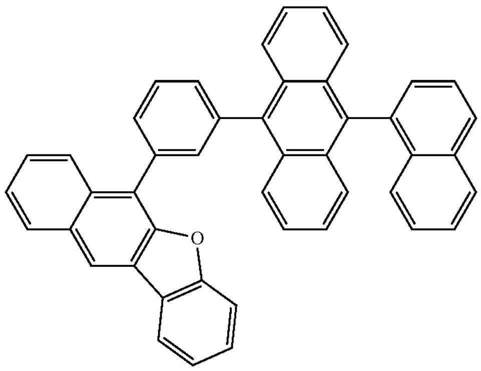
H102
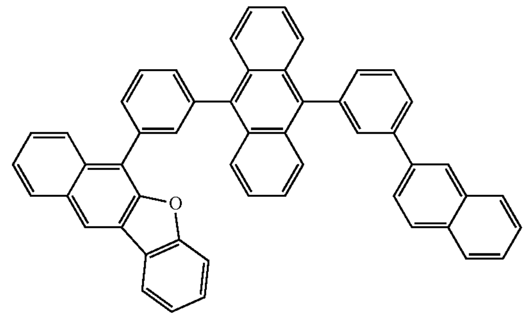
H103
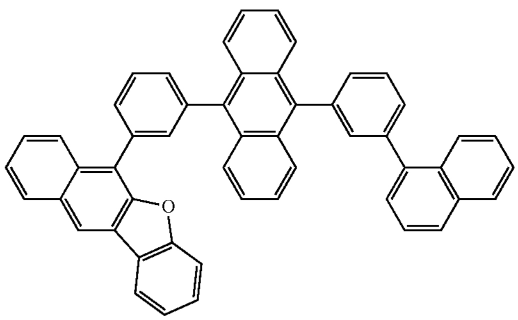
H104
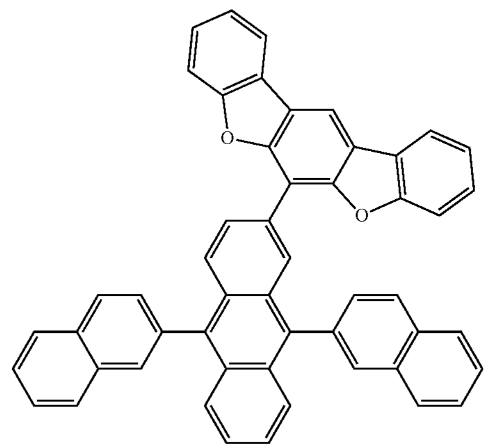
H105
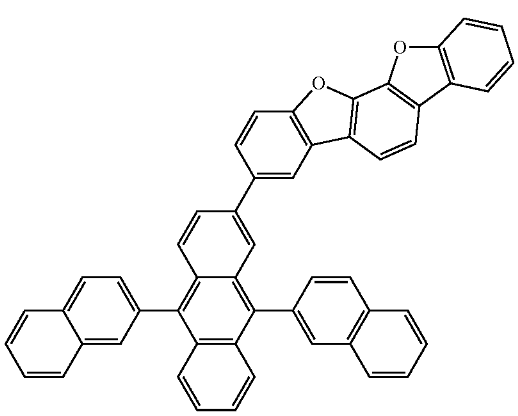
H106
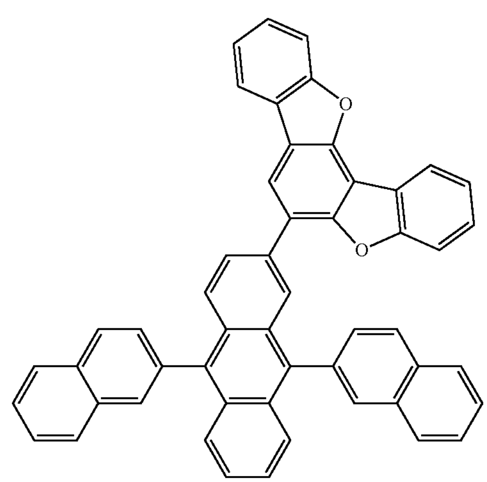

-continued
H107
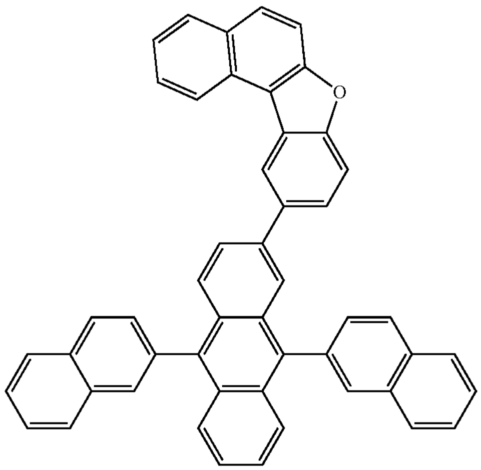
H108
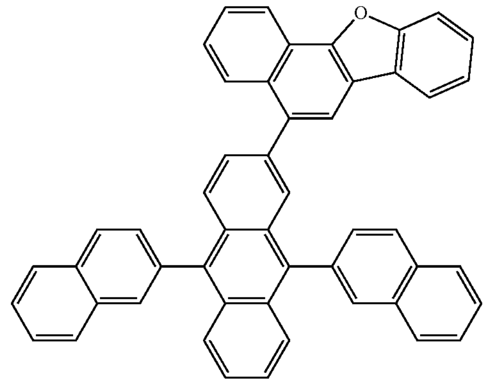
H109
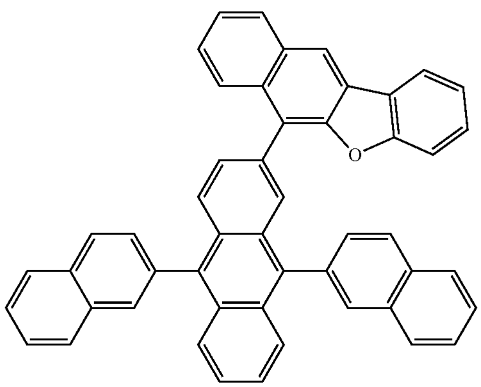
H110
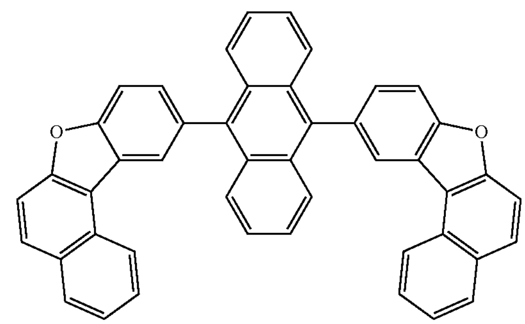
H111
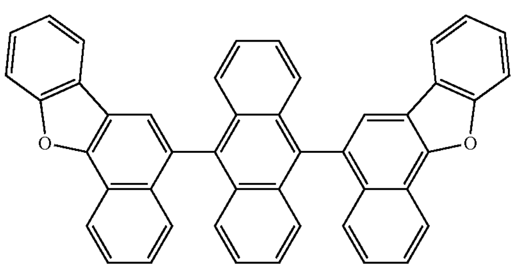
H112
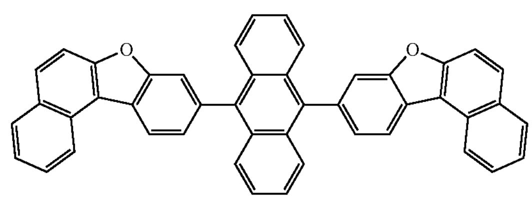
H113
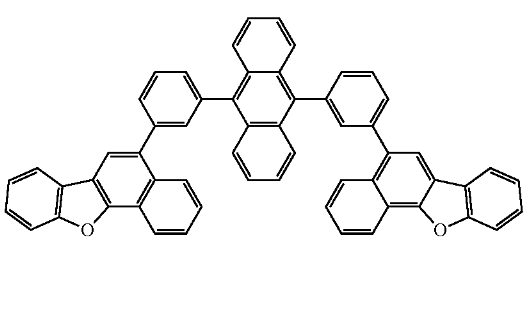

-continued
H114
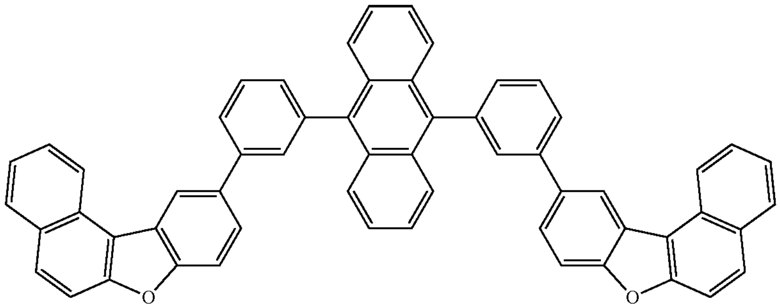
H115
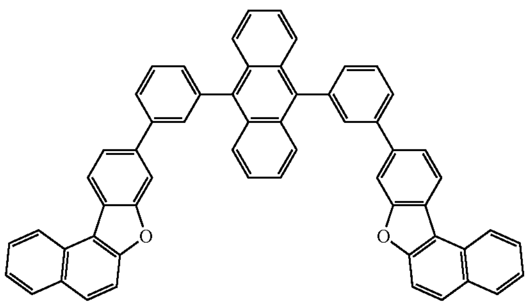
H116
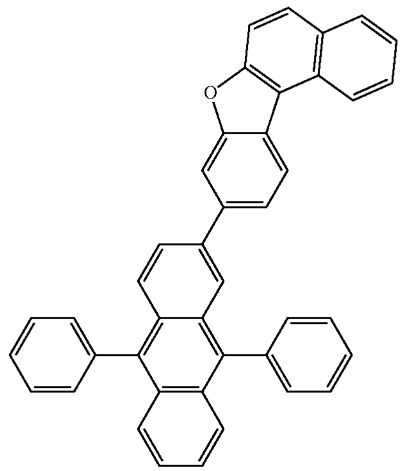
H117
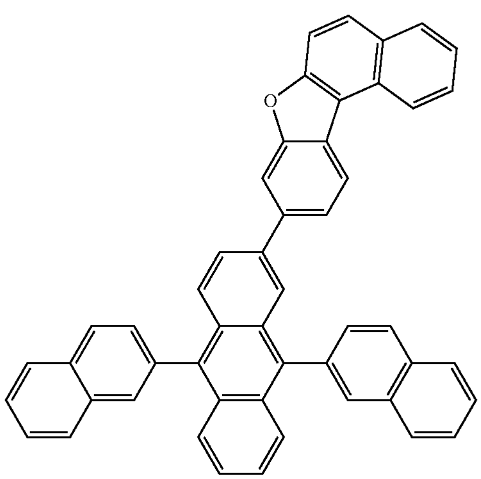
H118
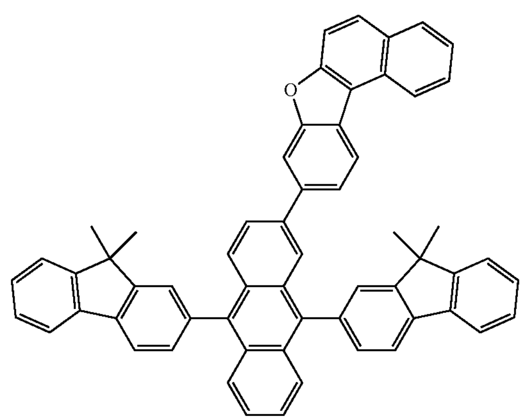

-continued
H119
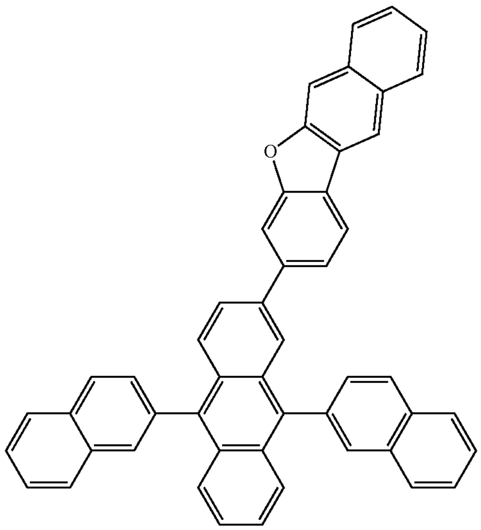
H120
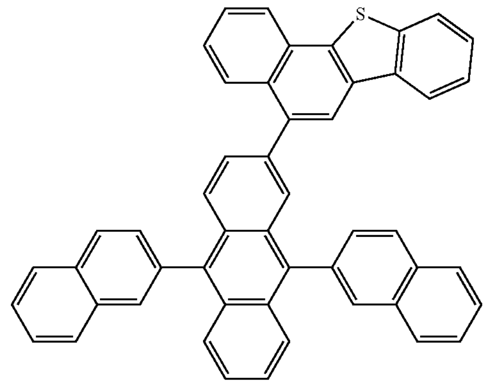
H121
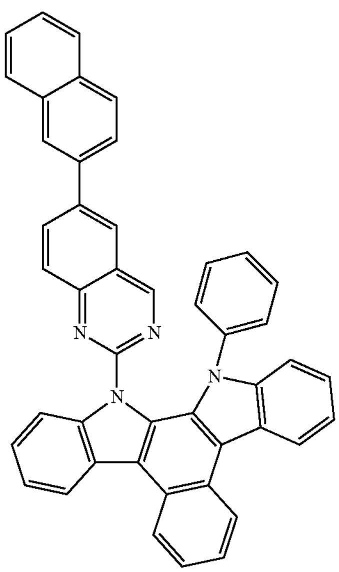
H122
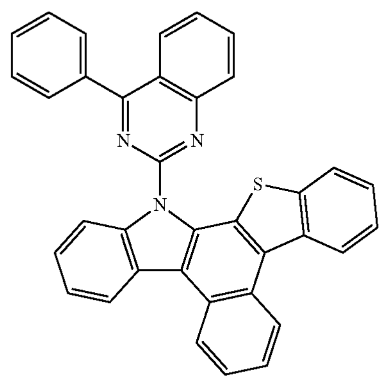
H123
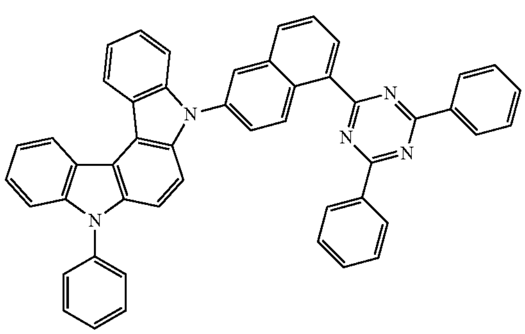
H124
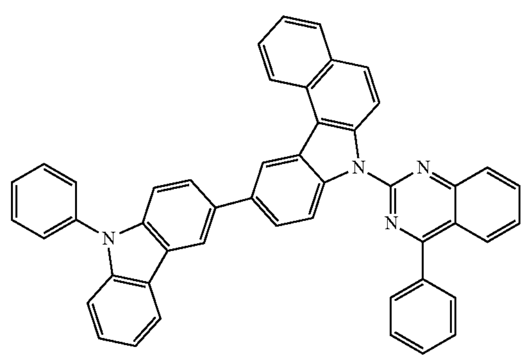
.

The first emission layer 131 may include PtOEP, $Ir(piq)_3$, $Btp_2Ir(acac)$, $Ir(piq)_2(acac)$, $Ir(2\text{-}phq)_2(acac)$, $Ir(2\text{-}phq)_3$, $Ir(flq)_2(acac)$, $Ir(fliq)_2(acac)$, DCM, DCJTB, PBD, $Eu(DBM)_3(phen)$(tris(dibenzoylmethane) phenanthroline europium), a perylene derivative, or any combination thereof as a dopant, but embodiments are not limited thereto.

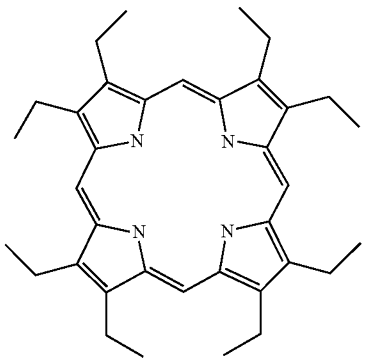

PtOEP

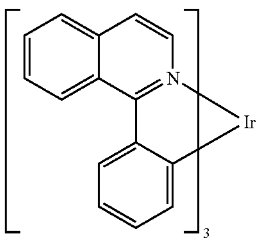

$Ir(piq)_3$

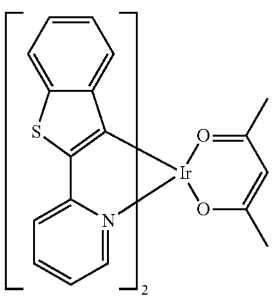

$Btp_2Ir(acac)$

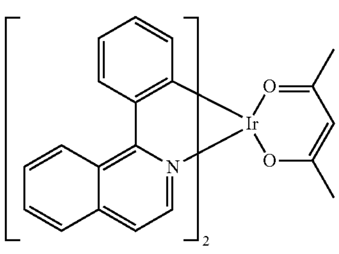

$Ir(piq)_2(acac)$

-continued

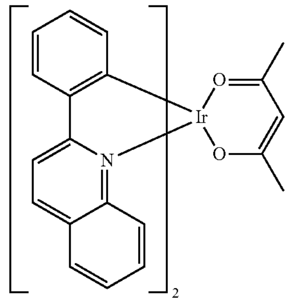

$Ir(2\text{-}phq)_2(acac)$

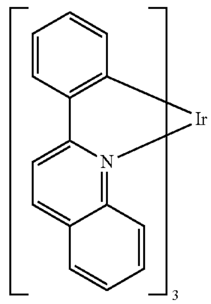

$Ir(2\text{-}phq)_3$

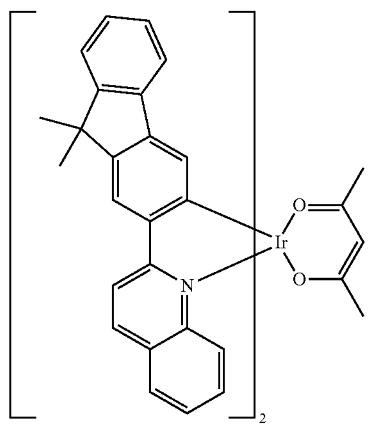

$Ir(flq)_2(acac)$

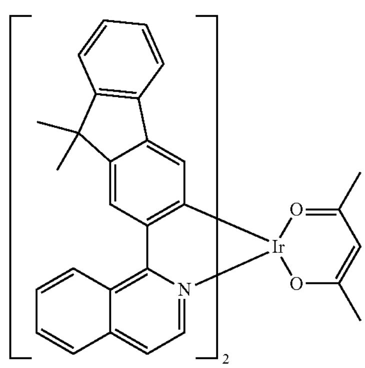

$Ir(fliq)_2(acac)$

-continued

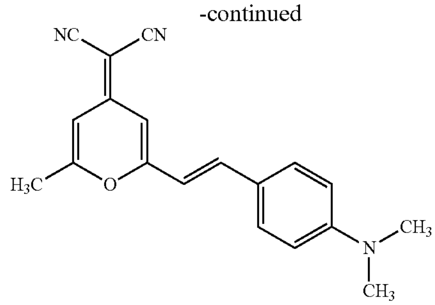

DCM

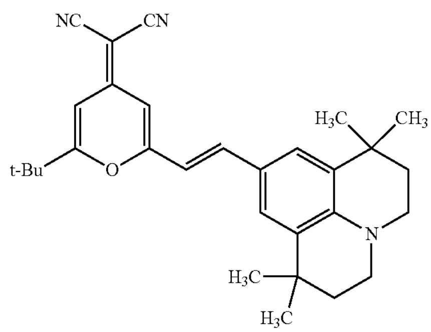

DCJTB

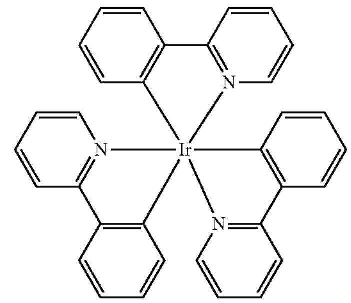

$Ir(ppy)_3$

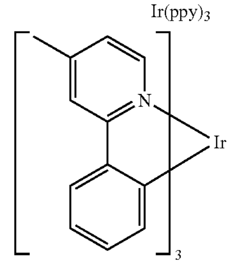

$Ir(mppy)_3$

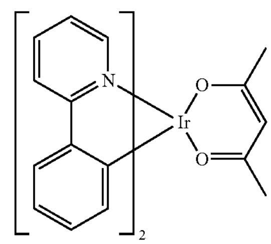

$Ir(ppy)_2(acac)$

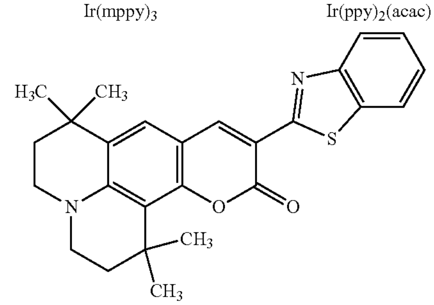

C545T

The second emission layer 132 may include $Ir(ppy)_3$ (tris(2-phenylpyridine) iridium), $Ir(ppy)_2(acac)$ (bis(2-phenylpyridine)(acetylacetonato)iridium(III), $Ir(mppy)_3$ (tris(2-(4-tolyl)phenylpyridine)iridium, 10-(2-benzothiazolyl)-1,1,7,7-tetramethyl-2,3,6,7-tetrahydro-1H,5H,11H-[1] benzopyrano [6,7,8-ij]-quinolizin-11-one (C545T), or any combination thereof as a dopant, but embodiments are not limited thereto.

The third emission layer 133 may include 4,6-$F_2$Irpic, $(F_2ppy)_2Ir(tmd)$, $Ir(dfppz)_3$, ter-fluorene, 4,4'-bis(4-diphenylaminostyryl)biphenyl (DPAVBi), spiro-DPVBi, 2,5,8,11-tetra-t-butylperylene (TBPe), distyryl-benzene (DSB), distyryl-arylene (DSA), a polyfluorene (PFO)-based polymer, a poly(p-phenylene vinylene) (PPV)-based polymer, or any combination thereof as a dopant, but embodiments are not limited thereto.

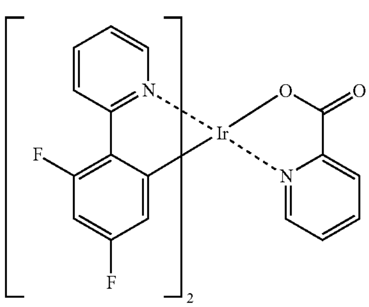

$F_2$Irpic

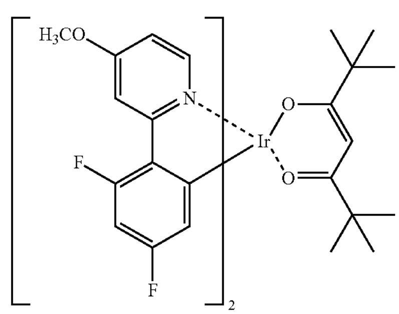

$(F_2ppy)_2Ir(tmd)$

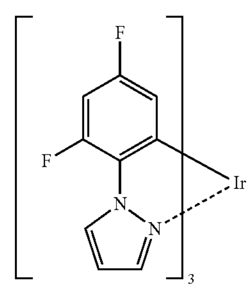

$Ir(dfppz)_3$

-continued
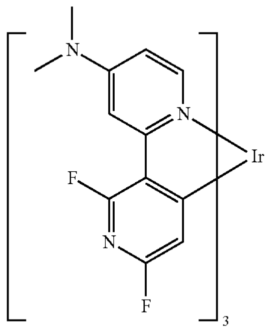
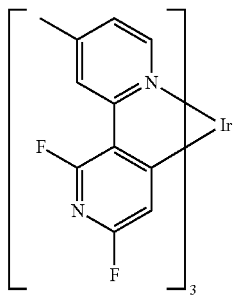
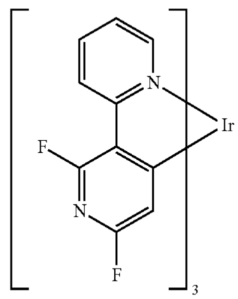
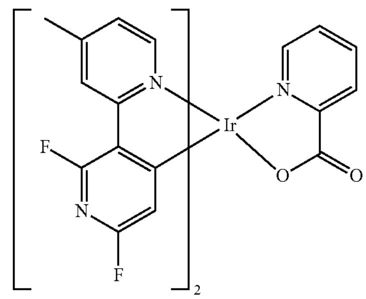
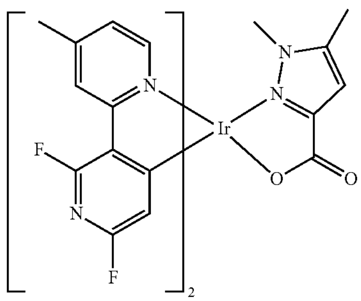
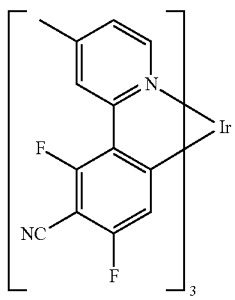
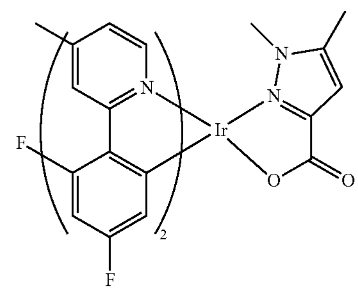
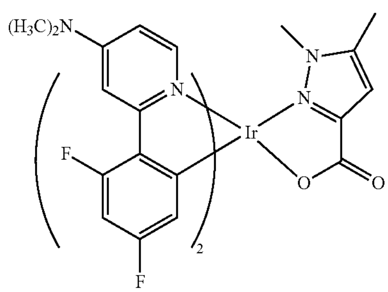
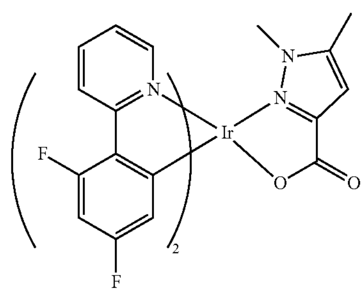
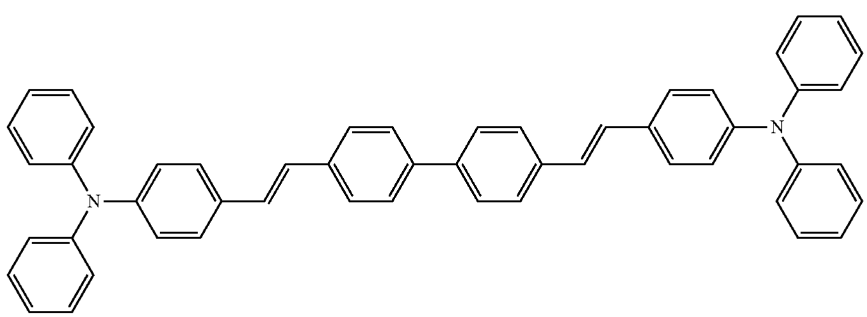
DPAVBi
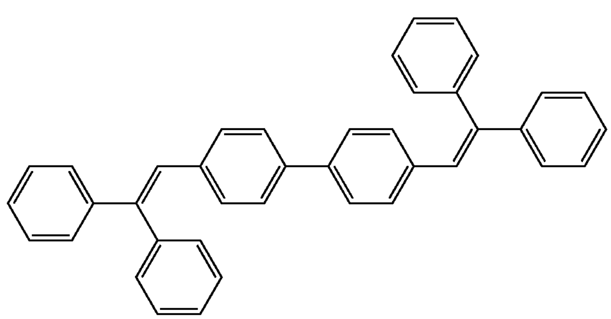
DPVBi
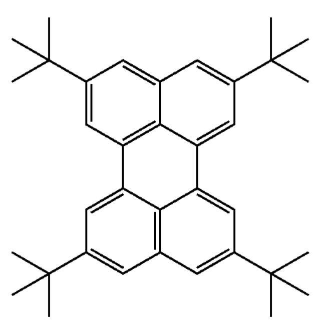
TBPe

[Electron Transport Region 140]

The light-emitting device according to embodiments may include the emission layers 131, 132, and 133, and the electron transport region 140 located between the emission layers 131, 132, and 133 and the counter electrode 150.

In an embodiment, the electron transport region 140 may be provided as a common layer for all of the first emission area, the second emission area, and the third emission area.

The electron transport region 140 may include an electron transport layer, and the electron transport layer may include a mixture of a first material, a second material, and a third material.

The electron transport layer of the light-emitting device according to embodiments may include a mixture of the first material, which is an electron transport compound, the second material, which is a metal-containing material, and the third material, which is a low-refractive-index compound.

The first material of the electron transport layer may transport injected electrons. The second material may facilitate the injection of electrons from a metal electrode. The third material may reduce a refractive index of the electron transport layer without affecting the function of the first and second materials.

Because the electron transport layer includes the third material, a refractive index of the electron transport layer may become lower than a light-emitting device of the related art, thereby decreasing light loss due to surface plasmon polariton (SPP) and increasing the total amount of light emitted.

The electron transport layer may have a form in which the first material, the second material, and the third material are mixed at a same rate relative to the whole thickness of the electron transport layer. Because the flow of injection of electrons may be inhibited when each of the first material, the second material, and the third material are present in the electron transport layer as a single layer, the specification limits the inclusion of three materials to a case in which the three materials are mixed.

Therefore, the light-emitting device to which the electron transport layer including a mixture of the first material, the second material, and the third material is applied, for example, an organic light-emitting device may have low driving voltage and high efficiency.

The first material, the second material, and the third material may be different from each other.

In an embodiment, the electron transport layer may have a single-layered structure consisting of a mixture of the first material, the second material, and the third material.

In an embodiment, the electron transport layer may be formed by co-deposition of the first material, the second material, and the third material.

In an embodiment, the electron transport layer may be formed by thermal evaporation of the first material, the second material, and the third material.

In an embodiment, the electron transport layer may directly contact the emission layer.

In an embodiment, the electron transport layer may directly contact the counter electrode.

In an embodiment, the electron transport region may have a single-layered structure consisting of the electron transport layer including the first material, the second material, and the third material.

In an embodiment, a refractive index of the electron transport layer may be equal to or less than about 1.65 (at a wavelength of about 550 nm).

The first material includes the electron transport compound.

In an embodiment, the electron transport compound may include at least one π electron-deficient nitrogen-containing $C_1$-$C_{60}$ cyclic group.

In an embodiment, the electron transport compound may include at least one of a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group.

In an embodiment, the electron transport compound may be represented by Formula 101:

$$[Ar_{101}]_{xe11}\text{-}[(L_{101})_{xe1}\text{-}R_{101}]_{xe21} \quad \text{[Formula 101]}$$

In Formula 101, $Ar_{101}$ and $L_{101}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{101}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{101})(Q_{102})(Q_{103})$, —$C(=O)(Q_{101})$, —$S(=O)_2(Q_{101})$, or —$P(=O)(Q_{101})(Q_{102})$, $Q_{101}$ to $Q_{103}$ may each independently be the same as described in connection with $Q_1$, xe21 may be 1, 2, 3, 4, or 5, and at least one of $Ar_{101}$, $L_{101}$, and $R_{101}$ may each independently be a π electron-deficient nitrogen-containing $C_1$-$C_{60}$ cyclic group unsubstituted or substituted with at least one $R_{10a}$.

For example, in Formula 101, when xe11 is 2 or greater, at least two $Ar_{101}$(s) may be linked to each other via a single bond.

In other embodiments, $Ar_{101}$ in Formula 101 may be a substituted or unsubstituted anthracene group.

In embodiments, the electron transport compound may be represented by Formula 102:

[Formula 102]

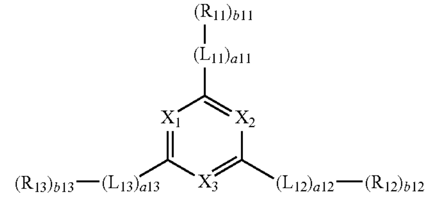

In Formula 102, $X_1$ may be N or $C(R_1)$, $X_2$ may be N or $C(R_2)$, $X_3$ may be N or $C(R_3)$, at least one of $X_1$ to $X_3$ may be N, $L_{11}$ to $L_{13}$ may each independently be a single bond, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a11 to a13 may each independently be an integer from 1 to 5, $R_1$ to $R_3$ and $R_{11}$ to $R_{13}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, $b_{11}$ to $b_{13}$ may each independently be an integer from 1 to 10, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a alkoxy group, a phenyl group, a biphenyl group, or any combination thereof.

In an embodiment, the electron transport compound may be one of Compounds ET1 to ET45, 2,9-dimethyl-4,7-diphenyl-1,10-phenanthroline (BCP), diphenyl-1,10-phenanthroline (Bphen), $Alq_3$, BAlq, TAZ, or NTAZ, but embodiments are not limited thereto:

ET1

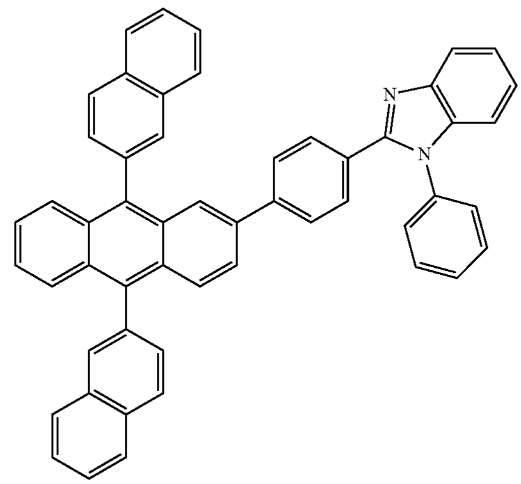

ET2

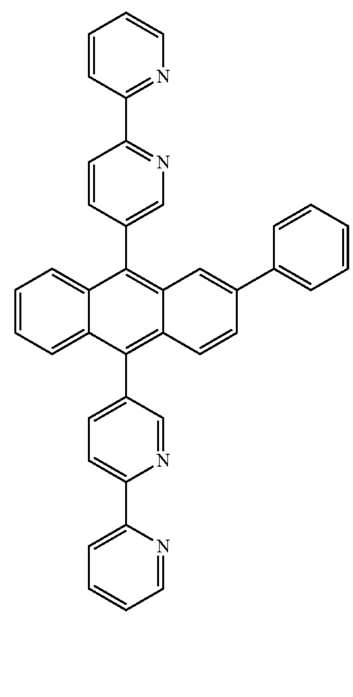

-continued
ET3
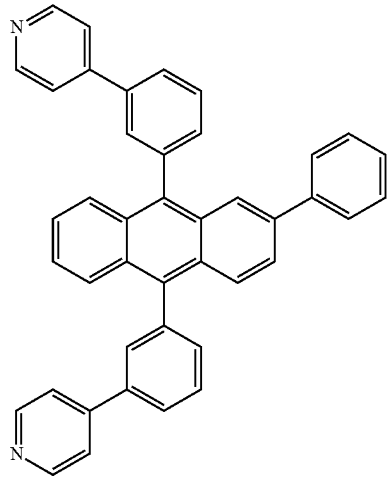
ET4
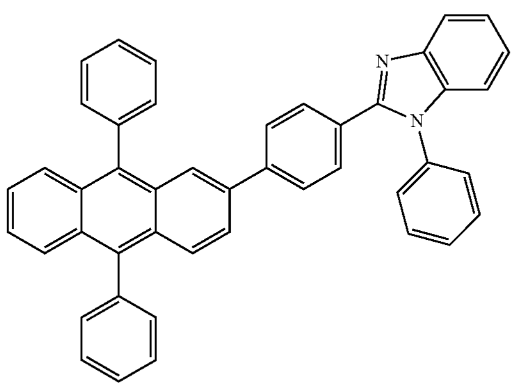
ET5
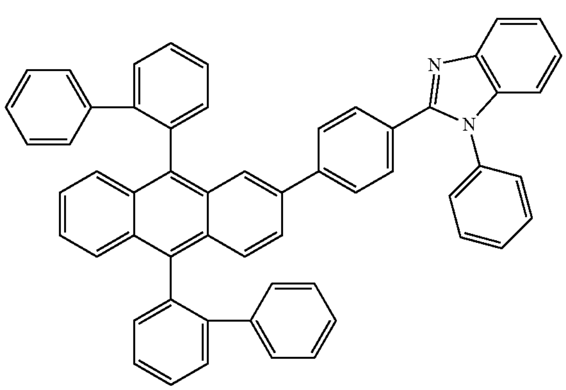
-continued
ET6
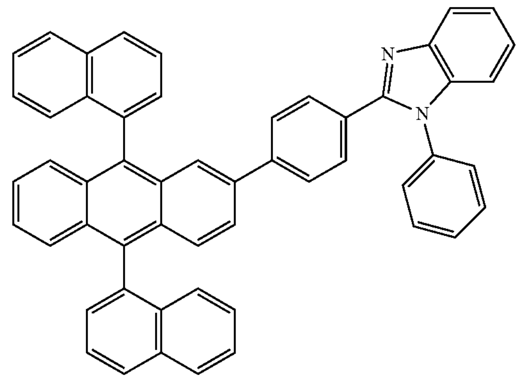
ET7
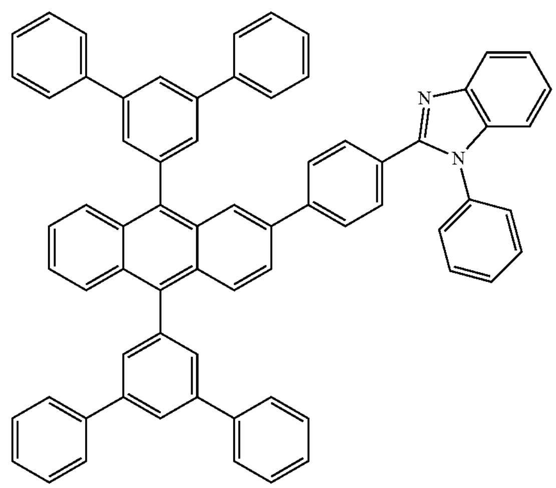
ET8
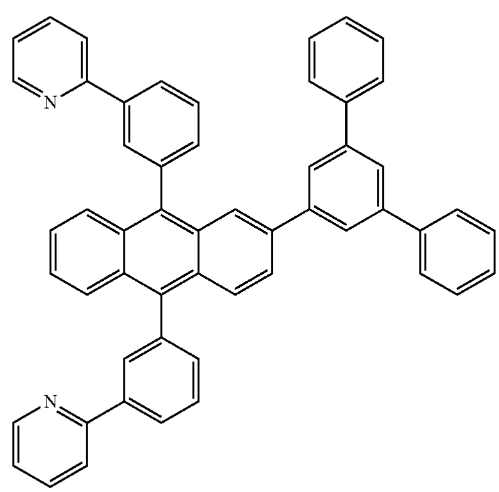

-continued
ET9
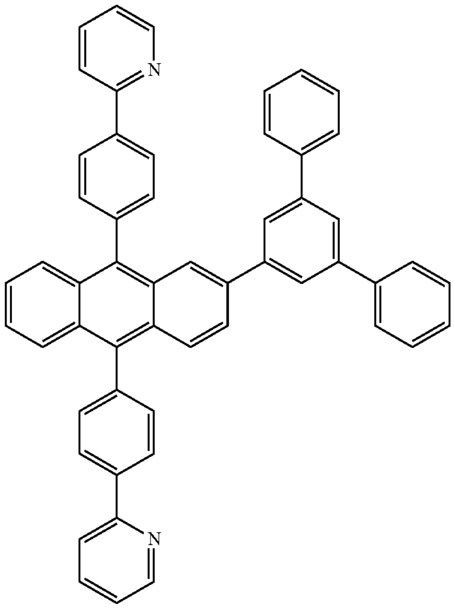
ET10
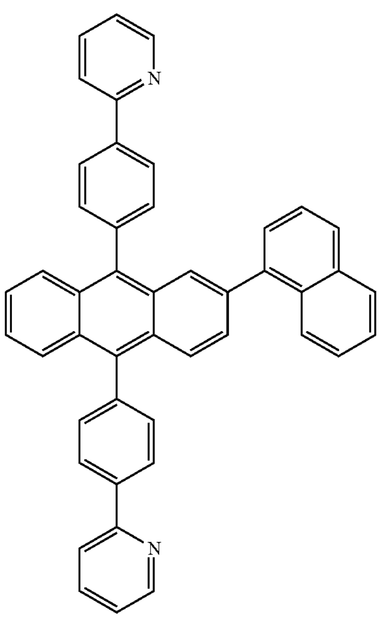
-continued
ET11
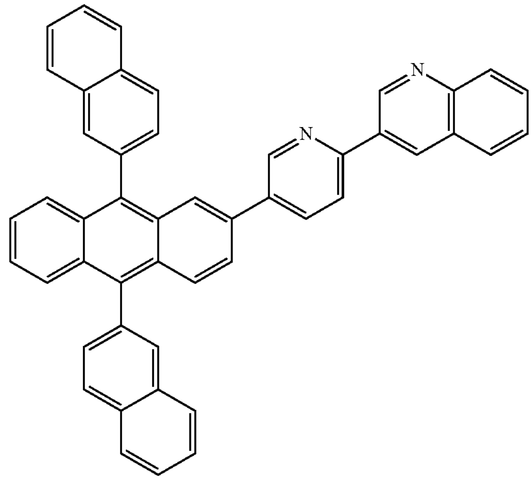
ET12
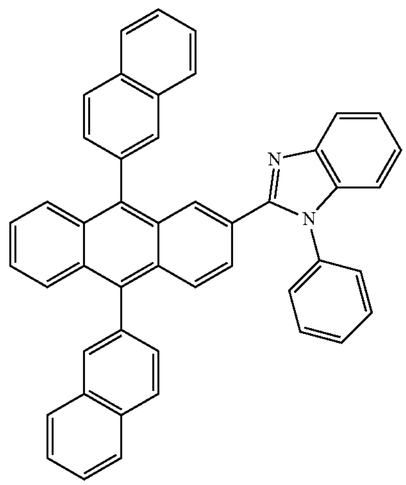
ET13
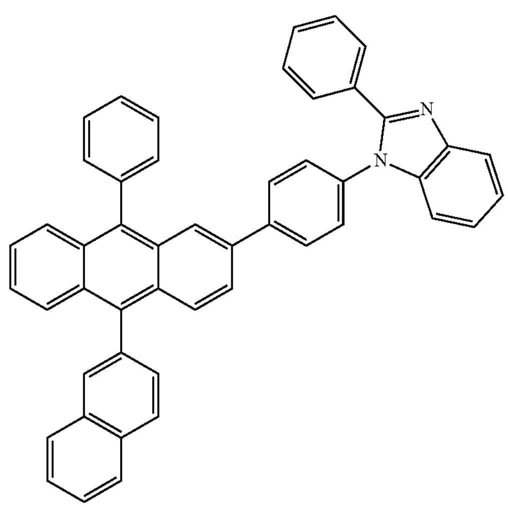

-continued
ET14
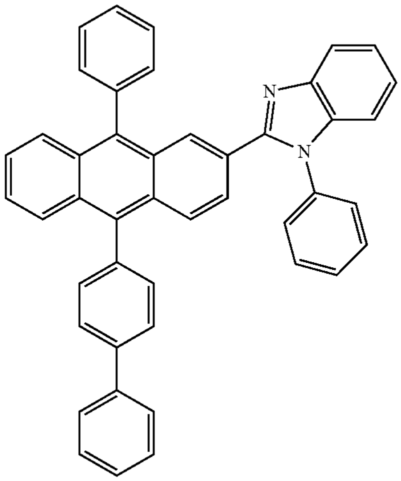
ET15
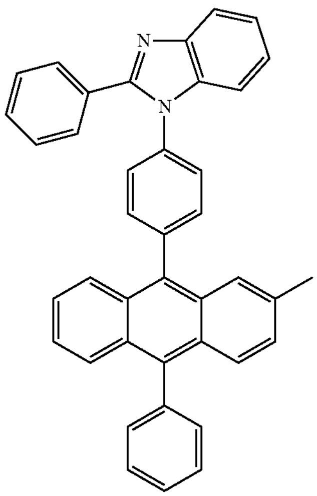
ET16
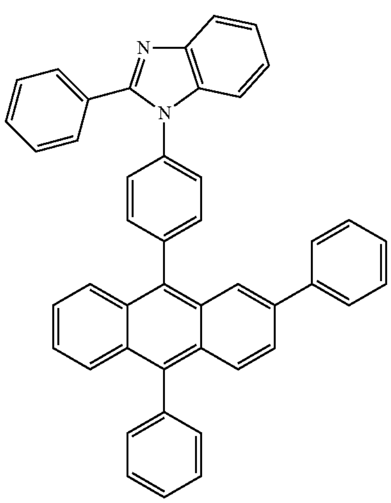
-continued
ET17
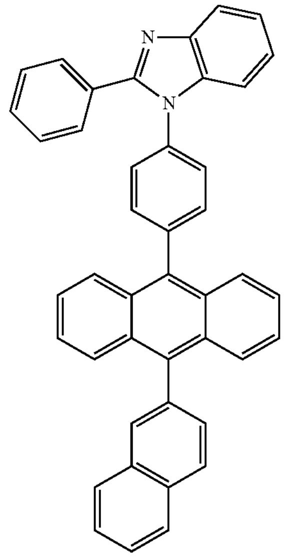
ET18
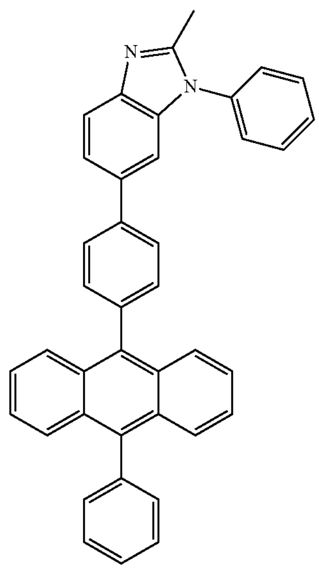
ET19
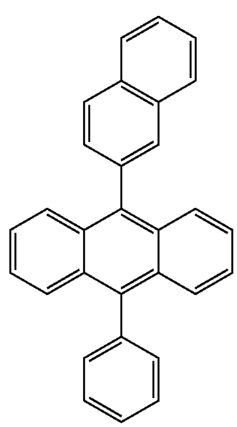

-continued
ET20
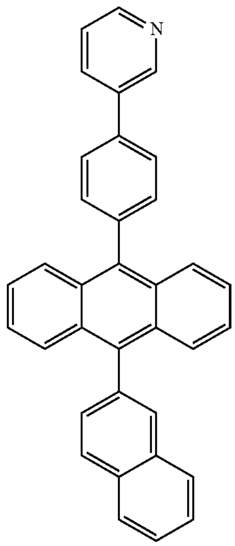
ET21
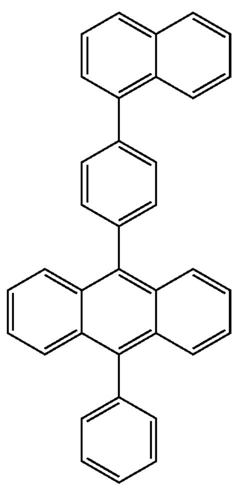
ET22
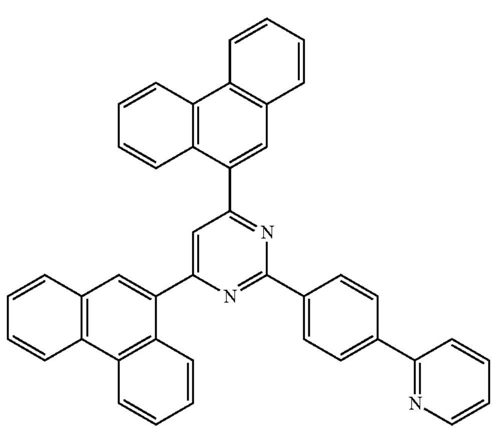
-continued
ET23
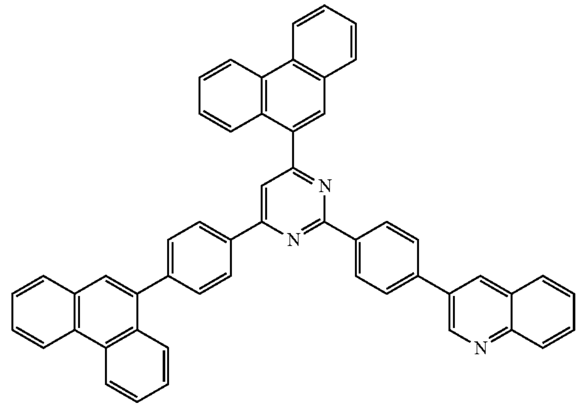
ET24
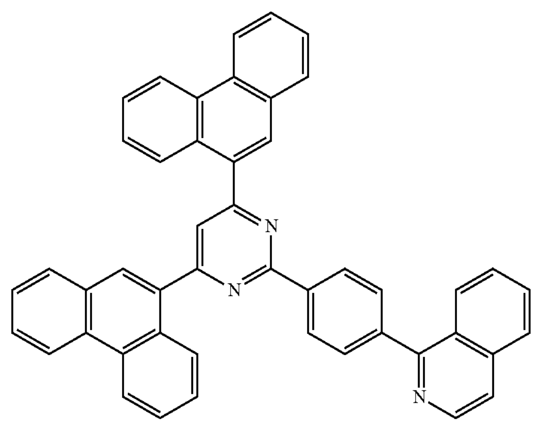
ET25
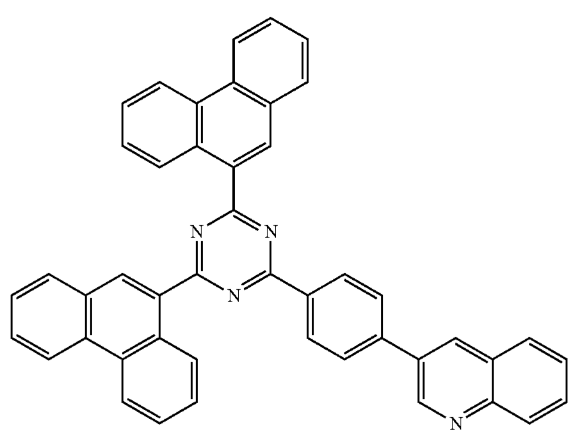

-continued
ET26
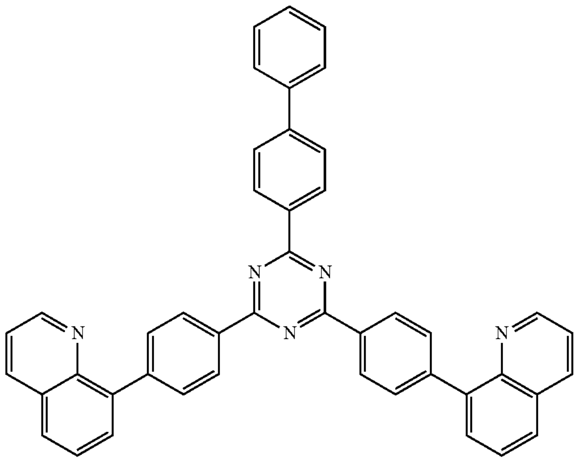
ET27
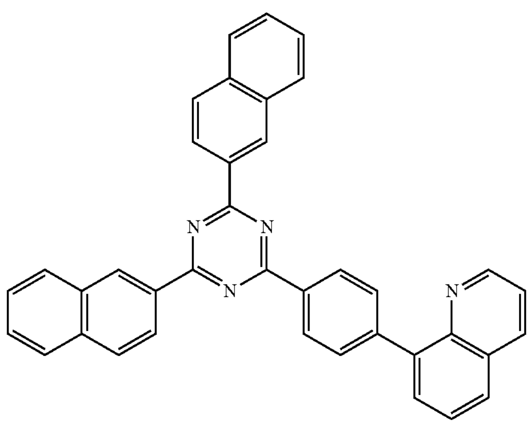
ET28
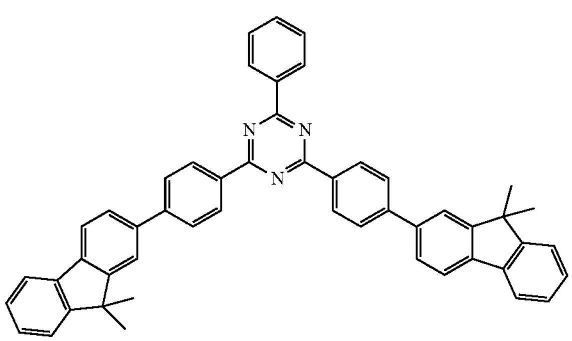
-continued
ET29
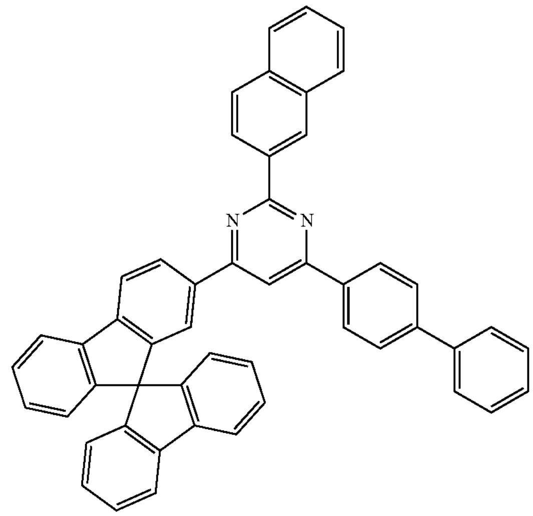
ET30
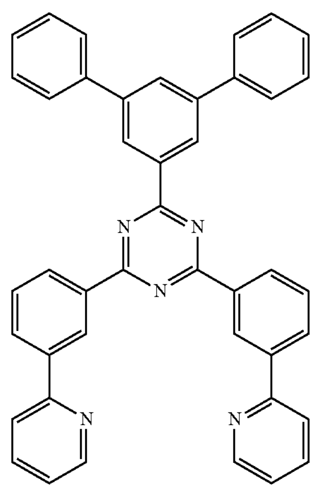
ET31
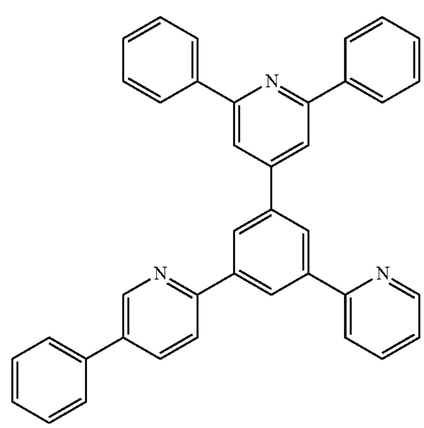

ET32
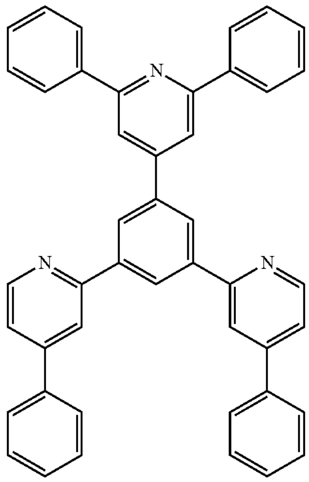
ET33
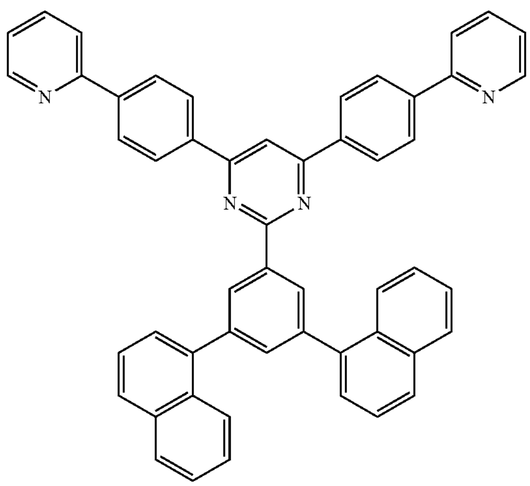
ET34
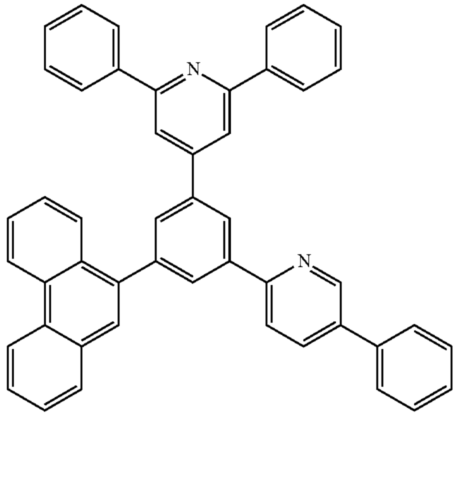
ET35
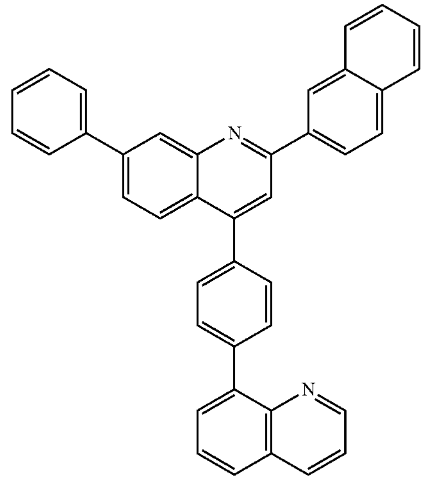
ET36
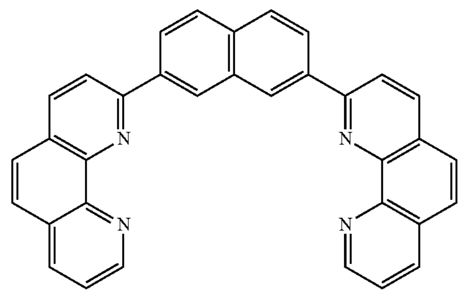
ET37
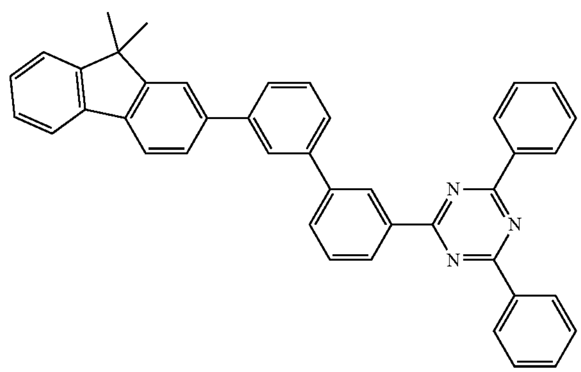
ET38
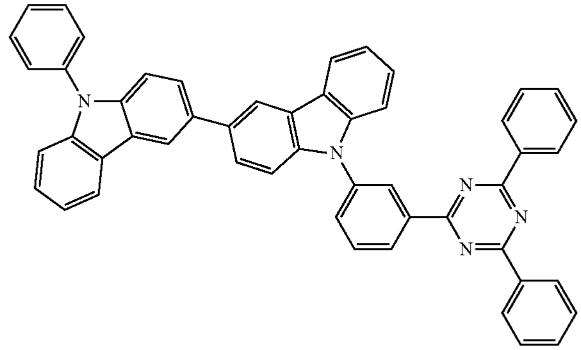

-continued
ET39
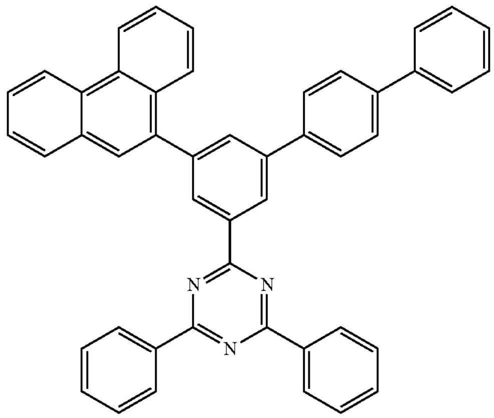
ET40
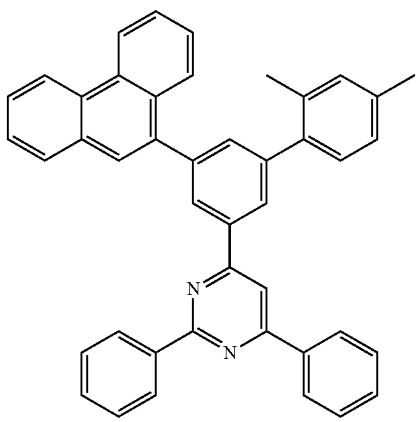
ET41
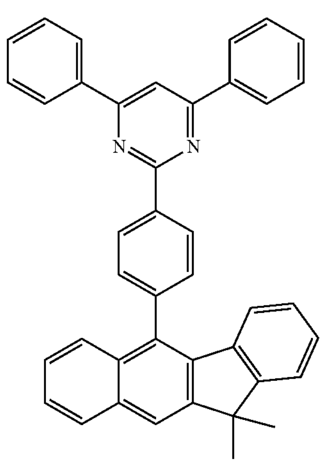
-continued
ET42
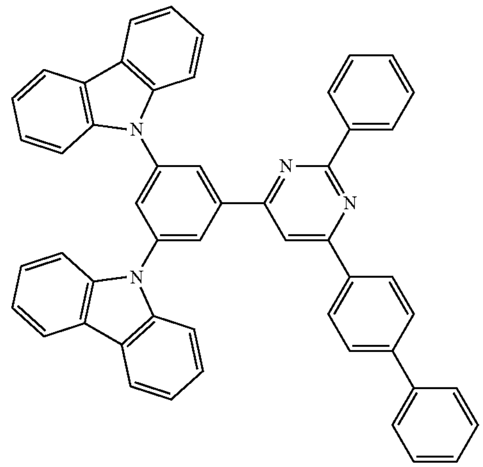
ET43
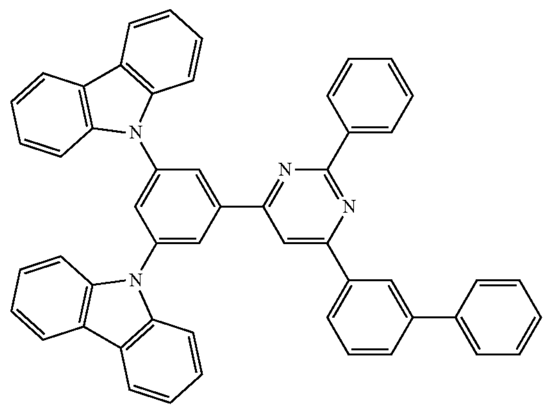
ET44
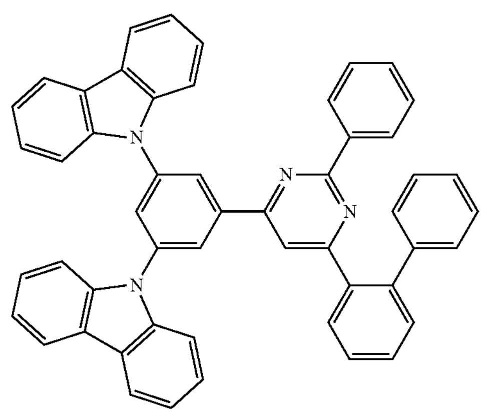
ET45
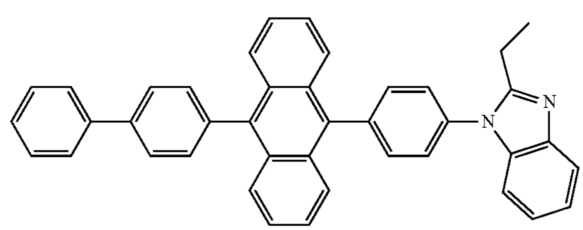

-continued

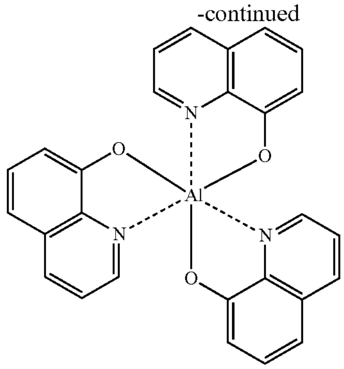

Alq3

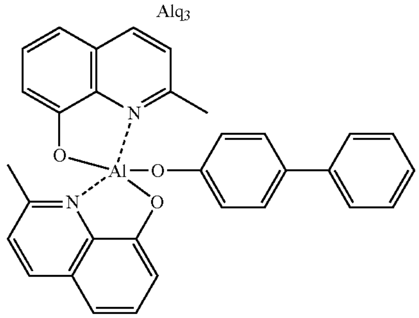

BAlq

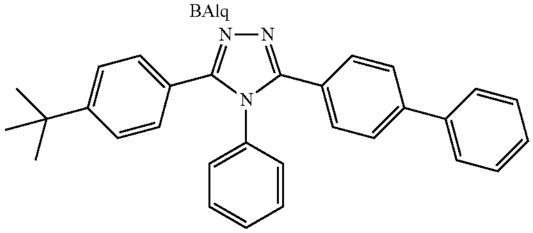

TAZ

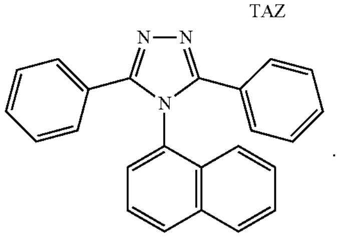

NTAZ

In an embodiment, the electron transport compound may be a fluoro-free compound.

The term "fluoro-free compound" as used herein refers to a compound not including a fluoro group (—F) as a substituent in the compound, and thus, the fluoro-free compound does not include a fluoro group.

In an embodiment, the electron transport compound may be a metal-free compound.

The term "metal-free compound" as used herein refers to a compound that does not include a metal atom.

The second material includes a metal-containing material.

In an embodiment, the metal-containing material may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

In embodiments, the metal-containing material may include an alkali metal complex, an alkaline earth metal complex, or any combination thereof.

In an embodiment, a metal ion of the alkali metal complex may be a Li ion, a Na ion, a K ion, a Rb ion, or a Cs ion, and the metal ion of the alkaline earth metal complex may be a Be ion, a Mg ion, a Ca ion, a Sr ion, or a Ba ion. A ligand coordinated with the metal ion of the alkali metal complex or of the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex.

The Li complex may include, for example, Compound ET-D1 (LiQ) or Compound ET-D2:

ET-D1

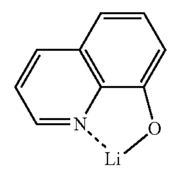

ET-D2

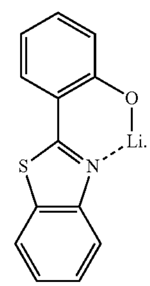

The third material may include a low-refractive-index compound.

In an embodiment, a refractive index of the low-refractive-index compound may be equal to or less than about 1.45 (at a wavelength of about 550 nm).

In an embodiment, the low-refractive-index compound may include at least one fluoro group (—F).

In an embodiment, the low-refractive-index compound may include a fluoro group, and because the low-refractive-index compound includes the fluoro group, electron density of an organic molecule may decrease, thereby lowering the refractive index.

In an embodiment, the low-refractive-index compound may be a perfluoro compound.

In an embodiment, the low-refractive-index compound may be a metal-free compound, and the details of the "metal-free compound" are the same as described above.

In an embodiment, the low-refractive-index compound may be a polymer compound.

In an embodiment, the low-refractive-index compound may be a polymer compound, and because the low-refractive-index compound corresponds to a polymer compound, the density of the organic molecule in a thin film may decrease, thereby lowering the refractive index.

In an embodiment, the low-refractive-index compound may be a polymer compound capable of thermal evaporation.

In an embodiment, the polymer compound may be an oligomer-polymer having a molecular weight equal to or less than about 5,000.

In an embodiment, the low-refractive-index compound may be a compound represented by Formula 1:

[Formula 1]

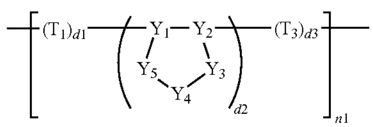

In Formula 1, $T_1$ may be $C(Z_{11})(Z_{12})$, $Si(Z_{11})(Z_{12})$, O, or S, d1 may be an integer from 0 to 3, $Y_1$ may be $C(Z_{21})$, $Si(Z_{21})$, O, or S, $Y_2$ may be $C(Z_{22})$, $Si(Z_{22})$, O, or S, $Y_3$ may be $C(Z_{23})(Z_{24})$, $Si(Z_{23})(Z_{24})$, O, or S, $Y_4$ may be $C(Z_{25})(Z_{26})$, $Si(Z_{25})(Z_{26})$, O, or S, $Y_5$ may be $C(Z_{27})(Z_{28})$, $Si(Z_{27})(Z_{28})$, O, or S, d2 may be an integer from 0 to 3, $T_3$ may be $C(Z_{31})(Z_{32})$, $Si(Z_{31})(Z_{32})$, O, or S, d3 may be an integer from 0 to 3, the sum of d1, d2, and d3 may be 1 or more (for example, an integer from 1 to 9), $Z_{11}$, $Z_{12}$, $Z_{21}$ to $Z_{28}$, $Z_{31}$, and $Z_{32}$ may each independently be: hydrogen, deuterium, or —F; or a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one —F, and n1 may be an integer from 10 to 500.

In an embodiment, in Formula 1, $Y_1$ may be $C(Z_{21})$, and $Y_2$ may be $C(Z_{22})$.

In an embodiment, in Formula 1, $Z_{11}$, $Z_{12}$, $Z_{21}$ to $Z_{28}$, $Z_{31}$, and $Z_{32}$ may each independently be: —F; or a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one —F.

In an embodiment, the low-refractive-index compound may be one of Compounds 1 to 3, but embodiments are not limited thereto:

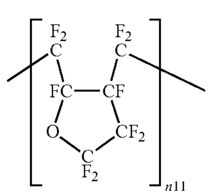

1

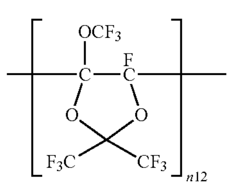

2

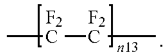

3

In Compounds 1 to 3, n11 to n13 may each independently be an integer from 10 to 500.

In an embodiment, a weight of the third material may be in a range of about 30 parts by weight to about 50 parts by weight, based on 100 parts by weight of the mixture of the first material, the second material, and the third material.

In an embodiment, a weight of the first material may be in a range of about 20 parts by weight to about 30 parts by weight, based on 100 parts by weight of the mixture of the first material, the second material, and the third material.

In an embodiment, a weight of the second material may be in a range of about 20 parts by weight to about 30 parts by weight, based on 100 parts by weight of the mixture of the first material, the second material, and the third material.

In an embodiment, a weight of the first material may be in a range of about 40 parts by weight to about 60 parts by weight, based on 100 parts by weight of the first material and the second material.

In an embodiment, a weight of the second material may be in a range of about 40 parts by weight to about 60 parts by weight, based on 100 parts by weight of the first material and the second material.

In an embodiment, a weight ratio of the first compound to the second compound may be in a range of about 1:2 to about 2:1.

In an embodiment, the first material in the electron transport layer may be evenly dispersed.

In an embodiment, the second material in the electron transport layer may be evenly dispersed.

In an embodiment, the third material in the electron transport layer may be evenly dispersed.

In an embodiment, a mixture of the first material, the second material, and the third material may be evenly dispersed in the electron transport layer.

[Capping Layer]

The light-emitting device 1 may include a first capping layer located outside the first pixel electrode 111, the second pixel electrode 112, and the third pixel electrode 113, and/or a second capping layer located outside the counter electrode 150.

Light generated in the emission layers 131, 132, and 133 in the interlayer of the light-emitting device 1 may be extracted toward the outside through the first pixel electrode 111, the second pixel electrode 112, and the third pixel electrode 113, which are each a semi-transmissive electrode or a transmissive electrode, and through the first capping layer. Light generated in the emission layers 131, 132, and 133 in the interlayer of the light-emitting device 1 may be extracted toward the outside through the counter electrode 150, which is a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 1 may be increased, so that the luminescence efficiency of the light-emitting device 1 may be improved.

The first capping layer and the second capping layer may each include a material having a refractive index equal to or greater than about 1.6 (at a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

In an embodiment, at least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may each be optionally substituted with a substituent including O, N, S, Se, Si, F, Cl, Br, I, or any combination thereof.

In an embodiment, at least one of the first capping layer and the second capping layer may each independently include an amine group-containing compound.

For example, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, TPD, β-NPB, or any combination thereof:

CP1

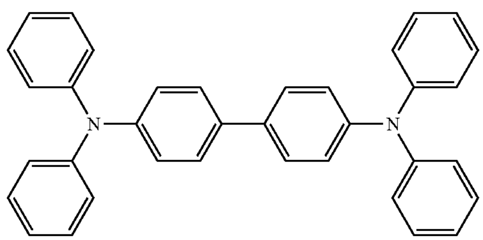

CP2

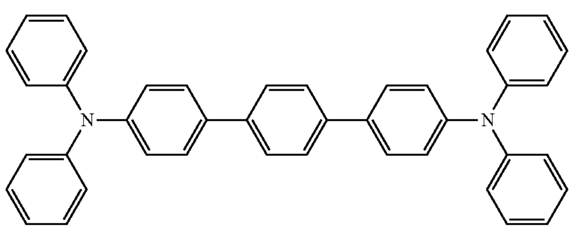

CP3

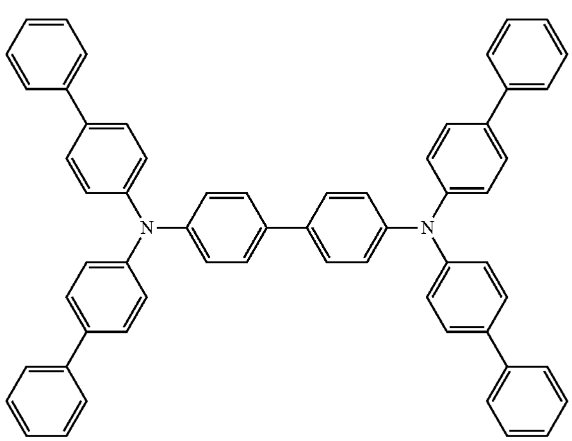

-continued

CP4

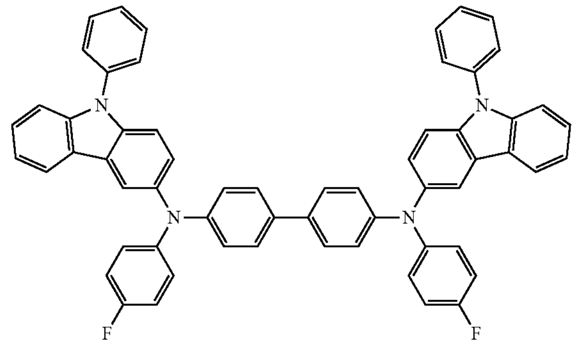

CP5

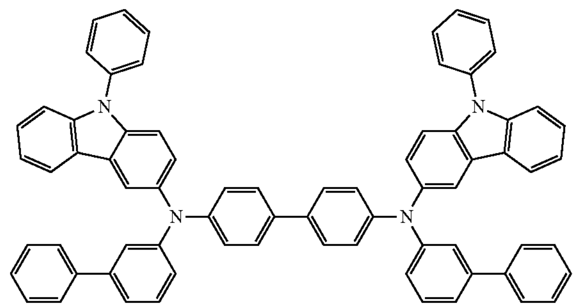

CP6

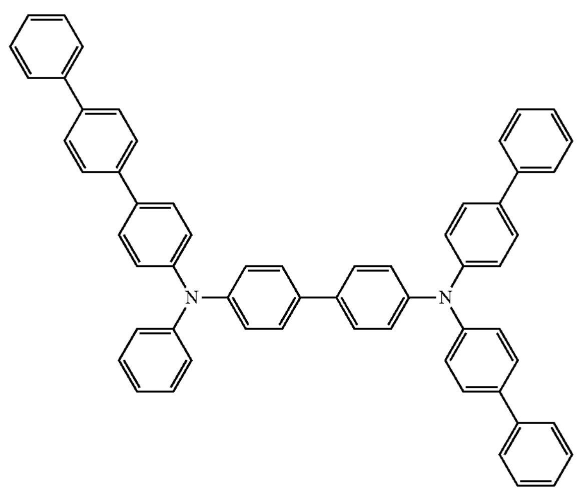

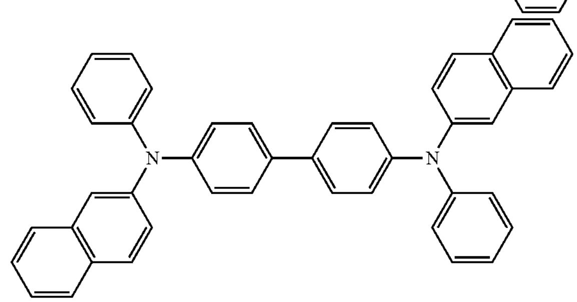

β-NPB

[Electronic Apparatus]

The light-emitting device may be included in various electronic apparatuses.

In embodiments, an electronic apparatus may include: a thin-film transistor including a source electrode, a drain electrode, and an active layer; and the light-emitting device, wherein the first pixel electrode 111, the second pixel electrode 112, and the third pixel electrode 113 of the light-emitting device 1 may be electrically connected to the source electrode or the drain electrode.

The electronic apparatus (for example, a light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. For example, light emitted from the light-emitting device may be blue light or white light. The light-emitting device may be the same as described herein. In embodiments, the color conversion layer may include a quantum dot. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located among the subpixels to define each subpixel.

The color filter may further include color filter areas and light-shielding patterns located between the color filter areas, and the color conversion layer may further include color conversion areas and light-shielding patterns located between the color conversion areas.

The color filter areas (or the color conversion areas) may include a first area emitting first-color light, a second area emitting second-color light, and/or a third area emitting third-color light, wherein the first-color light, the second-color light, and/or the third-color light may have different maximum emission wavelengths from one another. For example, the first-color light may be red light, the second-color light may be green light, and the third-color light may be blue light. In an embodiment, the color filter areas (or the color conversion areas) may include quantum dots. For example, the first area may include a red quantum dot, the second area may include a green quantum dot, and the third area may not include a quantum dot. The quantum dot may be, for example, a quantum dot as described herein. The first area, the second area, and/or the third area may each further include a scatterer.

For example, the light-emitting device may emit first light, the first area may absorb the first light to emit first-first-color light, the second area may absorb the first light to emit second-first-color light, and the third area may absorb the first light to emit third-first-color light. The first-first-color light, the second-first-color light, and the third-first-color light may have different maximum emission wavelengths from one another. For example, the first light may be blue light, the first-first-color light may be red light, the second-first-color light may be green light, and the third-first-color light may be blue light.

The electronic apparatus may further include a thin-film transistor, in addition to the light-emitting device as described above. The thin-film transistor may include a source electrode, a drain electrode, and an active layer, and any one of the source electrode and the drain electrode may be electrically connected to any one of the first pixel electrode 111, the second pixel electrode 112, the third pixel electrode 113, and the counter electrode 150 of the light-emitting device.

The thin-film transistor may further include a gate electrode, a gate insulating film, or the like.

The active layer may include crystalline silicon, amorphous silicon, an organic semiconductor, an oxide semiconductor, or the like.

The electronic apparatus may further include a sealing portion for sealing the light-emitting device. The sealing portion may be located between the color conversion layer and/or color filter and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin film encapsulation layer, the electronic apparatus may be flexible.

Various functional layers may be further included on the sealing portion, in addition to the color filter and/or the color conversion layer, according to the use of the electronic apparatus. Examples of the functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
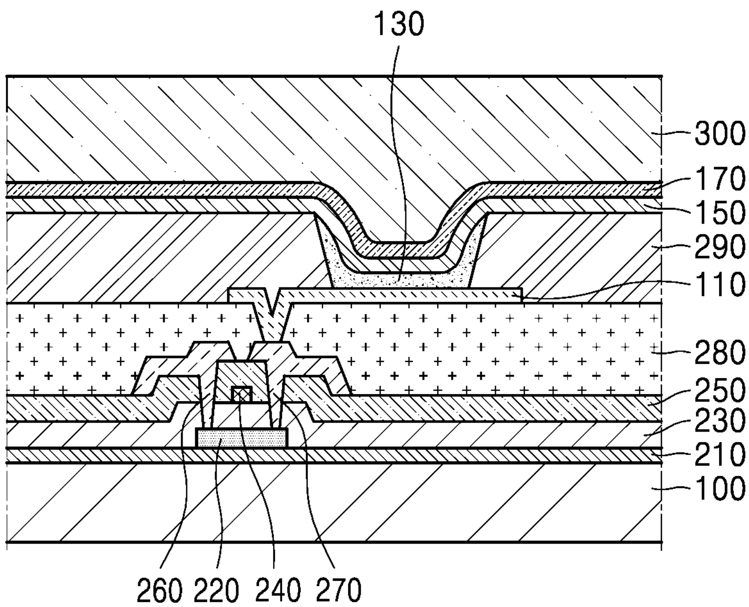
FIG. 2 is a schematic cross-sectional view of an electronic apparatus according to an embodiment.
Figure 3:
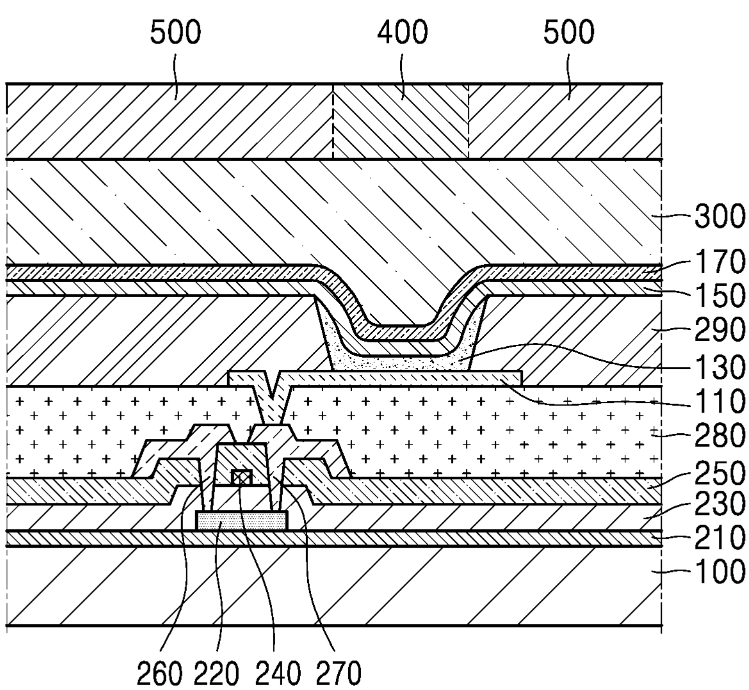
FIG. 3 is a schematic cross-sectional view of an electronic apparatus according to another embodiment.

[Description of FIGS. 2 and 3]

FIG. 2 is a schematic cross-sectional view showing an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent penetration of impurities through the substrate 100 and may provide a flat surface on the substrate 100.

The TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 may be located between the gate electrode 240 and the source electrode 260 and between the gate electrode 240 and the drain electrode 270, to insulate the gate electrode 240, the source electrode 260, and the drain electrode 270 from one another.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may respectively contact the exposed portions of the source region and the drain region of the active layer 220.

The TFT may be electrically connected to the light-emitting device to drive the light-emitting device, and is covered and protected by a passivation layer 280. The passivation layer 280 may include an inorganic insulating film, an organic insulating film, or any combination thereof. The light-emitting device may be provided on the passivation layer 280. The light-emitting device may include a pixel electrode 110, an interlayer 130, and a counter electrode 150.

The pixel electrode 110 corresponds to the first pixel electrode 111, the second pixel electrode 112, and the third pixel electrode 113 of FIG. 1, and for details of the pixel electrode 110, descriptions of the pixel electrodes 111, 112, and 113 of FIG. 1 may be referred to.

The pixel electrode 110 may be located on the passivation layer 280. The passivation layer 280 may expose a region of the drain electrode 270 without completely covering the drain electrode 270, and the pixel electrode 110 may be electrically connected to the exposed portion of the drain electrode 270.

A pixel defining layer 290 including an insulating material may be arranged on the pixel electrode 110. The pixel defining layer 290 may expose a region of the pixel electrode 110, and an interlayer 130 may be formed in the exposed region of the pixel electrode 110. The pixel defining layer 290 may be a polyimide or polyacrylic organic film. Although not shown in FIG. 2, at least some layers of the interlayer 130 may extend beyond the upper portion of the pixel defining layer 290 to be provided in the form of a common layer.

The counter electrode 150 may be located on the interlayer 130, and a capping layer 170 may be additionally formed on the counter electrode 150. The capping layer 170 may be formed to cover the counter electrode 150.

The encapsulation portion 300 may be located on the capping layer 170. The encapsulation portion 300 may be located on the light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic films and the organic films.

FIG. 3 is a schematic cross-sectional view showing an electronic apparatus according to another embodiment.

The electronic apparatus of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

Figure 4:
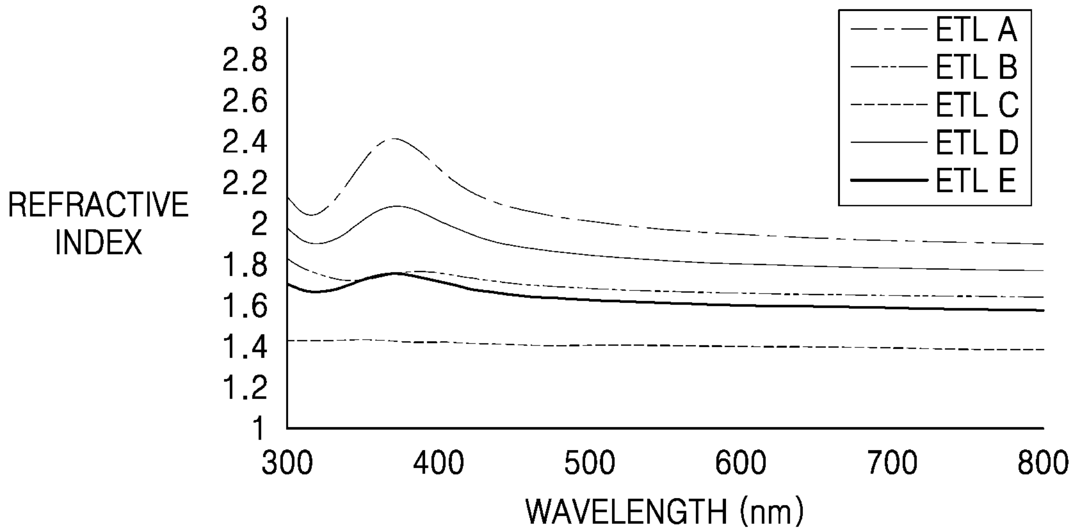
FIG. 4 is a graph showing refractive indices measured according to wavelengths of ETL A to ETL E of Evaluation Example 1.

[Description of FIG. 4]

FIG. 4 is a graph showing refractive indices measured according to wavelengths of ETL A to ETL E of Evaluation Example 1.

Figure 5A:
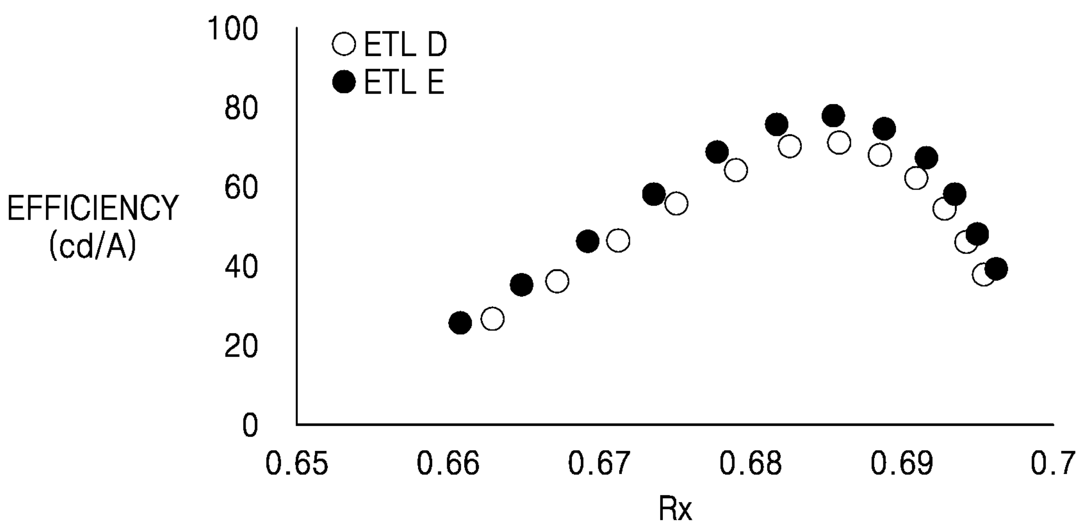
FIGS. 5A to 5C are graphs showing simulation values of luminescence efficiency of light-emitting devices including ETL D and ETL E in a red wavelength region, a green wavelength region, and a blue wavelength region, respectively, according to Evaluation Example 2.
Figure 5B:
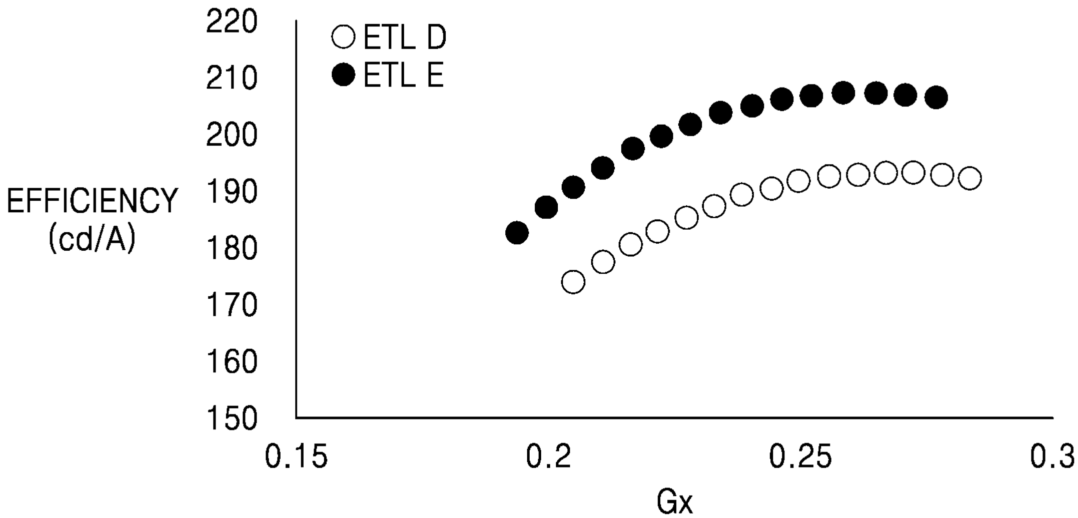
Figure 5C:
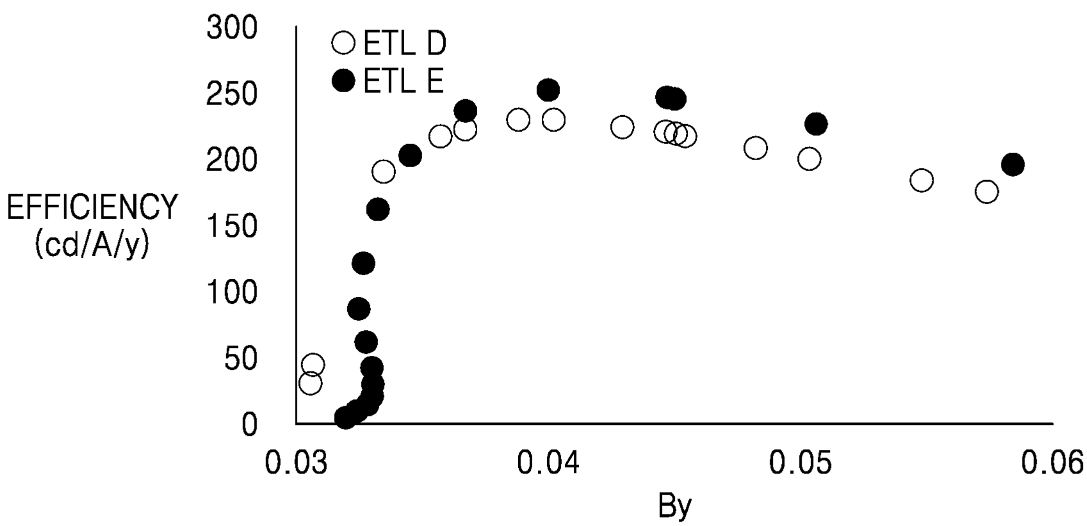

[Description of FIGS. 5A to 5C]

FIGS. 5A to 5C are graphs showing simulation values of luminescence efficiency of the light-emitting devices of Evaluation Example 2 including ETL D and ETL E in a red wavelength region, a green wavelength region, and a blue wavelength region, respectively. From FIGS. 5A to 5C, it can be seen that ETL E has higher maximum luminescence efficiency than that of ETL D in all wavelength regions.

[Manufacturing Method]

The layers included in the hole transport region, the emission layer, and the layers included in the electron transport region may be formed in a specific region by using various methods such as vacuum deposition, spin coating, casting, Langmuir-Blodgett (LB) deposition, ink-jet printing, laser-printing, laser-induced thermal imaging, and the like.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon as the only ring-forming atoms and having three to sixty carbon atoms, and the term "$C_1$-$C_{60}$ heterocyclic group" as used herein may be a cyclic group that has one to sixty carbon atoms and further has, in addition to carbon, at least one heteroatom as ring-forming atoms. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group may have 3 to 61 ring-forming atoms.

The term "cyclic group" as used herein may include the $C_3$-$C_{60}$ carbocyclic group or the $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

In embodiments, the $C_3$-$C_{60}$ carbocyclic group may be a T1 group, or a cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a cyclic group in which two or more T2 groups are condensed with each other, or a cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a cyclic group in which two or more T1 groups are condensed with each other, a T3 group, a cyclic group in which two or more T3 groups are condensed with each other, or a cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a cyclic group in which two or more T4 groups are condensed with each other, a cyclic group in which at least one T4 group and at least one T1 group are condensed with each other, a cyclic group in which at least one T4 group and at least one T3 group are condensed with each other, or a cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of the $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of the $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —O($A_{101}$) (wherein $A_{101}$ may be a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom as ring-forming atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as the monovalent non-aromatic condensed polycyclic group.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as the monovalent non-aromatic condensed heteropolycyclic group.

The term "$C_6$-$C_{60}$ aryloxy group" as used herein may be represented by —O($A_{102}$) (wherein $A_{102}$ may be a $C_6$-$C_{60}$ aryl group), and the term "$C_6$-$C_{60}$ arylthio group" as used herein may be represented by —S($A_{103}$) (wherein $A_{103}$ may be a $C_6$-$C_{60}$ aryl group).

The term "$C_7$-$C_{60}$ aryl alkyl group" as used herein may be represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein may be represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

The term "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein may be any atom other than a carbon atom or a hydrogen atom. Examples of the heteroatom may include O, S, N, P, Si, B, Ge, Se, or any combination thereof.

Examples of the term "third-row transition metal" as used herein may include hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the terms "ter-Bu" or "But" as used herein each refers to a tert-butyl group, and the term "OMe" as used herein refers to a methoxy group.

The term "biphenyl group" as used herein may be "a phenyl group substituted with a phenyl group." For example, the "biphenyl group" may be a substituted phenyl group having a $C_6$-$C_{60}$ aryl group as a substituent.

The term "terphenyl group" as used herein may be "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

Hereinafter, compounds according to embodiments and light-emitting devices according to embodiments will be described in detail with reference to the Synthesis Examples and Examples. The wording "B was used instead of A" used in describing Synthesis Examples means that an identical molar equivalent of B was used in place of A.

EXAMPLES

Preparation Example: Preparation of Electron Transport Layer (Materials Below are Available from Sigma-Aldrich)

ETL1

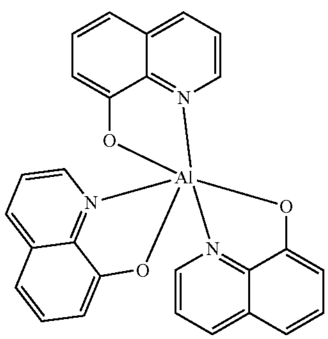

ETL2

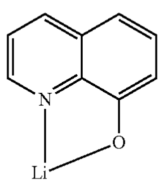

ETL3

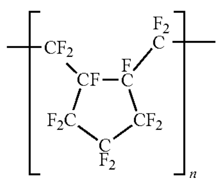

Compounds ETL1 to 3 were purchased from Sigma-Aldrich.

Preparation Example 1: Preparation of ETL A

Compound ETL 1 was deposited to form ETL A having a thickness of 310 Å.

Preparation Examples 2 to 5

ETL B to ETL E were formed in the same manner as in Preparation Example 1 except that the compound of Table 1 was deposited to a given weight ratio instead of Compound ETL 1.

Evaluation Example 1: Measurement of Refractive Index

Regarding ETL A to E prepared according to Preparation Examples 1 to 5, the refractive indices according to the wavelengths were measured by using the Ellipsometer, and the result thereof is shown in Table 4, and the refractive indices in the wavelengths of 440 nm, 550 nm, and 640 nm are each shown in Table 1.

TABLE 1

| Electron transport layer | Configuration | Wavelength 440 nm | 550 nm | 640 nm |
|---|---|---|---|---|
| ETL A | ETL 1 | 2.06 | 1.97 | 1.93 |
| ETL B | ETL 2 | 1.70 | 1.67 | 1.65 |
| ETL C | ETL 3 | 1.41 | 1.40 | 1.40 |
| ETL D | ETL 1 + ETL 2 (5:5) | 1.88 | 1.82 | 1.79 |
| ETL E | ETL 1 + ETL 2 + ETL3 (1:1:2) | 1.64 | 1.61 | 1.59 |

Evaluation Example 2: Simulation of Optical Efficiency of OLED

Based on the refractive indices at 550 nm of ETL D and E of Table 1 (1.82 and 1.61, respectively), the refractive indices according to the optical wavelengths were measured using the Ellipsometer, the results thereof are shown in FIGS. 5A to 5C, the maximum luminescence efficiency and color coordinates in each wavelength range are shown in Table 2, and the luminescence efficiency was calculated relative to the maximum luminescence efficiency value of ETL D as 100%.

TABLE 2

| Electron layer transport layer | Red color area $R_x$ | Luminescence efficiency | Green color area $G_x$ | Luminescence efficiency | Blue color area $B_y$ | Luminescence efficiency |
|---|---|---|---|---|---|---|
| ETL D (n = 1.82) | 0.686 | 100% | 0.272 | 100% | 0.038 | 100% |
| ETL E (n = 1.61) | 0.685 | 107% | 0.255 | 108% | 0.040 | 109% |

From Table 2, it can be seen that ETL E including the third material has higher luminescence efficiency than ETL D including only the first and second materials by 7% in the red area, 8% in the green area, and 9% in the blue area.

Evaluation Example 3: Simulation of Optical Efficiency of Blue OLED

Based on the refractive indices of ETL D and ETL E at a wavelength of about 550 nm (respectively 1.82 and 1.61) according to Evaluation Example 1, the degree of light loss in the blue device was simulated by using a Setfos simulator, and the result thereof is shown in Table 3.

TABLE 3

| Electron transport layer | Percentage of light out-coupled to air | Substrate-guide | Wave-guide | SPP |
|---|---|---|---|---|
| ETL D (n = 1.82) | 30% | 0% | 52% | 8% |
| ETL E (n = 1.61) | 32% | 0% | 53% | 4% |

From Table 3, it can be seen that the light loss due to surface plasmon polariton (SPP) of the light-emitting device to which ETL E including the third material is applied is 4% lower than that of the light-emitting device to which ETL D including only the first and second materials are applied, thereby increasing the total amount of light being out-coupled to the air to 32%. Therefore, the light-emitting device to which ETL E is applied may have higher luminescence efficiency than that of the light-emitting device to which ETL D is applied.

Example 1

As an anode electrode, Ag/ITO was patterned on a glass substrate at a thickness of 150 nm/7 nm to form a pixel electrode.

2-TNATA was deposited on the pixel electrode to form a hole transport layer having a thickness of 1,200 Å.

TCTA was deposited on the hole transport layer to form an emission auxiliary layer having a thickness of 50 Å, and ADN and DPAVBi were deposited on the emission auxiliary layer to a weight ratio of 98:2 to form an emission layer having a thickness of 200 Å.

ETL 1, which is the first material, ETL 2, which is the second material, and ETL 3, which is the third material, were co-deposited to a weight ratio of 1:1:2 on the emission layer to form an electron transport layer having a thickness of 310 Å, and AgMg was deposited on the electron transport layer to form a counter electrode (a cathode) having a thickness of 130 Å, and TPD was deposited on the counter electrode to form a capping layer having a thickness of 640 Å, thereby manufacturing a light-emitting device.

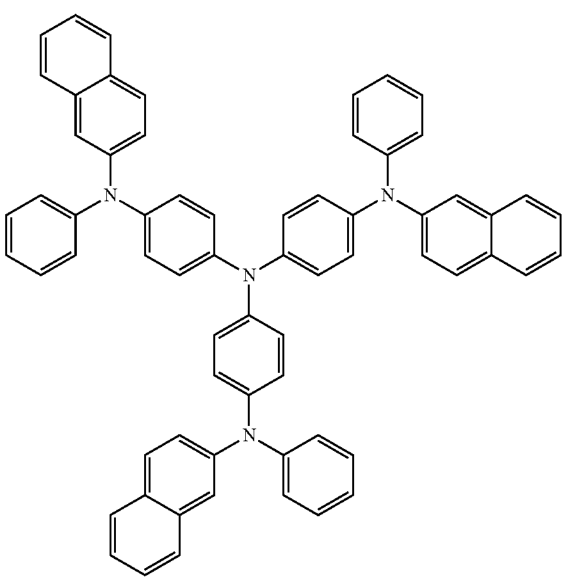

2-TNATA

-continued

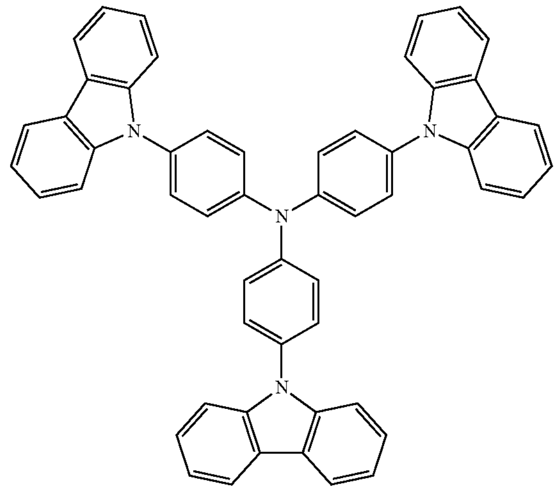

TCTA

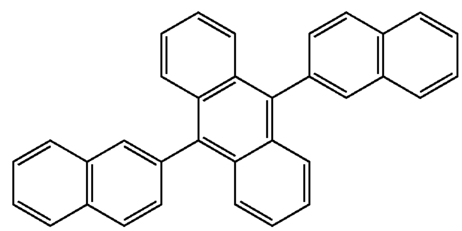

ADN

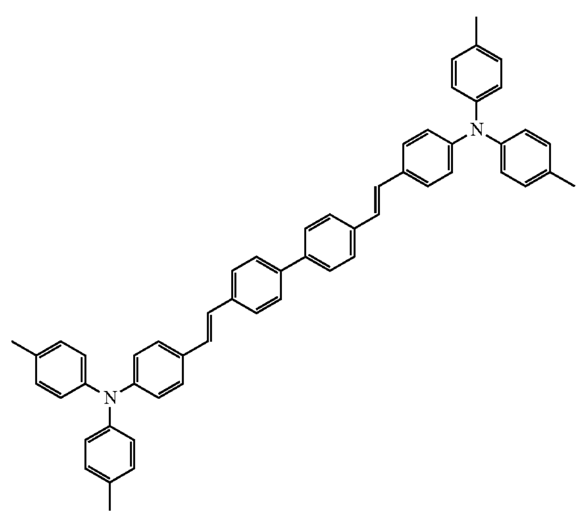

DPAVBi

-continued

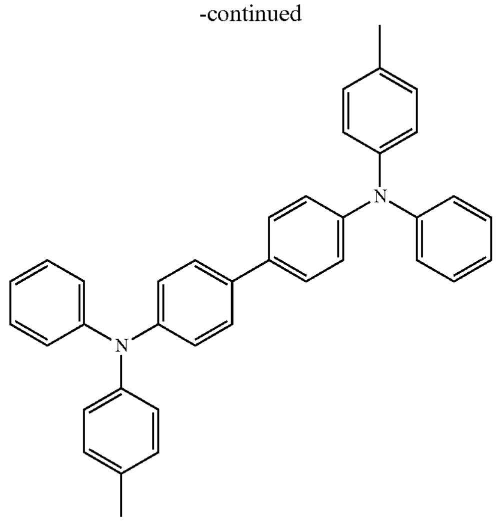

TPD

Comparative Example 1

A light-emitting device was manufactured in the same manner as in Example 1 except that ETL 1 and ETL 2 were co-deposited to a weight ratio of 1:1 to form an electron transport layer having a thickness of 310 Å.

Comparative Example 2

A light-emitting device was manufactured in the same manner as in Example 1 except that ETL 2 and ETL 3 were co-deposited to a weight ratio of 1:1 to form an electron transport layer having a thickness of 310 Å.

Comparative Example 3

A light-emitting device was manufactured in the same manner as in Example 1 except that ETL 1 was deposited to form an electron transport layer having a thickness of 150 Å and ETL 2 and ETL 3 were co-deposited to a weight ratio of 1:1 to form an electron transport layer having a thickness of 160 Å.

Evaluation Example 4

The driving voltage and luminescence efficiency of each of the light-emitting devices manufactured according to Example 1 and Comparative Examples 1 to 3 were measured at a current density of 10 $mA/cm^2$. The driving voltage of each of the light-emitting devices was measured using a source meter (Keithley Instrument Inc., 2400 series), and the luminescence efficiency thereof was measured using a luminescence efficiency measurement apparatus C9920-2-12 of Hamamatsu Photonics Inc. For the luminescence efficiency evaluation, a luminance meter after wavelength-sensitivity calibration was used to measure the luminance/current density. Characteristic evaluation results of the light-emitting devices are shown in Table 4.

TABLE 4

| Electron transport layer | Driving voltage (V) | Luminescence efficiency (cd/A) | Emission color |
|---|---|---|---|
| Example 1 | 4.47 | 6.81 | Blue |
| Comparative Example 1 | 4.45 | 6.15 | Blue |
| Comparative Example 2 | 12.5 | 0.54 | Blue |
| Comparative Example 3 | 8.25 | 1.58 | Blue |

From Table 4, it can be seen that the light-emitting device of Example 1 has lower or equivalent driving voltage and higher luminescence efficiency, as compared with the light-emitting devices of Comparative Examples 1 to 3.

While the disclosure has been described with reference to example embodiments illustrated in the drawings, these embodiments are provided herein for illustrative purposes only, and one of ordinary skill in the art may understand that the embodiments may include various modifications and equivalent embodiments thereof.

According to embodiments, by introducing an electron transport layer including a mixture of the first material, the second material, and the third material, a light-emitting device having low driving voltage, high efficiency, and a long lifespan may be implemented.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first pixel electrode in a first emission area;

a second pixel electrode in a second emission area;

a third pixel electrode in a third emission area;

a counter electrode facing the first pixel electrode, the second pixel electrode, and the third pixel electrode; and an interlayer between the first to third pixel electrodes and the counter electrode, wherein the interlayer comprises:

an emission layer; and an electron transport region between the emission layer and the counter electrode, the emission layer comprises:

a first emission layer corresponding to the first emission area and emitting first-color light;

a second emission layer corresponding to the second emission area and emitting second-color light; and a third emission layer corresponding to the third emission area and emitting third-color light, the electron transport region comprises an electron transport layer, the electron transport layer comprises a mixture of a first material, a second material, and a third material, the first material comprises an electron transport compound, the second material comprises a metal-containing material, the third material comprises a low-refractive-index compound, and the first material, the second material, and the third material are different from each other.

2. The light-emitting device of claim 1, wherein the first-color light, the second-color light, and the third-color light are each emitted by secondary resonance.

3. The light-emitting device of claim 1, wherein the first pixel electrode, the second pixel electrode, and the third pixel electrode are each an anode, the counter electrode is a cathode, the first pixel electrode, the second pixel electrode, and the third pixel electrode are each a reflective electrode, and the cathode is a transmissive electrode or a semi-transmissive electrode.

4. The light-emitting device of claim 1, wherein the first pixel electrode, the second pixel electrode, and the third pixel electrode are each an anode, the counter electrode is a cathode, the interlayer further comprises a hole transport region between the emission layer and the first to third pixel electrodes, and the hole transport region comprises a hole injection layer, a hole transport layer, an emission auxiliary layer, an electron blocking layer, or a combination thereof.

5. The light-emitting device of claim 1, wherein the electron transport layer has a single-layered structure consisting of a mixture of the first material, the second material, and the third material.

6. The light-emitting device of claim 1, wherein the electron transport layer directly contacts the emission layer.

7. The light-emitting device of claim 1, wherein the electron transport layer directly contacts the counter electrode.

8. The light-emitting device of claim 1, wherein a refractive index of the electron transport layer is equal to or less than about 1.65.

9. The light-emitting device of claim 1, wherein the electron transport compound comprises at least one π electron-deficient nitrogen-containing $C_1$-$C_{60}$ cyclic group.

10. The light-emitting device of claim 1, wherein the electron transport compound is a fluoro-free compound.

11. The light-emitting device of claim 1, wherein the metal-containing material comprises an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof.

12. The light-emitting device of claim 1, wherein a refractive index of the low-refractive-index compound is equal to or less than about 1.45.

13. The light-emitting device of claim 1, wherein the low-refractive-index compound comprises at least one fluoro group (—F).

14. The light-emitting device of claim 1, wherein the low-refractive-index compound is a polymer compound.

15. The light-emitting device of claim 14, wherein the polymer compound is an oligomer-polymer having a molecular weight equal to or less than about 5,000.

16. The light-emitting device of claim 1, wherein the low-refractive-index compound is a compound represented by Formula 1:

[Formula 1]

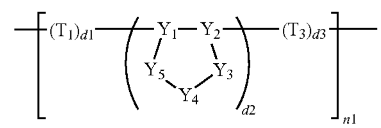

wherein in Formula 1, $T_1$ is $C(Z_{11})(Z_{12})$, $Si(Z_{11})(Z_{12})$, O, or S, d1 is an integer from 0 to 3, $Y_1$ is $C(Z_{21})$, $Si(Z_{21})$, O, or S, $Y_2$ is $C(Z_{22})$, $Si(Z_{22})$, O, or S, $Y_3$ is $C(Z_{23})(Z_{24})$, $Si(Z_{23})(Z_{24})$, O, or S, $Y_4$ is $C(Z_{25})(Z_{26})$, $Si(Z_{25})(Z_{26})$, O, or S, $Y_5$ is $C(Z_{27})(Z_{28})$, $Si(Z_{27})(Z_{28})$, O, or S, d2 is an integer from 0 to 3, $T_3$ is $C(Z_{31})(Z_{32})$, $Si(Z_{31})(Z_{32})$, O, or S, d3 is an integer from 0 to 3, the sum of d1, d2, and d3 is 1 or more, $Z_{11}$, $Z_{12}$, $Z_{21}$ to $Z_{28}$, $Z_{31}$, and $Z_{32}$ are each independently: hydrogen, deuterium, or —F; or a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one —F, and n1 is an integer from 10 to 500.

17. The light-emitting device of claim 1, wherein a mixture of the first material, the second material, and the third material is evenly dispersed in the electron transport layer.

18. The light-emitting device of claim 1, wherein a weight of the third material is in a range of about 30 parts by weight to about 50 parts by weight, based on 100 parts by weight of the mixture of the first material, the second material, and the third material.

19. The light-emitting device of claim 1, wherein a weight of the second material is in a range of about 40 parts by weight to about 60 parts by weight, based on 100 parts by weight of the first material and the second material.

20. An electronic apparatus comprising the light-emitting device of claim 1.

* * * * *